United States Patent
Chen et al.

(10) Patent No.: US 10,214,966 B2
(45) Date of Patent: Feb. 26, 2019

(54) ROTARY DRILL BITS WITH BACK-UP CUTTING ELEMENTS TO OPTIMIZE BIT LIFE

(75) Inventors: Shilin Chen, Montgomery, TX (US); Guy Lefort, Canonsburg, PA (US); Robert W. Arfele, Magnolia, TX (US); James R. Ashby, Conroe, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 553 days.

(21) Appl. No.: 14/413,902

(22) PCT Filed: Sep. 5, 2012

(86) PCT No.: PCT/US2012/053761
§ 371 (c)(1),
(2), (4) Date: Jan. 9, 2015

(87) PCT Pub. No.: WO2014/011197
PCT Pub. Date: Jan. 16, 2014

(65) Prior Publication Data
US 2015/0152689 A1 Jun. 4, 2015

Related U.S. Application Data

(60) Provisional application No. 61/671,579, filed on Jul. 13, 2012.

(51) Int. Cl.
*E21B 10/43* (2006.01)
*E21B 10/16* (2006.01)
(Continued)

(52) U.S. Cl.
CPC .............. *E21B 10/43* (2013.01); *E21B 10/00* (2013.01); *E21B 10/16* (2013.01); *E21B 10/55* (2013.01); *G06F 17/5086* (2013.01)

(58) Field of Classification Search
CPC .......... E21B 10/43; E21B 10/16; E21B 10/55; E21B 10/00
See application file for complete search history.

(56) References Cited

U.S. PATENT DOCUMENTS 3,153,458 A 10/1964 Short
4,554,986 A 11/1985 Jones
(Continued)

FOREIGN PATENT DOCUMENTS

CN 2451714 Y 10/2001
CN 10427000 5/2009
(Continued)

OTHER PUBLICATIONS

International Preliminary Report on Patentability of PCT/US2013/073583, dated Jun. 16, 2016, 9 pages.
(Continued)

*Primary Examiner* — D. Andrews
*Assistant Examiner* — Tara E Schimpf
(74) *Attorney, Agent, or Firm* — Baker Botts L.L.P.

(57) ABSTRACT

A multi-layer downhole drilling tool designed for drilling a wellbore including a plurality of formations is disclosed. The drilling tool includes a bit body including a rotational axis extending therethrough. A plurality of blades are disposed on exterior portions of the bit body. A plurality of primary cutting elements and a plurality of back-up cutting elements are disposed on exterior portions of the plurality of blades. The back-up cutting elements are track set with corresponding primary cutting elements, and each back-up cutting element is disposed on a different blade than the corresponding primary cutting element.

25 Claims, 29 Drawing Sheets

(51) Int. Cl.
*E21B 10/55* (2006.01)
*E21B 10/00* (2006.01)
*G06F 17/50* (2006.01)

(56) References Cited

U.S. PATENT DOCUMENTS

| | | | |
|---|---|---|---|
| 4,991,670 | A | 2/1991 | Fuller et al. |
| 5,090,492 | A | 2/1992 | Keith |
| 5,265,685 | A | 11/1993 | Keith et al. |
| 5,549,171 | A | 8/1996 | Mensa-Wilmot et al. |
| 5,551,522 | A | 9/1996 | Keith et al. |
| 5,582,261 | A | 12/1996 | Keith et al. |
| 5,595,252 | A | 1/1997 | O'Hanlon |
| 5,607,024 | A | 3/1997 | Keith et al. |
| 6,089,336 | A * | 7/2000 | Nexton ............... E21B 10/003 175/393 |
| 6,109,368 | A | 8/2000 | Goldman et al. |
| 6,298,930 | B1 | 10/2001 | Sinor et al. |
| 6,408,953 | B1 | 6/2002 | Goldman et al. |
| 6,460,631 | B2 | 10/2002 | Dykstra et al. |
| 6,779,613 | B2 | 8/2004 | Dykstra et al. |
| 6,935,441 | B2 | 8/2005 | Dykstra et al. |
| 7,032,689 | B2 | 4/2006 | Goldman et al. |
| 7,096,978 | B2 | 8/2006 | Dykstra et al. |
| 7,261,167 | B2 | 8/2007 | Goldman et al. |
| 7,357,196 | B2 | 4/2008 | Goldman et al. |
| 7,360,608 | B2 | 4/2008 | Brackin et al. |
| 7,464,774 | B2 | 12/2008 | Savignat et al. |
| 7,624,818 | B2 | 12/2009 | McClain et al. |
| 7,703,557 | B2 | 4/2010 | Durairajan et al. |
| 7,762,355 | B2 | 7/2010 | McClain et al. |
| 7,861,809 | B2 | 1/2011 | Gavia et al. |
| 7,866,413 | B2 | 1/2011 | Stauffer et al. |
| 8,863,860 | B2 | 10/2014 | Chen et al. |
| 2001/0030063 | A1* | 10/2001 | Dykstra ............... E21B 10/42 175/57 |
| 2005/0010382 | A1 | 1/2005 | Oliver et al. |
| 2005/0080595 | A1* | 4/2005 | Huang ............... E21B 44/00 702/183 |
| 2006/0278436 | A1 | 12/2006 | Dykstra et al. |
| 2007/0078632 | A1 | 4/2007 | Shen |
| 2007/0151770 | A1 | 7/2007 | Ganz |
| 2007/0186639 | A1 | 8/2007 | Spross et al. |
| 2007/0267227 | A1 | 11/2007 | Mensa-Wilmot |
| 2008/0041629 | A1 | 2/2008 | Aronstam et al. |
| 2008/0135297 | A1 | 6/2008 | Gavia |
| 2009/0090556 | A1 | 4/2009 | Chen |
| 2009/0166091 | A1 | 7/2009 | Matthews et al. |
| 2009/0266619 | A1* | 10/2009 | Durairajan ......... E21B 17/1092 175/431 |
| 2010/0000080 | A1 | 1/2010 | Eldridge et al. |
| 2010/0000800 | A1* | 1/2010 | Chen ............... E21B 10/55 175/430 |
| 2010/0089664 | A1 | 4/2010 | Welch et al. |
| 2010/0193248 | A1 | 8/2010 | Radford et al. |
| 2010/0263937 | A1 | 10/2010 | Overstreet et al. |
| 2011/0030063 | A1 | 10/2011 | Choi |
| 2012/0111630 | A1 | 5/2012 | Chen et al. |
| 2013/0035903 | A1* | 2/2013 | Prevost ............... E21B 10/00 703/1 |
| 2013/0228378 | A1 | 9/2013 | Chen et al. |
| 2013/0233621 | A1 | 9/2013 | Chen et al. |
| 2013/0238245 | A1 | 9/2013 | Chen et al. |
| 2013/0253836 | A1 | 9/2013 | Chen et al. |
| 2015/0122551 | A1 | 5/2015 | Chen |
| 2015/0152689 | A1 | 6/2015 | Chen et al. |

FOREIGN PATENT DOCUMENTS

| | | | |
|---|---|---|---|
| CN | 101460701 | 6/2009 | |
| CN | 101611213 A | 12/2009 | |
| CN | 102216554 A | 10/2011 | |
| GB | 2498480 | 7/2013 | |
| WO | 2012/064948 | 5/2012 | ............. E21B 47/02 |
| WO | 2012/064953 | 5/2012 | |
| WO | 2012/064961 | 5/2012 | |
| WO | 2013/180702 | 12/2013 | |

OTHER PUBLICATIONS

European Extended Search Report of Application No. 12880858.1 dated Jan. 4, 2016, 5 pages.
International Preliminary Report on Patentability, PCT Application No. PCT/US2012/039977, 7 pages, dated Dec. 2, 2014.
International Search Report and Written Opinion, Application No. PCT/US2012/039977, 13 pages, dated Aug. 8, 2012.
Mensa-Wilmot, Graham, "Innovation Cutting Structure, With Staged ROP and Durability Characteristics, Extends PDC Bit Efficiency Into Chert/Pyrite/Conglomerate Applications," Society of Petroleum Engineers 105320, 15th SPE Middle East Oil & Gas Show and Conference, Kingdom of Bahrain, Mar. 11-14, 2007.
International Preliminary Report on Patentability issued in PCT/US2012/053761; 6 pages, dated Jan. 13, 2015.
International Search Report and Written Opinion, Application No. PCT/US2012/053761, 17 pages, dated Feb. 4, 2013.
Canadian Office Action Application No. 2879046, dated Feb. 24, 2016, 4 pages.
Canadian Office Action Application No. 2875021, dated Jan. 13, 2016, 4 pages.
Examination Report, Application No. GB1420604.9; 3 pages, dated Jun. 26, 2016.
Chinese Office Action, Application No. 201280074423.7; with translation; 14 pages, dated Dec. 2, 2015.
International Preliminary Report on Patentability issued in PCT/US2012/05376; 6 pages, dated Jan. 13, 2015.
Chinese Office Action Application No. 201280074423.7, dated Aug. 17, 2016, 13 pages.
Canadian Office Action Application No. 2879046, dated Mar. 27, 2017, 4 pages.
Canadian Office Action Application No. 2929078, dated Apr. 3, 2017, 4 pages.
Chinese Office Action Application No. 201280074423.7, dated Apr. 6, 2017; 7 pages.
Chinese Office Action Application No. 201380080165.8, dated May 3, 2017; 9 pages.

* cited by examiner

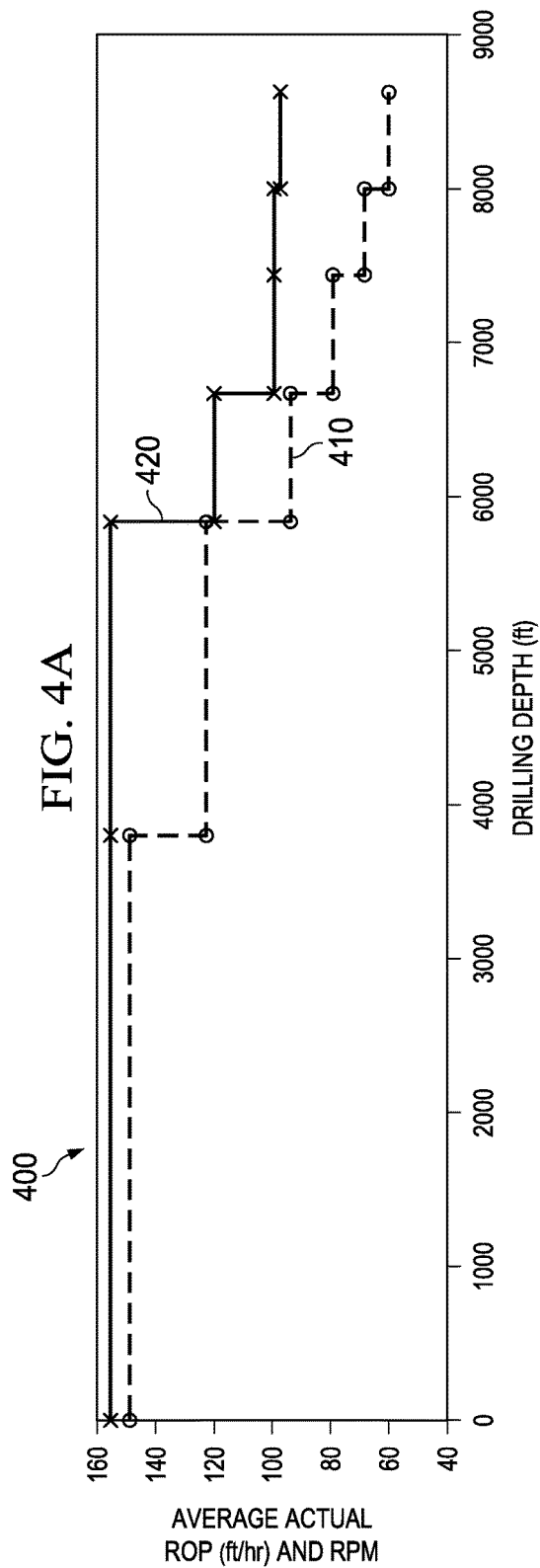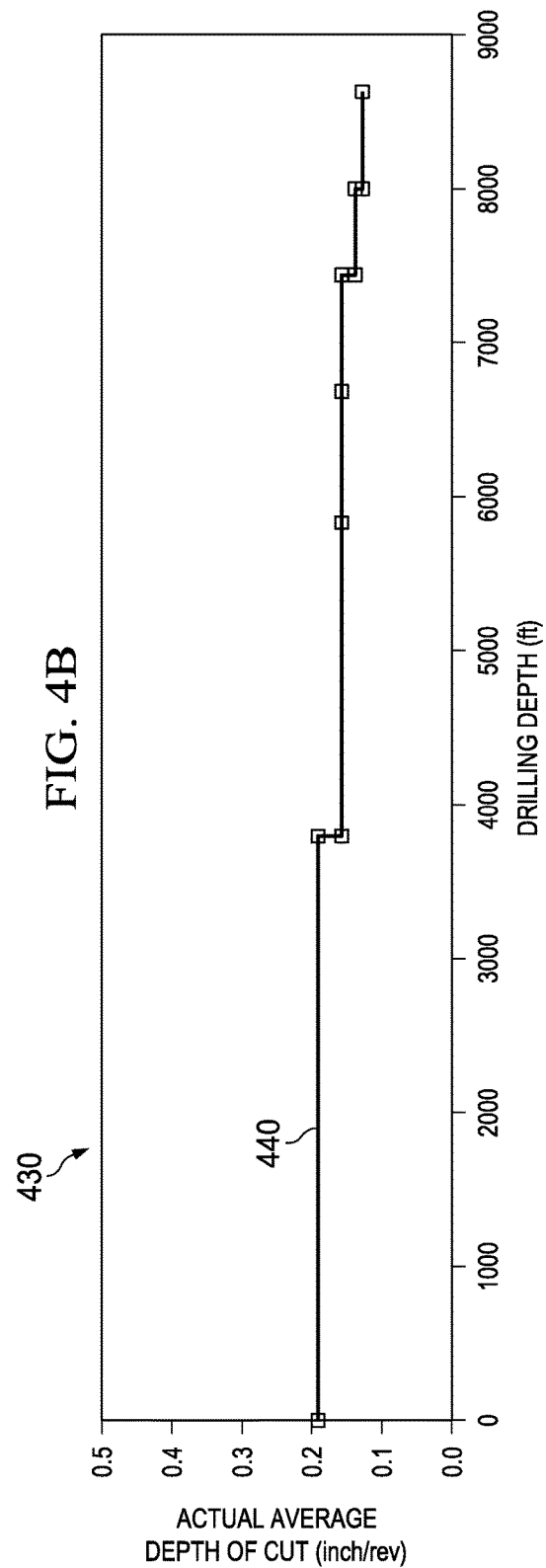

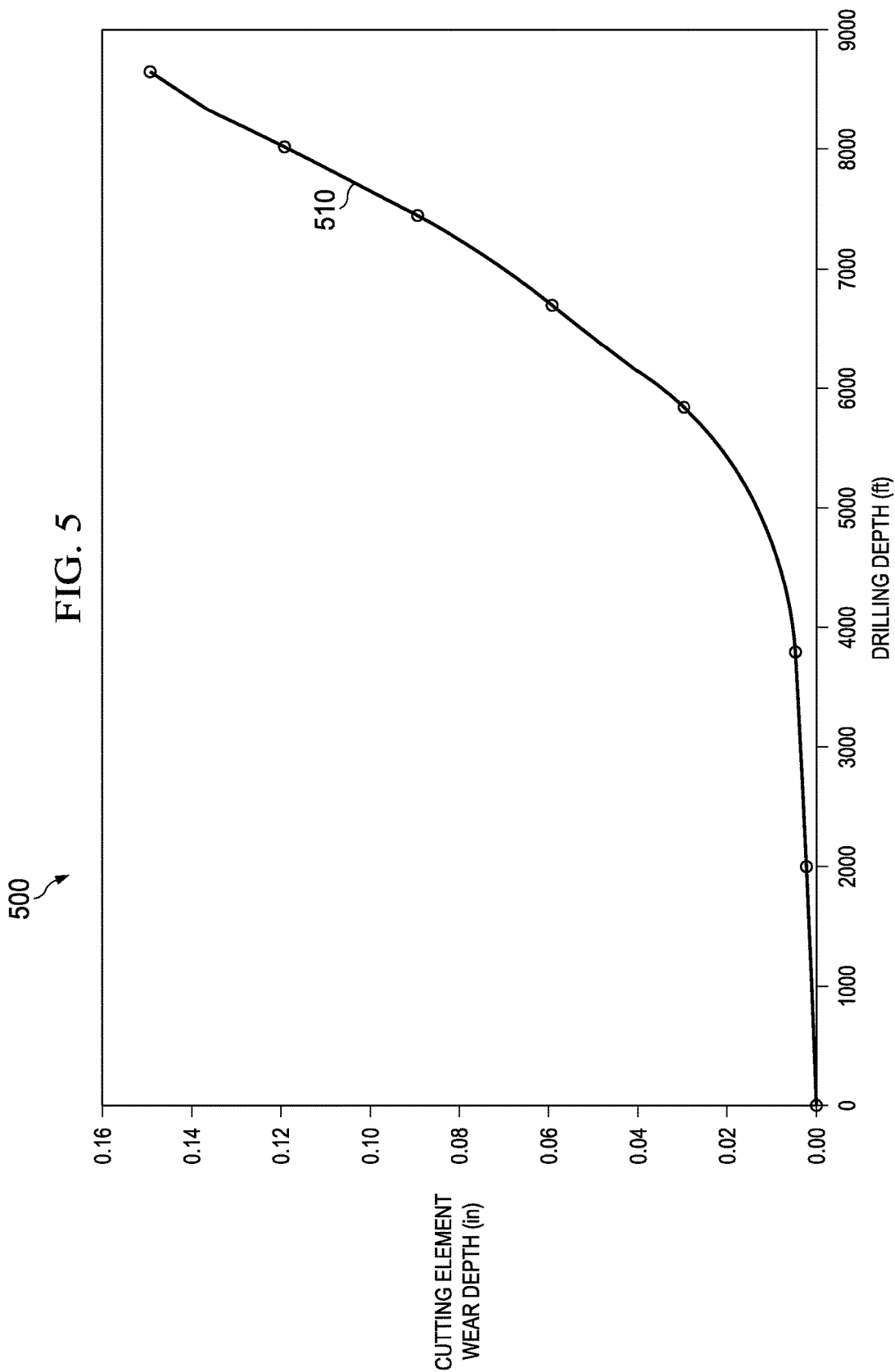

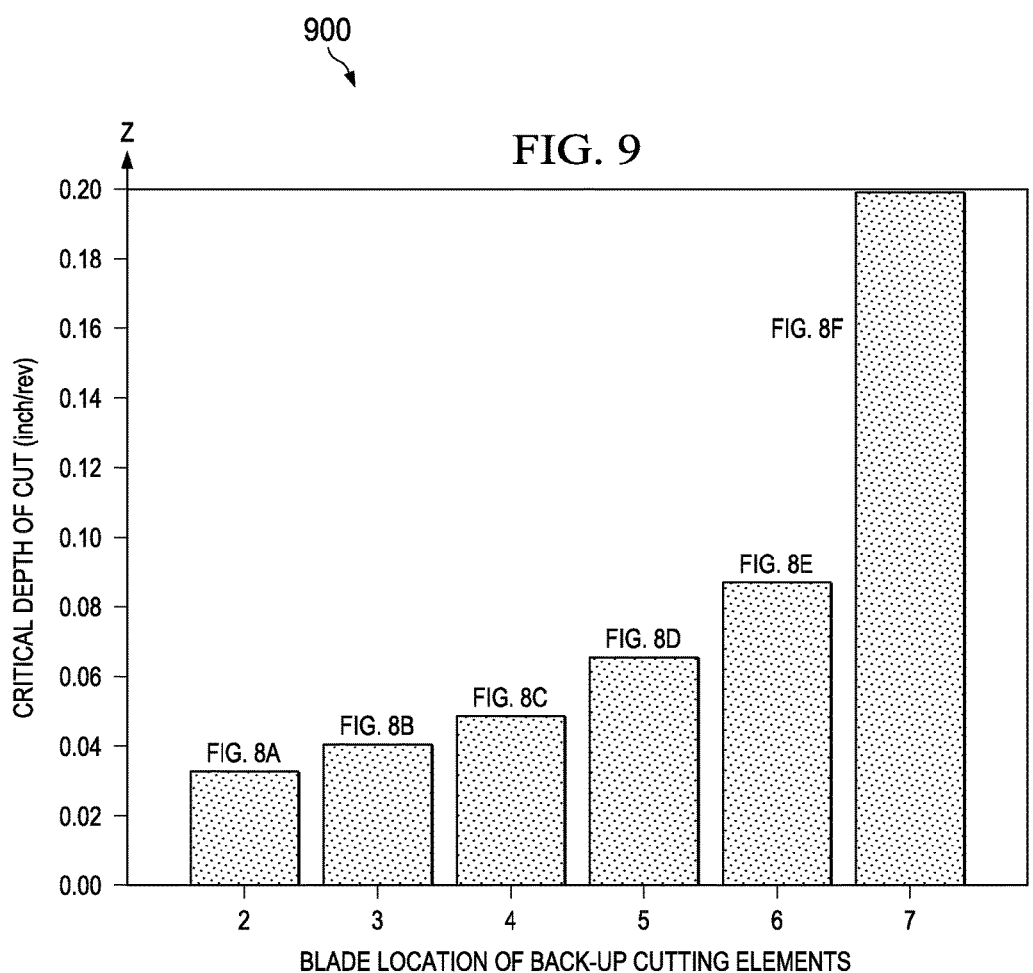

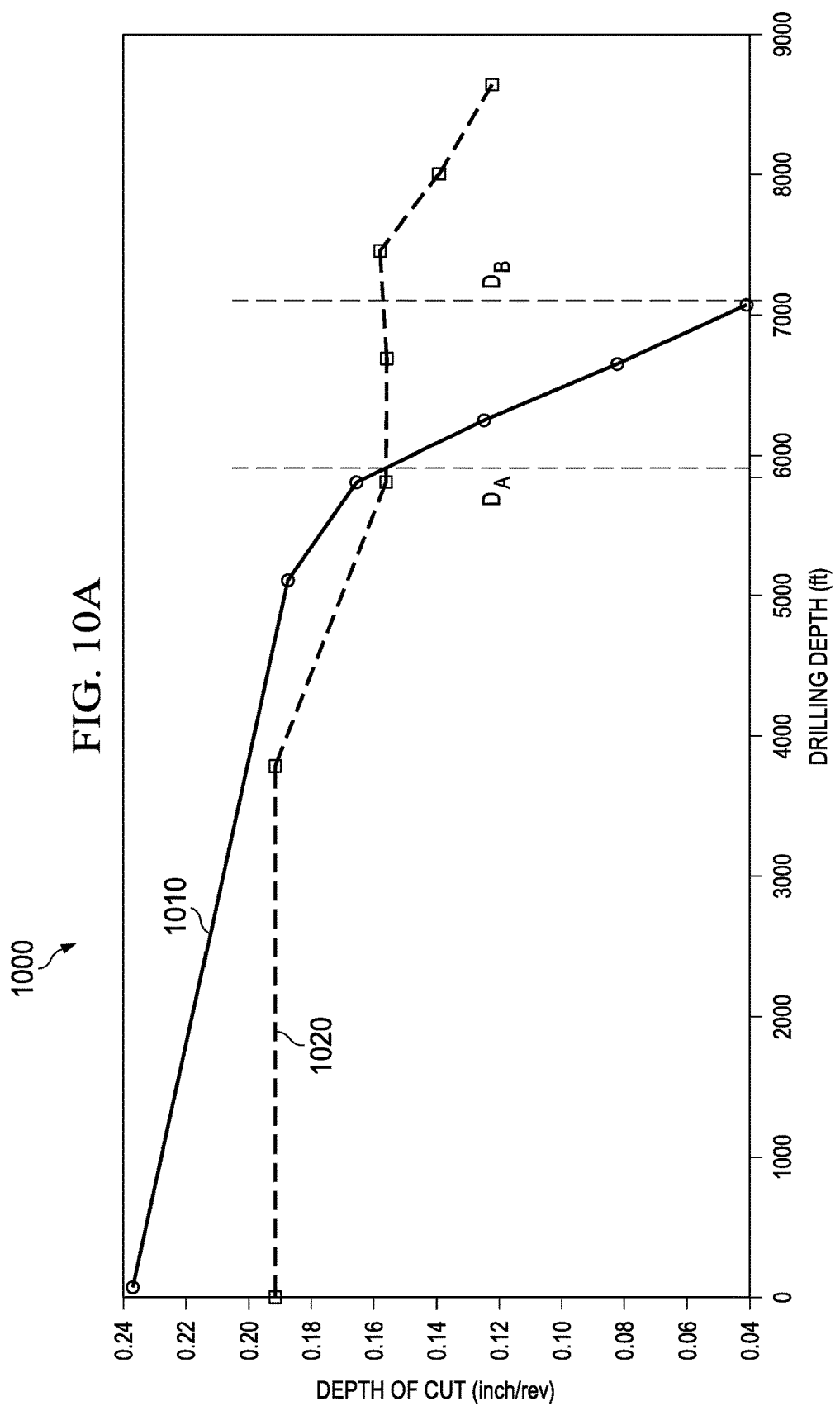

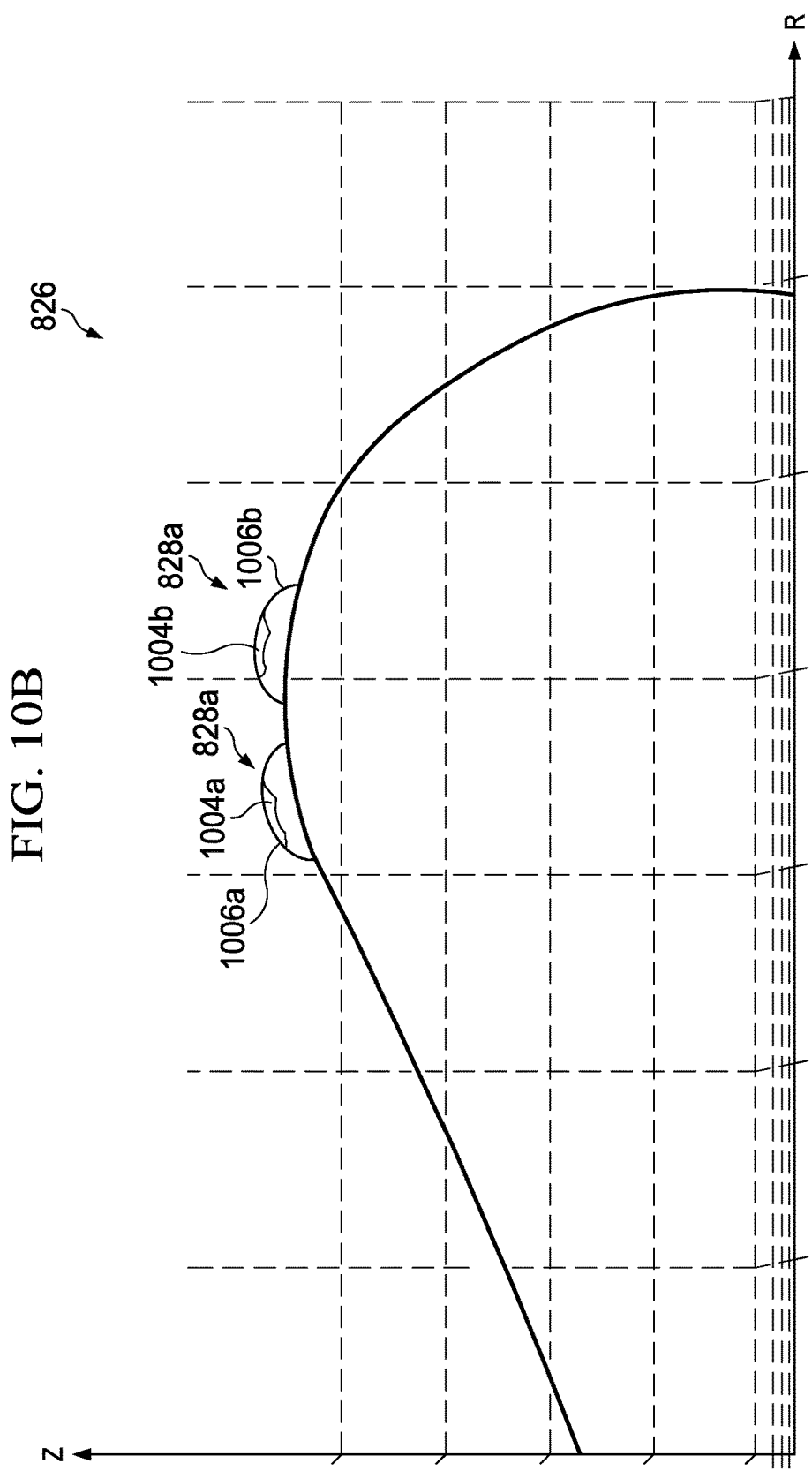

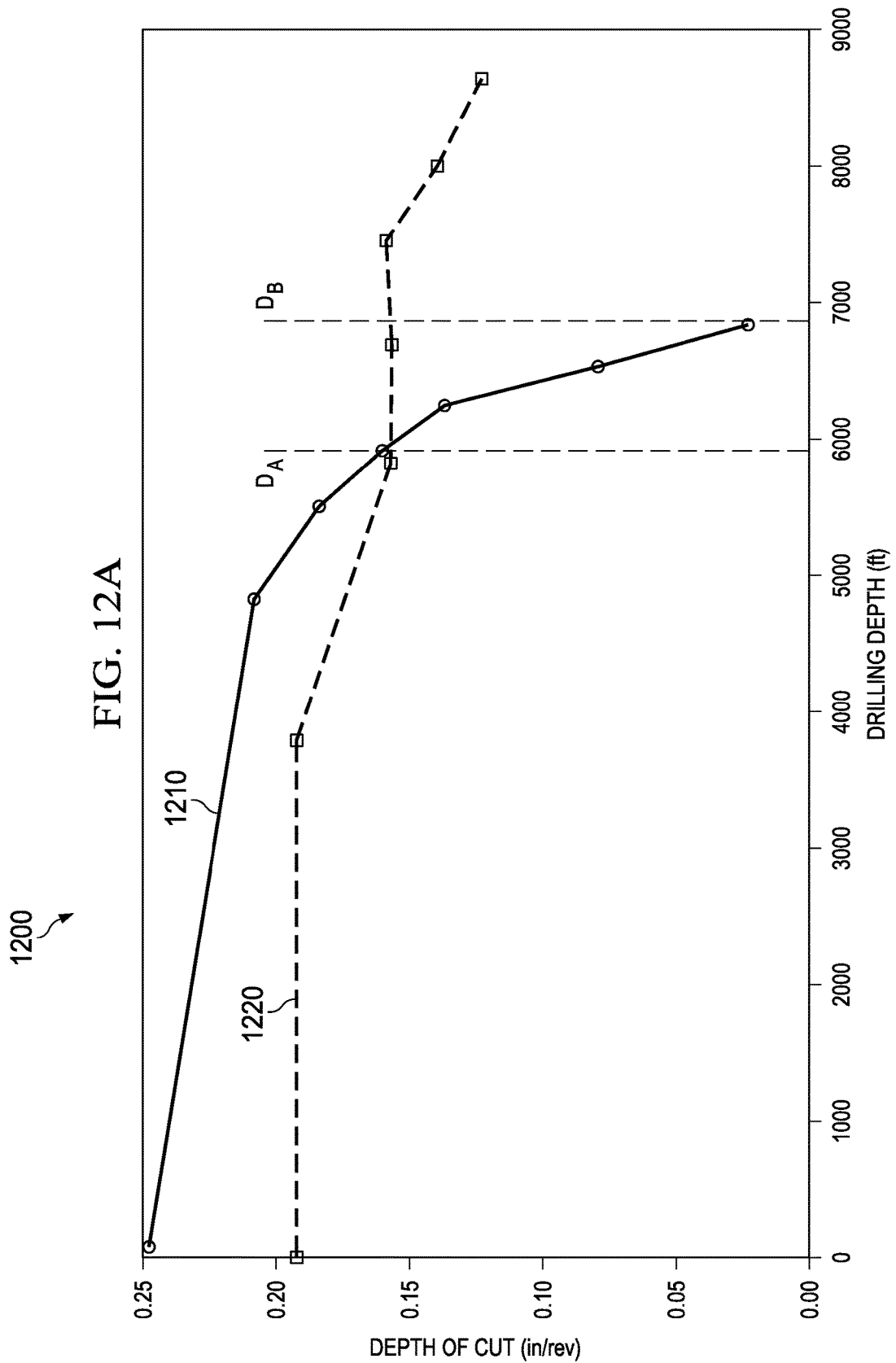

ROTARY DRILL BITS WITH BACK-UP CUTTING ELEMENTS TO OPTIMIZE BIT LIFE

RELATED APPLICATIONS

This application is a U.S. National Stage Application of International Application No. PCT/US2012/053761 filed Sep. 5, 2012, which designates the United States, and claims the benefit of U.S. Provisional Patent Application Ser. No. 61/671,579 filed Jul. 13, 2012, which is incorporated herein by reference in its entirety.

TECHNICAL FIELD

The present disclosure relates generally to downhole drilling tools and, more particularly, to rotary drill bits and method for designing rotary drill bits with back-up cutting elements to optimize bit life.

BACKGROUND

Various types of downhole drilling tools including, but not limited to, rotary drill bits, reamers, core bits, and other downhole tools have been used to form wellbores in associated downhole formations. Examples of such rotary drill bits include, but are not limited to, fixed cutter drill bits, drag bits, polycrystalline diamond compact (PDC) drill bits, and matrix drill bits associated with forming oil and gas wells extending through one or more downhole formations. Fixed cutter drill bits such as PDC bits may include multiple blades that each include multiple cutting elements.

In typical drilling applications, a PDC bit may be used to drill through various levels or types of geological formations with longer bit life than non-PDC bits. Typical formations may generally have a relatively low compressive strength in the upper portions (e.g., lesser drilling depths) of the formation and a relatively high compressive strength in the lower portions (e.g., greater drilling depths) of the formation. Thus, it typically becomes increasingly more difficult to drill at increasingly greater depths.

A primary cutting element may experience increased wear as drilling depth increases. Thus, a drilling tool may include one or more back-up cutting elements configured to cut the geological formation when the primary cutting elements experience sufficient wear.

In conventional drill bits, the back-up cutting elements are placed on the same blade directly behind the primary cutting elements. This type of arrangement may require the under-exposure of the back-up cutting elements with respect to the primary cutting elements to be very small (e.g., approximately 0.01 in to 0.06 in) in order for the back-up cutting elements to act as depth of cut controllers. This conventional layout of back-up elements often results in the following: (a) if the primary cutting elements are not worn, the back-up cutting elements may never cut into the formation; (b) if the primary cutting elements wear slightly, only some of the back-up cutting elements may cut into the formation while other back-up cutting elements may never cut into the formation or may cut into the formation only slightly; and (c) if the primary cutting elements wear to a certain point, the back-up cutting elements may cut into the formation but the back-up cutting elements may never cut as effectively as the primary cutting elements. Each of these situations results in a shorter than expected bit life.

SUMMARY

In accordance with teachings of the present disclosure, disadvantages and problems associated with designing rotary drill bits with back-up cutting elements to optimize bit life have been substantially reduced or eliminated. In a particular embodiment, a multi-layer downhole drilling tool designed for drilling a wellbore including a plurality of formations is disclosed. The drilling tool includes a bit body including a rotational axis extending therethrough. A plurality of blades are disposed on exterior portions of the bit body. A plurality of primary cutting elements and a plurality of back-up cutting elements are disposed on exterior portions of the plurality of blades. The back-up cutting elements are track set with corresponding primary cutting elements, and each back-up cutting element is disposed on a different blade than the corresponding primary cutting element.

In accordance with another embodiment of the present disclosure, a method for designing a multi-profile layer drill bit for drilling a wellbore including a plurality of formations is disclosed. The method includes obtaining drill bit run information for a pre-existing drill bit and generating an actual depth of cut as a function of drilling depth based on the drill bit run information. The wear of each of a plurality of primary cutting elements as a function of the drilling depth is estimated and a designed depth of cut as a function of the drilling depth is generated based on the estimated wear of each of the primary cutting elements. A first drilling depth is estimated where the primary cutting elements are worn such that at least one of a plurality of back-up cutting elements engages the formation based on the actual depth of cut and the designed depth of cut. The back-up cutting elements are configured on a plurality of blades based on the first drilling depth.

In accordance with another embodiment of the present disclosure, a method for designing a multi-profile layer drill bit for drilling a wellbore including a plurality of formations is disclosed. The method includes determining an expected drilling depth and generating an expected depth of cut as a function of a drilling depth based on the expected drilling depth. A wear of each of a plurality of primary cutting elements is estimated as a function of the drilling depth and the designed depth of cut as a function of the drilling depth is generated based on the estimate of the wear of each of the primary cutting elements. A first drilling depth is estimated where the primary cutting elements are worn such that at least one of a plurality of back-up cutting elements engage the formation based on the expected depth of cut and the designed depth of cut. The back-up cutting elements are configured on a plurality of blades based on the first drilling depth.

BRIEF DESCRIPTION OF THE DRAWINGS

A more complete understanding of the present disclosure and its features and advantages thereof may be acquired by referring to the following description, taken in conjunction with the accompanying drawings, in which like reference numbers indicate like features, and wherein:

FIG. 4A illustrates a graph of actual average rate of penetration (ROP) and revolutions per minute (RPM) as a function of drilling depth as estimated in accordance with some embodiments of the present disclosure;

FIG. 4B illustrates a graph of actual average depth of cut as a function of drilling depth as estimated in accordance with some embodiments of the present disclosure;

FIG. 5 illustrates a graph of primary cutting element wear as a function of drilling depth, in accordance with some embodiments of the present disclosure;

FIG. 9 illustrates a bar graph showing critical depth of cut as a function of blade location for back-up cutting elements disposed on a drill bit, in accordance with some embodiments of the present disclosure;

FIG. 10A illustrates a graph of designed depth of cut and actual depth of cut as a function of drilling depth of the drill bit of FIG. 8D, in accordance with some embodiments of the present disclosure;

FIG. 10B illustrates a schematic drawing for a bit face profile of a drill bit with exemplary cutting zones of various cutting elements disposed along a blade of a drill bit, in accordance with some embodiments of the present disclosure;

FIG. 12A illustrates a graph of designed depth of cut and actual depth of cut as a function of drilling depth of the drill bit of FIG. 8E, in accordance with some embodiments of the present disclosure;

DETAILED DESCRIPTION

Embodiments of the present disclosure and its advantages are best understood by referring to FIGS. 1-16, where like numbers are used to indicate like and corresponding parts.

Figure 1:
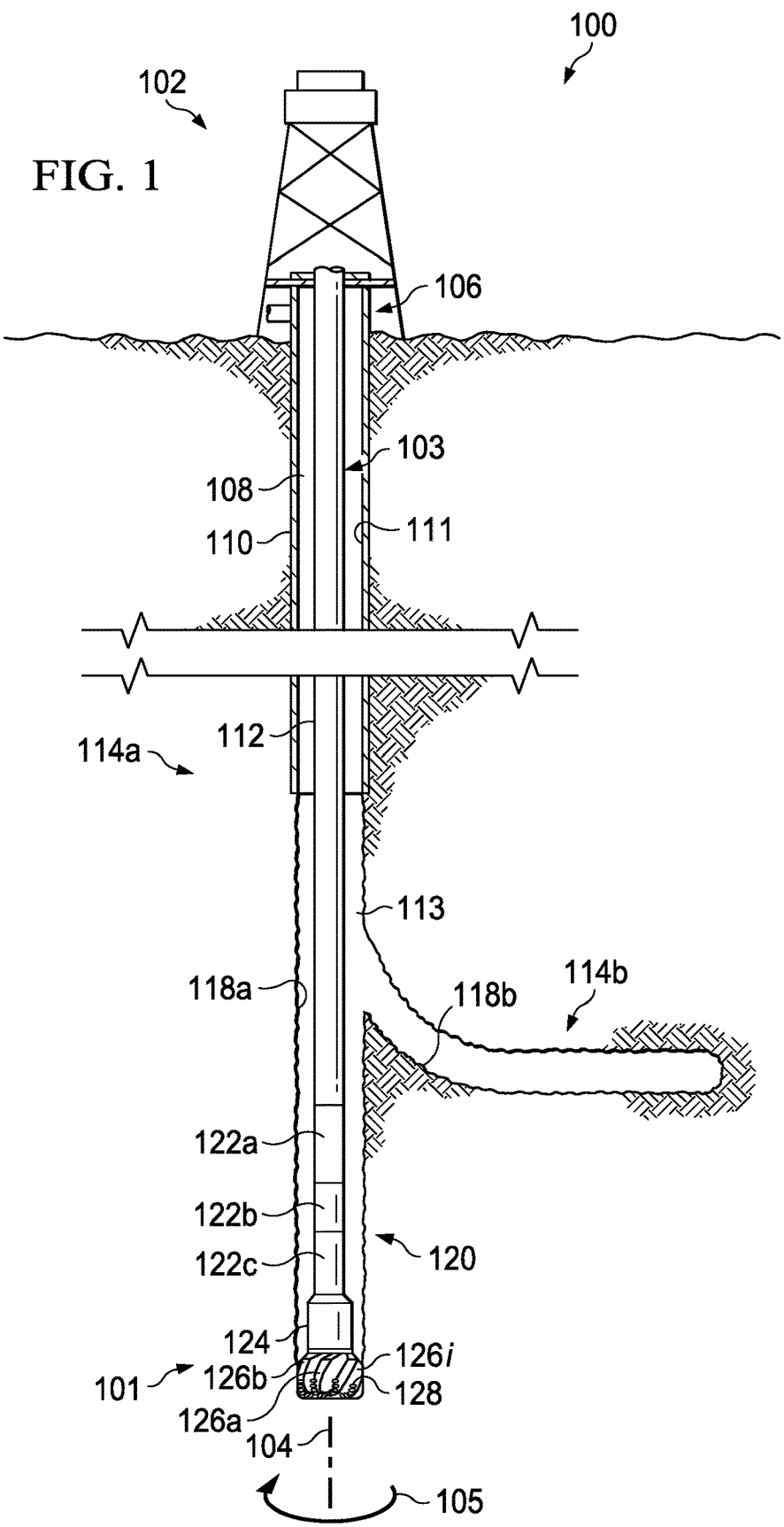
FIG. 1 illustrates an elevation of an example embodiment of a drilling system, in accordance with some embodiments of the present disclosure.

FIG. 1 illustrates an elevation of an example embodiment of a drilling system, in accordance with some embodiments of the present disclosure. Drilling system 100 is configured to provide drilling into one or more geological formations, in accordance with some embodiments of the present disclosure. While drilling it may be advantageous to utilize back-up cutting elements as a downhole drilling tool cuts into a geological formation in order to extend the bit life. As disclosed in further detail below and according to some embodiments of the present disclosure, drilling system 100 may include downhole drilling tools (e.g., a drill bit, a reamer, a hole opener, etc.) that may include one or more cutting elements arranged in multiple layers on the blades of the tool such that back-up cutting elements may engage the formation when primary cutting elements are sufficiently worn. In some embodiments, the drilling tools may have primary cutting elements arranged on blades that are in a single-set configuration and back-up cutting elements arranged on different blades that are track-set and under-exposed with respect to the primary cutting elements. In some embodiments, the amount of under-exposure may be approximately the same for each of the back-up cutting elements. In other embodiments, the amount of under-exposure may vary for each of the back-up cutting elements.

Drilling system 100 may include well surface or well site 106. Various types of drilling equipment such as a rotary table, mud pumps and mud tanks (not expressly shown) may be located at a well surface or well site 106. For example, well site 106 may include drilling rig 102 that may have various characteristics and features associated with a "land drilling rig." However, downhole drilling tools incorporating teachings of the present disclosure may be satisfactorily used with drilling equipment located on offshore platforms, drill ships, semi-submersibles and drilling barges (not expressly shown).

Drilling system 100 may include drill string 103 associated with drill bit 101 that may be used to form a wide variety of wellbores or bore holes such as generally vertical wellbore 114a or generally horizontal wellbore 114b as shown in FIG. 1. Various directional drilling techniques and associated components of bottom hole assembly (BHA) 120 of drill string 103 may be used to form generally horizontal wellbore 114b. For example, lateral forces may be applied to drill bit 101 proximate kickoff location 113 to form generally horizontal wellbore 114b extending from generally vertical wellbore 114a.

BHA 120 may be formed from a wide variety of components configured to form a wellbore 114. For example, components 122a, 122b and 122c of BHA 120 may include, but are not limited to, drill bits (e.g., drill bit 101), drill collars, rotary steering tools, directional drilling tools, downhole drilling motors, reamers, hole enlargers or stabilizers. The number of components such as drill collars and different types of components 122 included in BHA 120 may depend upon anticipated downhole drilling conditions and the type of wellbore that will be formed by drill string 103 and rotary drill bit 101.

Wellbore 114 may be defined in part by casing string 110 that may extend from well surface 106 to a selected downhole location. Portions of wellbore 114 as shown in FIG. 1 that do not include casing string 110 may be described as "open hole." Various types of drilling fluid may be pumped from well surface 106 through drill string 103 to attached drill bit 101. Such drilling fluids may be directed to flow from drill string 103 to respective nozzles (item 156 illustrated in FIG. 2A) included in rotary drill bit 101. The drilling fluid may be circulated back to well surface 106 through annulus 108 defined in part by outside diameter 112 of drill string 103 and inside diameter 118a of wellbore 114a. Inside diameter 118a may be referred to as the "sidewall" of wellbore 114a. Annulus 108 may also be defined by outside diameter 112 of drill string 103 and inside diameter 111 of casing string 110.

Figure 2:
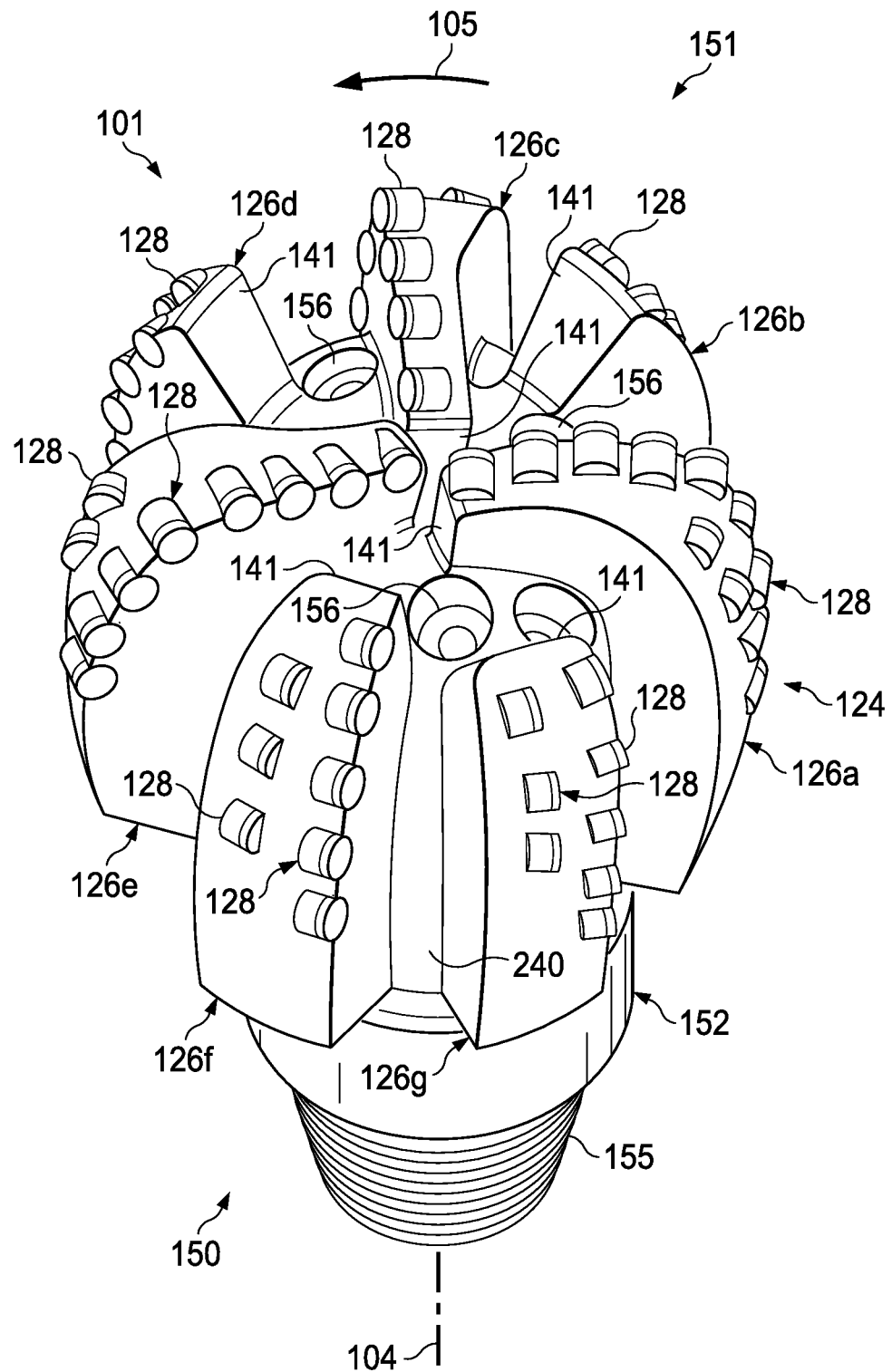
FIG. 2 illustrates an isometric view of a rotary drill bit oriented upwardly in a manner often used to model or design fixed cutter drill bits, in accordance with some embodiments of the present disclosure.

FIG. 2 illustrates an isometric view of rotary drill bit 101 oriented upwardly in a manner often used to model or design fixed cutter drill bits, in accordance with some embodiments of the present disclosure. Drill bit 101 may be any of various types of fixed cutter drill bits, including PDC bits, drag bits, matrix drill bits, and/or steel body drill bits operable to form wellbore 114 extending through one or more downhole formations. Drill bit 101 may be designed and formed in accordance with teachings of the present disclosure and may have many different designs, configurations, and/or dimensions according to the particular application of drill bit 101.

Drill bit 101 may include one or more blades 126 (e.g., blades 126a-126g) that may be disposed outwardly from exterior portions of rotary bit body 124 of drill bit 101. Rotary bit body 124 may have a generally cylindrical body and blades 126 may be any suitable type of projections extending outwardly from rotary bit body 124. For example, a portion of blade 126 may be directly or indirectly coupled to an exterior portion of bit body 124, while another portion of blade 126 is projected away from the exterior portion of bit body 124. Blades 126 formed in accordance with teachings of the present disclosure may have a wide variety of configurations including, but not limited to, substantially arched, helical, spiraling, tapered, converging, diverging, symmetrical, and/or asymmetrical.

In some cases, blades 126 may have substantially arched configurations, generally helical configurations, spiral shaped configurations, or any other configuration satisfactory for use with each downhole drilling tool. One or more blades 126 may have a substantially arched configuration extending from proximate rotational axis 104 of drill bit 101. The arched configuration may be defined in part by a generally concave, recessed shaped portion extending from proximate bit rotational axis 104. The arched configuration may also be defined in part by a generally convex, outwardly curved portion disposed between the concave, recessed portion and exterior portions of each blade which correspond generally with the outside diameter of the rotary drill bit.

Each of blades 126 may include a first end disposed proximate or toward bit rotational axis 104 and a second end disposed proximate or toward exterior portions of drill bit 101 (e.g., disposed generally away from bit rotational axis 104 and toward uphole portions of drill bit 101). The terms "uphole" and "downhole" may be used to describe the location of various components of drilling system 100 relative to the bottom or end of wellbore 114 shown in FIG. 1. For example, a first component described as uphole from a second component may be further away from the end of wellbore 114 than the second component. Similarly, a first component described as being downhole from a second component may be located closer to the end of wellbore 114 than the second component.

Blades 126a-126g may include primary blades disposed about the bit rotational axis. For example, in FIG. 2, blades 126a, 126c, and 126e may be primary blades or major blades because respective first ends 141 of each of blades 126a, 126c, and 126e may be disposed closely adjacent to associated bit rotational axis 104. In some embodiments, blades 126a-126g may also include at least one secondary blade disposed between the primary blades. Blades 126b, 126d, 126f, and 126g shown in FIG. 2 on drill bit 101 may be secondary blades or minor blades because respective first ends 141 may be disposed on downhole end 151 a distance from associated bit rotational axis 104. The number and location of secondary blades and primary blades may vary such that drill bit 101 includes more or less secondary and primary blades. Blades 126 may be disposed symmetrically or asymmetrically with regard to each other and bit rotational axis 104 where the disposition may be based on the downhole drilling conditions of the drilling environment. In some cases, blades 126 and drill bit 101 may rotate about rotational axis 104 in a direction defined by directional arrow 105.

Each blade may have a leading (or front) surface disposed on one side of the blade in the direction of rotation of drill bit 101 and a trailing (or back) surface disposed on an opposite side of the blade away from the direction of rotation of drill bit 101. Blades 126 may be positioned along bit body 124 such that they have a spiral configuration relative to rotational axis 104. In other embodiments, blades 126 may be positioned along bit body 124 in a generally parallel configuration with respect to each other and bit rotational axis 104.

Blades 126 may include one or more cutting elements 128 disposed outwardly from exterior portions of each blade 126. For example, a portion of cutting element 128 may be directly or indirectly coupled to an exterior portion of blade 126 while another portion of cutting element 128 may be projected away from the exterior portion of blade 126. Cutting elements 128 may be any suitable device configured to cut into a formation, including but not limited to, primary cutting elements, back-up cutting elements, secondary cutting elements or any combination thereof. By way of example and not limitation, cutting elements 128 may be various types of cutters, compacts, buttons, inserts, and gage cutters satisfactory for use with a wide variety of drill bits 101.

Cutting elements 128 may include respective substrates with a layer of hard cutting material disposed on one end of each respective substrate. The hard layer of cutting elements 128 may provide a cutting surface that may engage adjacent portions of a downhole formation to form wellbore 114. The contact of the cutting surface with the formation may form a cutting zone associated with each of cutting elements 128. The edge of the cutting surface located within the cutting zone may be referred to as the cutting edge of a cutting element 128.

Each substrate of cutting elements 128 may have various configurations and may be formed from tungsten carbide or other materials associated with forming cutting elements for rotary drill bits. Tungsten carbides may include, but are not limited to, monotungsten carbide (WC), ditungsten carbide ($W_2C$), macrocrystalline tungsten carbide and cemented or sintered tungsten carbide. Substrates may also be formed using other hard materials, which may include various metal alloys and cements such as metal borides, metal carbides, metal oxides and metal nitrides. For some applications, the hard cutting layer may be formed from substantially the same materials as the substrate. In other applications, the hard cutting layer may be formed from different materials than the substrate. Examples of materials used to form hard cutting layers may include polycrystalline diamond materials, including synthetic polycrystalline diamonds.

In some embodiments, blades 126 may also include one or more depth of cut controllers (DOCCs) (not expressly shown) configured to control the depth of cut of cutting elements 128. A DOCC may comprise an impact arrestor, a back-up cutting element and/or an MDR (Modified Diamond Reinforcement). Exterior portions of blades 126, cutting elements 128 and DOCCs (not expressly shown) may form portions of the bit face.

Blades 126 may further include one or more gage pads (not expressly shown) disposed on blades 126. A gage pad may be a gage, gage segment, or gage portion disposed on exterior portion of blade 126. Gage pads may often contact adjacent portions of wellbore 114 formed by drill bit 101. Exterior portions of blades 126 and/or associated gage pads may be disposed at various angles, positive, negative, and/or parallel, relative to adjacent portions of generally vertical wellbore 114a. A gage pad may include one or more layers of hardfacing material.

Uphole end 150 of drill bit 101 may include shank 152 with drill pipe threads 155 formed thereon. Threads 155 may be used to releasably engage drill bit 101 with BHA 120, described in detail below, whereby drill bit 101 may be rotated relative to bit rotational axis 104. Downhole end 151 of drill bit 101 may include a plurality of blades 126a-126g with respective junk slots or fluid flow paths 240 disposed therebetween. Additionally, drilling fluids may be communicated to one or more nozzles 156.

Drill bit operation may be expressed in terms of depth of cut per revolution as a function of drilling depth. Depth of cut per revolution, or "depth of cut," may be determined by rate of penetration (ROP) and revolution per minute (RPM). ROP may represent the amount of formation that is removed as drill bit 101 rotates and may be in units of ft/hr. Further, RPM may represent the rotational speed of drill bit 101. For example, drill bit 101 utilized to drill a formation may rotate at approximately 120 RPM.

Multiple formations of varied formation strength may be drilled using drill bits configured in accordance with some embodiments of the present disclosure. As drilling depth increases, formation strength may likewise increase. For example, a first formation may extend from the surface to a drilling depth of approximately 3000 feet and may have a rock strength of approximately 10,000 pounds per square inch (psi). Additionally, a second formation may extend from a drilling depth of approximately 3,000 feet to a drilling depth of approximately 5,000 feet and may have rock strength of approximately 15,000 psi. As another example, a third formation may extend from a drilling depth of approximately 5,000 feet to a drilling depth of approximately 6,000 feet and may have a rock strength over approximately 20,000 psi.

With increased drilling depth, formation strength or rock strength may increase and thus, the formation may become more difficult to drill. For example, a conventional drill bit including seven blades may drill through the first formation very efficiently, but a conventional drill bit including nine blades may be desired to drill through the second and third formations.

Accordingly, as drill bit 101 drills into a formation, the primary cutting elements may begin to wear as the drilling depth increases. For example, at a drilling depth of less than approximately 3,000 feet, the primary cutting elements may have a wear depth of approximately 0.004 inches. At a drilling depth between approximately 3,000 feet and 5,000 feet, the primary cutting elements may have an increased wear depth of approximately 0.015 inches. As primary cutting elements wear, ROP of the drill bit may decrease, thus, resulting in less efficient drilling. For example, ROP of drill bit 101 rotating at approximately 120 RPM may begin at approximately 150 ft/hr. After drilling into the formation to a drilling depth of approximately 5,000 feet, the primary cutting elements of drill bit 101 may experience wear and ROP may decrease to less than approximately 120 ft/hr. Thus, with increased drilling depth and increased cutting element wear, ROP of drill bit 101 may decrease. Likewise, actual depth of cut for drill bit 101, which is a measure of the depth that primary cutting elements cut into the formation during each rotation of drill bit 101, may also decrease. Thus, back-up cutting elements that begin to cut into the formation when the primary cutting elements experience a sufficient amount of wear may improve the efficiency of drill bit 101 and may result in drill bit 101 having a longer useful life.

Accordingly, to extend the bit life, it may be desired that (1) the under exposure of back-up cutting elements are designed according to the wear characteristics of the primary cutting elements; (2) the back-up cutting elements will begin to cut into the formation similar in cutting effectiveness to the primary cutting elements once the primary cutting elements are sufficiently worn; (3) the back-up cutting elements act as depth of cut controllers if the depth of cut of the primary cutting elements is greater than a predetermined limit. Hence, drill bit 101 optimized for maximizing drilling efficiency and bit life may include:

(a) primary cutting elements that cut into the formation from the surface to a first drilling depth ($D_A$) and back-up cutting elements that act as depth of cut controllers for the primary cutting elements;

(b) back-up cutting elements that begin to partially cut into the formation from $D_A$ to a second drilling depth ($D_B$) as the primary cutting elements become worn; and (c) back-up cutting elements that act as primary cutting elements or major cutting elements at drilling distance greater than $D_B$ when the primary cutting elements are sufficiently worn.

Figure 3:
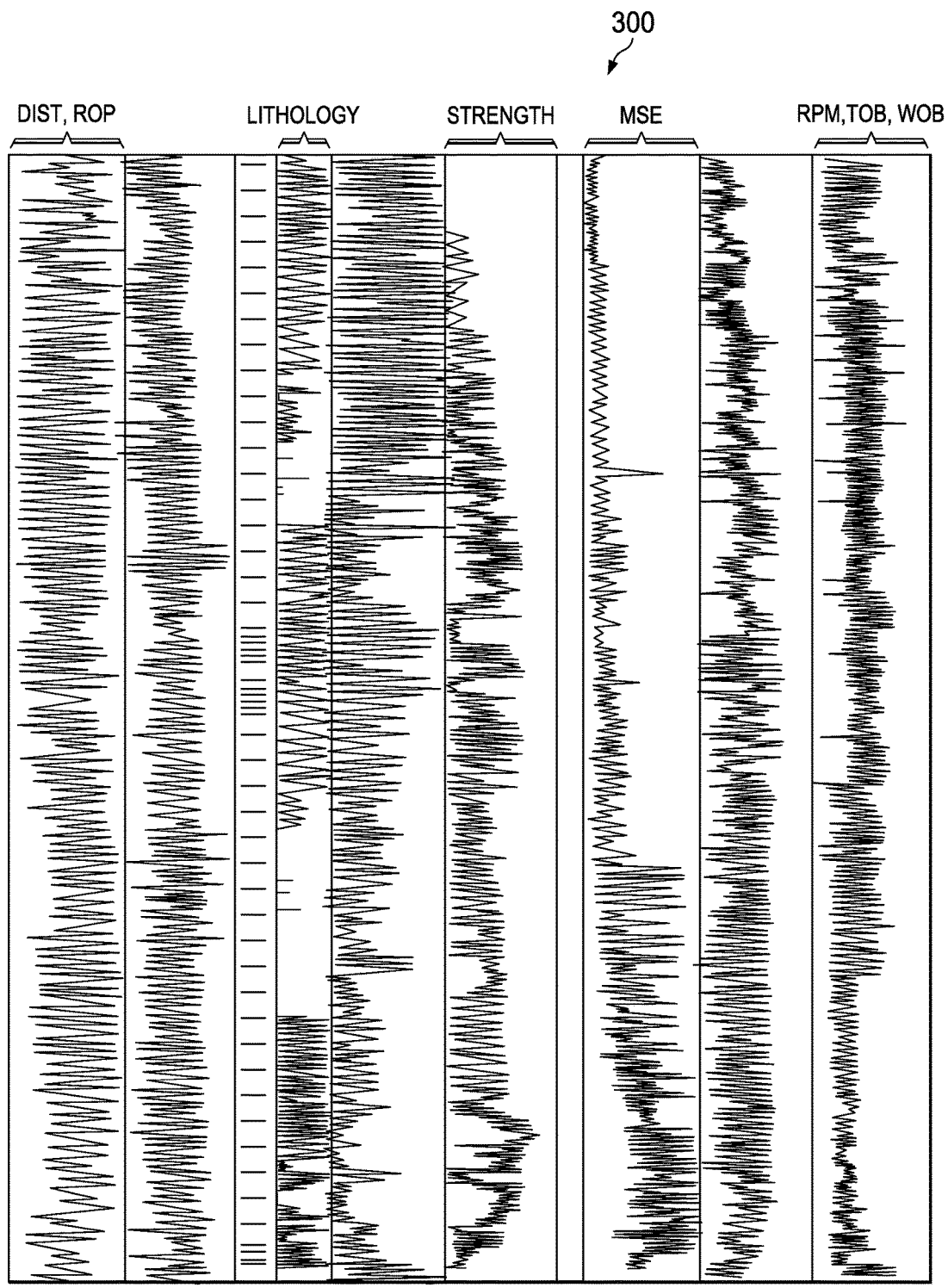
FIG. 3 illustrates a report of run information that may be gathered from drilling a wellbore with a drill bit, in accordance with some embodiments of the present disclosure.

Improvement of the design of a drill bit may begin with actual performance of the bit when drilled into an offset well with a similar formation and similar operational parameters. FIG. 3 illustrates a report of run information 300 that may be gathered from drilling a wellbore (e.g., wellbore 114 as illustrated in FIG. 1) with a drill bit, in accordance with some embodiments of the present disclosure. Drill bit run information may include, but is not limited to, formation lithology, unconfined rock strength, RPM, weight on bit (WOB), torque on bit (TOB), and mechanical specific energy (MSE). The run information may be measured at each foot drilled and MSE may be calculated using the run information. MSE may be a measure of the drilling efficiency of drill bit 101. In the illustrated embodiment, MSE increases after drilling approximately 6,200 feet, which may indicate that the drilling efficiency of the drill bit may be low at depths over approximately 6,200 feet. The data shown in FIG. 3 may be obtained from various tools in the oil and gas drilling industry such as SPARTA™ analytical tools designed and manufactured by Halliburton Company (Houston, Tex.).

Using the gathered run information illustrated in FIG. 3, the average ROP and average RPM for a specified drilling section may be plotted as a function of drilling distance. Accordingly, FIG. 4A illustrates graph 400 of actual average ROP and actual average RPM as a function of drilling depth as estimated in accordance with some embodiments of the present disclosure. For example, from the drilling start point to a drilling depth of approximately 3,800 feet, actual average ROP, plot 410, may be approximately 150 ft/hr. Corresponding average RPM, plot 420, in this section of formation may be approximately 155. At a drilling depth of approximately 3,800 feet, actual average ROP, plot 410 may decrease to approximately 120 ft/hr while average RPM, plot 420, remains approximately constant to a drilling depth of approximately 5,800 feet where it may begin to decrease. Thereafter, actual average ROP, plot 410, may continue to decrease as the drilling depth continues to increase.

Similarly, FIG. 4B illustrates graph 430 of actual average depth of cut as a function of drilling depth as estimated in accordance with some embodiments of the present disclosure. Actual depth of cut as a function of drilling depth may be shown by plot 440. Actual depth of cut (Δ) may be expressed as a function of actual ROP and RPM using the following equation:

$$\Delta = ROP/(5*RPM).$$

Actual depth of cut may have a unit of in/rev. For example, from the drilling start point to a drilling depth of approximately 3,800 feet, actual average depth of cut, plot 440, may be approximately 0.1935 in/rev. At a drilling depth of approximately 3,800 feet, actual average depth of cut, plot 440, may decrease to approximately 0.1548 in/rev. At a drilling depth of approximately 7,500 feet, actual average depth of cut, plot 440, may begin to further decrease as the drilling depth increases.

FIG. 5 illustrates graph 500 of primary cutting element wear as a function of drilling depth, in accordance with some embodiments of the present disclosure. Based on run information 300 gathered as illustrated in FIG. 3, the actual wear of cutting elements may be plotted and then an average wear line may be estimated. Cutting element wear as a function of drilling depth may be shown as plot 510. According to some embodiments of the present disclosure, a prediction of cutting element wear from drilling information may be made by utilizing a cutting element wear model, such as those disclosed in U.S. Pat. No. 6,109,938, U.S. Pat. No. 6,408,953, U.S. Pat. No. 7,032,689, U.S. Pat. No. 7,261,167, and U.S. Pat. No. 7,357,196, which are incorporated by reference herein, or a cutting element wear model generated using SPARTA™ analytical tools designed and manufactured by Halliburton Company (Houston, Tex.). The cutting element wear models may be used to determine the cutting element wear of any drill bit, including drill bit 101. One such model may be based on the accumulated work done by drill bit 101:

$$\text{Wear}(\%) = (\text{Cumwork}/\text{BitMaxWork})^a * 100\%$$

where

Cumwork=f(drilling depth); and a=wear exponent and is between approximately 0.5 and 5.0.

Figure 6A:
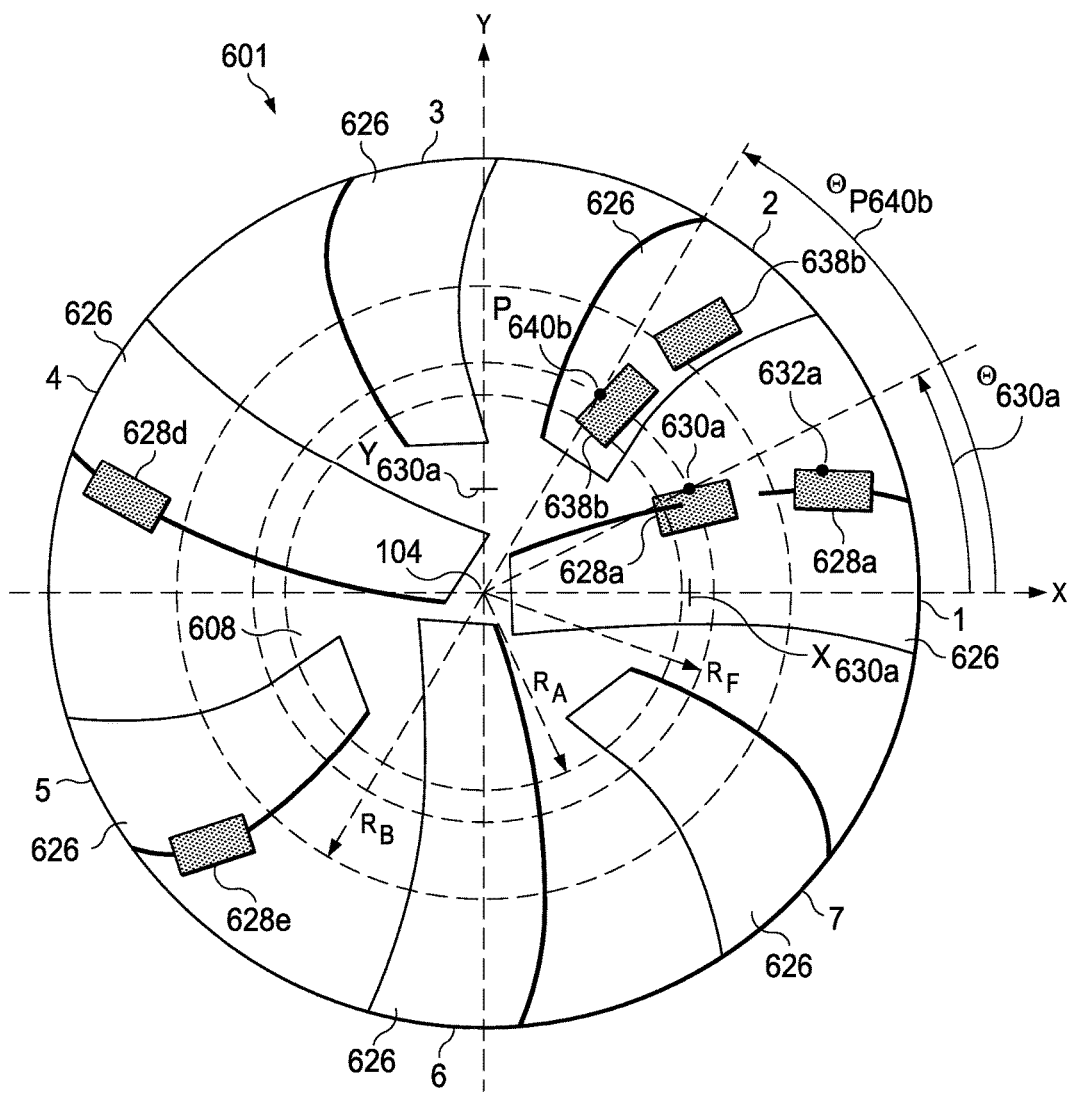
FIG. 6A illustrates a schematic drawing for a bit face of a drill bit including primary and back-up cutting elements for which a critical depth of cut control curve (CDCCC) may be determined, in accordance with some embodiments of the present disclosure.
Figure 6B:
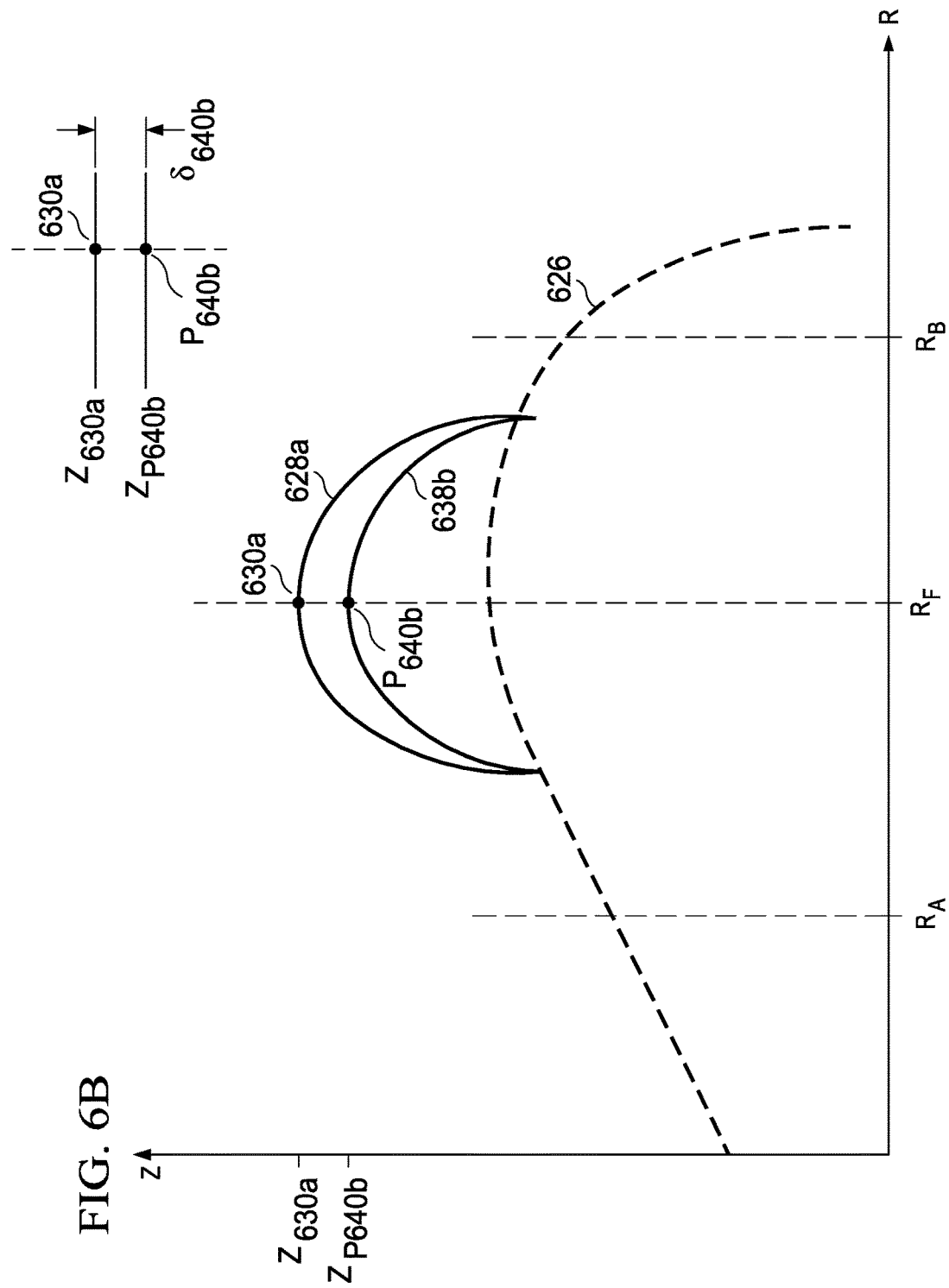
FIG. 6B illustrates a schematic drawing for a bit face profile of the drill bit of FIG. 6A, in accordance with some embodiments of the present disclosure.

Using the above model, cutting element wear as a function of drilling depth for a drill bit may be estimated and utilized during downhole drilling. Once the wear characteristics are obtained from the model, the drilling depth at which the primary cutting elements may be worn to the point that the back-up cutting elements may begin to cut into the formation and act as primary cutting elements or major cutting elements ($D_B$) may be determined. For example, as illustrated in cutting element wear plot 510 in FIG. 5, after drilling to a depth of approximately 8,600 feet, the primary cutting elements may have a cutting element wear depth of approximately 0.15 inches. Cutting element wear plot 510 in FIG. 5 may depend on the material properties of the PDC layer and the bit operational parameters. As illustrated below, cutting element wear plot 510 may play a role in the optimization of the layout of the back-up cutting elements In order to determine the amount of wear of the primary cutting element at which the back-up cutting element may begin to cut into the formation, a critical depth of cut curve (CDCCC) for PDC bits having back-up cutting elements may be determined. FIG. 6A illustrates a schematic drawing for a bit face of drill bit 601 including primary and back-up cutting elements 628 and 638 for which a CDCCC may be determined, in accordance with some embodiments of the present disclosure. FIG. 6B illustrates a schematic drawing for a bit face profile of drill bit 601 of FIG. 6A, in accordance with some embodiments of the present disclosure. To provide a frame of reference, FIG. 6B includes a z-axis that may represent the rotational axis of drill bit 601. Accordingly, a coordinate or position corresponding to the z-axis of FIG. 6B may be referred to as an axial coordinate or axial position of the bit face profile depicted in FIG. 6B. FIG. 6B also includes a radial axis (R) that indicates the orthogonal distance from the rotational axis, of drill bit 601.

Additionally, a location along the bit face of drill bit 601 shown in FIG. 6A may be described by x and y coordinates of an xy-plane of FIG. 6A. The xy-plane of FIG. 6A may be substantially perpendicular to the z-axis of FIG. 6B such that the xy-plane of FIG. 6A may be substantially perpendicular to the rotational axis of drill bit 601. Additionally, the x-axis and y-axis of FIG. 6A may intersect each other at the z-axis of FIG. 6B such that the x-axis and y-axis may intersect each other at the rotational axis of drill bit 601.

The distance from the rotational axis of the drill bit 601 to a point in the xy-plane of the bit face of FIG. 6A may indicate the radial coordinate or radial position of the point on the bit face profile depicted in FIG. 6B. For example, the radial coordinate, r, of a point in the xy-plane having an x-coordinate, x, and a y-coordinate, y, may be expressed by the following equation:

$$r=\sqrt{x^2+y^2}.$$

Additionally, a point in the xy-plane (of FIG. 6A) may have an angular coordinate that may be an angle between a line extending orthogonally from the rotational axis of drill bit 601 to the point and the x-axis. For example, the angular coordinate ($\theta$) of a point on the xy-plane (of FIG. 6B) having an x-coordinate, x, and a y-coordinate, y, may be expressed by the following equation:

$$\theta=\arctan(y/x).$$

As a further example, as illustrated in FIG. 6A, cutlet point 630a (described in further detail below) associated with a cutting edge of primary cutting element 628a may have an x-coordinate ($X_{630a}$) and a y-coordinate ($Y_{630a}$) in the xy-plane. $X_{630a}$ and $Y_{630a}$ may be used to calculate a radial coordinate ($R_F$) of cutlet point 630a (e.g., $R_F$ may be equal to the square root of $X_{630a}$ squared plus $Y_{630a}$ squared). $R_F$ may accordingly indicate an orthogonal distance of cutlet point 630a from the rotational axis of drill bit 601.

Additionally, cutlet point 630a may have an angular coordinate ($\theta_{630a}$) that may be the angle between the x-axis and the line extending orthogonally from the rotational axis of drill bit 601 to cutlet point 630a (e.g., $\theta_{630a}$ may be equal to arctan ($X_{630a}/Y_{630a}$)). Further, as depicted in FIG. 6B, cutlet point 630a may have an axial coordinate ($Z_{630a}$) that may represent a position of cutlet point 630a along the rotational axis of drill bit 601.

The cited coordinates and coordinate systems are used for illustrative purposes only, and any other suitable coordinate system or configuration, may be used to provide a frame of reference of points along the bit face profile and bit face of a drill bit associated with FIGS. 6A and 6B, without departing from the scope of the present disclosure. Additionally, any suitable units may be used. For example, the angular position may be expressed in degrees or in radians.

Returning to FIG. 6A, drill bit 601 may include a plurality of blades 626 that may include cutting elements 628 and 638. For example, FIG. 6A depicts a seven-bladed drill bit 601 in which blades 626 may be numbered 1-7. However, drill bit 601 may include more or fewer blades than shown in FIG. 6A. Cutting elements 628 and 638 may be designated as either primary cutting elements 628 or back-up cutting elements 638. Back-up cutting elements 638 may be utilized to extend the life of drill bit 601 as primary cutting elements 628 become worn. Back-up cutting elements 638 may be placed to overlap a radial swath of primary cutting elements 628. In other words, back-up cutting elements 638 may be located at the same radial position as associated primary cutting elements 628 (e.g., back-up cutting elements 638 may be track set with respect to primary cutting elements 628). Track set cutting elements have radial correspondence such that they are at the same radial position with respect to bit rotational axis 104. Additionally, in some designs for drill bit 601, back-up cutting elements 638 may not be configured to overlap the rotational path of primary cutting elements 628. Single set cutting elements may each have a unique radial position with respect to bit rotational axis 104. FIG. 6A illustrates an example of a track set configuration in which primary cutting elements 628a and back-up cutting elements 638b are located at the same radial distance from rotational axis 104.

The critical depth of cut of drill bit 601 may be the point at which back-up cutting elements 638b begin to cut into the formation. Accordingly, the critical depth of cut of drill bit 601 may be determined for a radial location along drill bit 601. For example, drill bit 601 may include a radial coordinate $R_F$ that may intersect with the cutting edge of back-up cutting element 638b at control point $P_{640b}$. Likewise, radial coordinate $R_F$ may intersect with the cutting edge of primary cutting element 628a at cutlet point 630a.

The angular coordinates of cutlet point 630a ($\theta_{630a}$) and control point $P_{640b}$ ($\theta_{P640b}$) may be determined. A critical depth of cut provided by control point $P_{640b}$ with respect to cutlet point 630a may be determined. The critical depth of cut provided by control point $P_{640b}$ may be based on the under-exposure ($\delta_{640b}$ depicted in FIG. 6B) of control point $P_{640b}$ with respect to cutlet point 630a and the angular coordinates of control point $P_{640b}$ with respect to cutlet point 630a.

For example, the depth of cut at which back-up cutting element 638a at control point $P_{640b}$ may begin to cut formation may be determined using the angular coordinates of cutlet point 630a and control point $P_{640b}$ ($\theta_{630a}$ and $\theta_{P640b}$, respectively), which are depicted in FIG. 6A. Additionally, $\Delta_{630a}$ may be based on the axial under-exposure ($\delta_{640b}$) of the axial coordinate of control point $P_{640b}$ ($Z_{P640b}$) with respect to the axial coordinate of cutlet point 630a ($Z_{630a}$), as depicted in FIG. 6B. In some embodiments, $\Delta_{630a}$ may be determined using the following equations:

$$\Delta_{630a}=\delta_{640b}*360/(360-(\theta_{P640b}-\theta_{630a})); \text{ and}$$

$$\delta_{640b}=Z_{630a}-Z_{P640b}.$$

In the first of the above equations, $\theta_{P640b}$ and $\theta_{630a}$ may be expressed in degrees and "360" may represent a full rotation about the face of drill bit 601. Therefore, in instances where $\theta_{P640b}$ and $\theta_{630a}$ are expressed in radians, the numbers "360" in the first of the above equations may be changed to "$2\pi$." Further, in the above equation, the resultant angle of "($\theta_{P640b}$ and $\theta_{630a}$)" ($\Delta_\theta$) may be defined as always being positive. Therefore, if resultant angle $\Delta_\theta$ is negative, then $\Delta_\theta$ may be made positive by adding 360 degrees (or $2\pi$ radians) to $\Delta_\theta$. Similar equations may be used to determine the depth of cut at which back-up cutting element 638a at control point $P_{640b}$ ($\Delta_{630a}$) may begin to cut formation in place of primary cutting element 628a.

The critical depth of cut provided by control point $P_{640b}$ ($\Delta_{P640b}$) may be based on additional cutlet points along $R_F$ (not expressly shown). For example, the critical depth of cut provided by control point $P_{640b}$ ($\Delta_{P640b}$) may be based the maximum of $\Delta_{630a}$, $\Delta_{630c}$, and $\Delta_{630e}$ and may be expressed by the following equation:

$$\Delta_{P640b}=\max[\Delta_{630a},\Delta_{630c},\Delta_{630e}].$$

Similarly, the critical depth of cut provided by additional control points (not expressly shown) at radial coordinate $R_F$ may be similarly determined. For example, the overall critical depth of cut of drill bit 601 at radial coordinate $R_F$ ($\Delta_{RF}$) may be based on the minimum of $\Delta_{P640b}$, $\Delta_{P640c}$, and $\Delta_{P640e}$ and may be expressed by the following equation:

$$\Delta R_F = \min[\Delta_{P640b}, \Delta_{P640c}, \Delta_{P640e}].$$

Accordingly, the critical depth of cut of drill bit 601 at radial coordinate $R_F$ ($\Delta_{RF}$) may be determined based on the points where primary cutting elements 628 and back-up cutting elements 638 intersect $R_F$. Although not expressly shown here, it is understood that the overall critical depth of cut of drill bit 601 at radial coordinate $R_F$ ($\Delta_{RF}$) may also be affected by control points $P_{626i}$ (not expressly shown in FIGS. 6A and 6B) that may be associated with blades 626 configured to control the depth of cut of drill bit 601 at radial coordinate $R_F$. In such instances, a critical depth of cut provided by each control point $P_{626i}/(\Delta_{P626i})$ may be determined. Each critical depth of cut $\Delta_{P626i}$ for each control point $P_{626i}$ may be included with critical depth of cuts $\Delta_{P626i}$ in determining the minimum critical depth of cut at $R_F$ to calculate the overall critical depth of cut $\Delta_{RF}$ at radial location $R_F$.

To determine a CDCCC of drill bit 601, the overall critical depth of cut at a series of radial locations $R_f$ ($\Delta_f$) anywhere from the center of drill bit 601 to the edge of drill bit 601 may be determined to generate a curve that represents the critical depth of cut as a function of the radius of drill bit 601. In the illustrated embodiment, back-up cutting element 638b may be configured to control the depth of cut of drill bit 601 for a radial swath 608 (shown on FIG. 6A) defined as being located between a first radial coordinate $R_A$ and a second radial coordinate $R_B$. Accordingly, the overall critical depth of cut may be determined for a series of radial coordinates $R_f$ that are within radial swath 608 and located between $R_A$ and $R_B$, as disclosed above. Once the overall critical depths of cuts for a sufficient number of radial coordinates $R_f$ are determined, the overall critical depth of cut may be graphed as a function of the radial coordinates $R_f$ as a CDCCC.

Figure 10C:
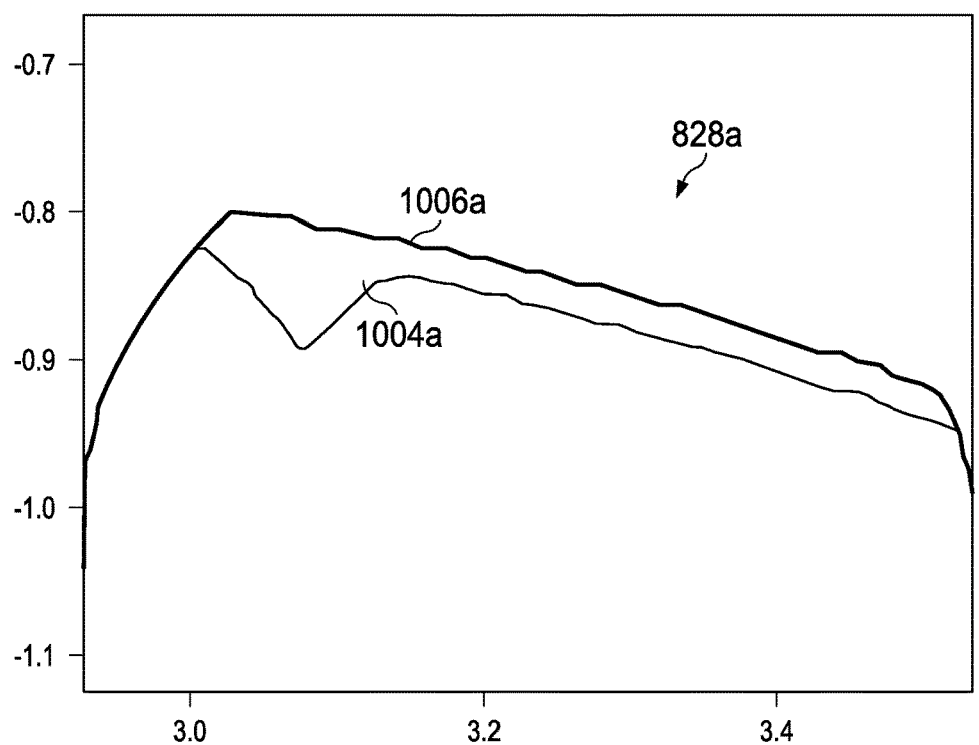
FIG. 10C illustrates an exploded graph of a worn primary cutting element disposed on the drill bit of FIG. 8D to better illustrate a primary cutting zone and a primary cutting edge, in accordance with some embodiments of the present disclosure.

The cutting edges of primary cutting element 628a may wear gradually with drilling distance. As a result the shape of cutting edges may be changed. The cutting edges of back-up cutting element 638b may also wear gradually with drilling distance and the shape of back-up cutting element 638b may also be changed. Therefore, both under-exposure $\delta_{640b}$ and angle ($\theta_{P640b} - \theta_{630a}$) between cutlet point 630a and control point $P_{640b}$ may be changed. Thus, the critical depth of cut for a drill bit may be a function of the wear of both primary and back-up cutting elements. At each drilling depth, a critical depth of cut for a drill bit may be estimated if wear of the cutting elements are known. An example of worn cutting edges of primary cutting element is illustrated in FIG. 10C and discussed in detail below.

Modifications, additions or omissions may be made to FIGS. 6A and 6B without departing from the scope of the present disclosure. For example, as discussed above, blades 626, cutting elements 628 and 638, DOCCs (not expressly shown) or any combination thereof may affect the critical depth of cut at one or more radial coordinates and the CDCCC may be determined accordingly. Further, the above description of the CDCCC calculation may be used to determine a CDCCC of any suitable drill bit.

Figure 7A:
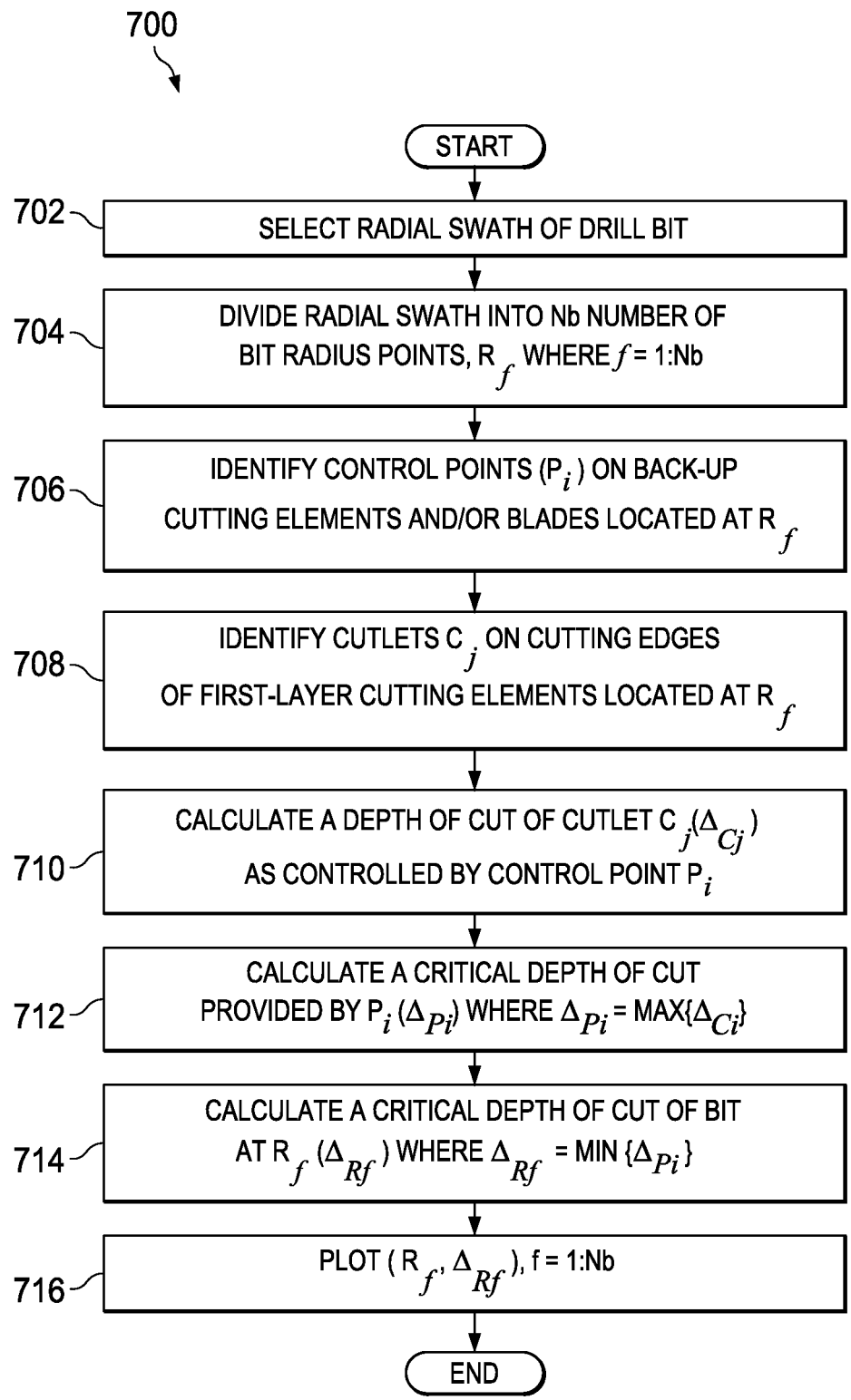
FIG. 7A illustrates a flow chart of an example method for determining and generating a CDCCC, in accordance with some embodiments of the present disclosure.

FIG. 7A illustrates a flow chart of an example method 700 for determining and generating a CDCCC in accordance with some embodiments of the present disclosure. The steps of method 700 may be performed at each specified drilling depth where cutter wear is measured or estimated. The steps of method 700 may be performed by various computer programs, models or any combination thereof, configured to simulate and design drilling systems, apparatuses and devices. The programs and models may include instructions stored on a computer readable medium and operable to perform, when executed, one or more of the steps described below. The computer readable media may include any system, apparatus or device configured to store and retrieve programs or instructions such as a hard disk drive, a compact disc, flash memory or any other suitable device. The programs and models may be configured to direct a processor or other suitable unit to retrieve and execute the instructions from the computer readable media. Collectively, the computer programs and models used to simulate and design drilling systems may be referred to as a "drilling engineering tool" or "engineering tool."

In the illustrated embodiment, the cutting structures of the drill bit, including at least the locations and orientations of all cutting elements and DOCCs, may have been previously designed. However in other embodiments, method 700 may include steps for designing the cutting structure of the drill bit. For illustrative purposes, method 700 is described with respect to drill bit 601 of FIGS. 6A and 6B; however, method 700 may be used to determine the CDCCC of any suitable drill bit including bits with worn cutting elements at any drilling depth.

Method 700 may start, and at step 702, the engineering tool may select a radial swath of drill bit 601 for analyzing the critical depth of cut within the selected radial swath. In some instances the selected radial swath may include the entire face of drill bit 601 and in other instances the selected radial swath may be a portion of the face of drill bit 601. For example, the engineering tool may select radial swath 608 as defined between radial coordinates $R_A$ and $R_B$ and may include back-up cutting element 638b, as shown in FIGS. 6A and 6B.

At step 704, the engineering tool may divide the selected radial swath (e.g., radial swath 608) into a number, Nb, of radial coordinates ($R_f$) such as radial coordinate $R_F$ described in FIGS. 6A and 6B. For example, radial swath 608 may be divided into nine radial coordinates such that Nb for radial swath 608 may be equal to nine. The variable "f" may represent a number from one to Nb for each radial coordinate within the radial swath. For example, "$R_1$" may represent the radial coordinate of the inside edge of a radial swath. Accordingly, for radial swath 608, "$R_1$" may be approximately equal to $R_A$. As a further example, "$R_{Nb}$" may represent the radial coordinate of the outside edge of a radial swath. Therefore, for radial swath 608, "$R_{Nb}$" may be approximately equal to $R_B$.

At step 706, the engineering tool may select a radial coordinate $R_f$ and may identify control points ($P_i$) at the selected radial coordinate $R_f$ and associated with a DOCC, a cutting element, and/or a blade. For example, the engineering tool may select radial coordinate $R_F$ and may identify control point $P_{640b}$ associated with back-up cutting element 638b and located at radial coordinate $R_F$, as described above with respect to FIGS. 6A and 6B.

At step 708, for the radial coordinate $R_f$ selected in step 706, the engineering tool may identify cutlet points ($C_j$) each located at the selected radial coordinate $R_f$ and associated with the cutting edges of cutting elements. For example, the engineering tool may identify cutlet point 630a located at radial coordinate $R_F$ and associated with the cutting edges of primary cutting element 628a as described and shown with respect to FIGS. 6A and 6B.

At step 710 the engineering tool may select a control point $P_i$ and may calculate a depth of cut for each cutlet point $C_j$ as controlled by the selected control point $P_i$ ($\Delta_{Cj}$). For example, the engineering tool may determine the depth of cut of cutlet point 630a as controlled by control point $P_{640b}$ ($\Delta_{630a}$) by using the following equations:

$$\Delta_{630a} = \delta_{640b} * 360/(360-(\theta_{P640b}-\theta_{630a})); \text{ and}$$

$$\delta_{640b} = Z_{630a} - Z_{P640b}.$$

At step 712, the engineering tool may calculate the critical depth of cut provided by the selected control point ($\Delta_{Pi}$) by determining the maximum value of the depths of cut of the cutlet points $C_j$ as controlled by the selected control point $P_i$ ($\Delta_{Cj}$) and calculated in step 710. This determination may be expressed by the following equation:

$$\Delta_{Pi} = \max\{\Delta_{Cj}\}.$$

For example, control point $P_{340a}$ may be selected in step 710 and the depths of cut for cutlet point 630a, 630c, and 630e (not expressly shown) as controlled by control point $P_{640b}$ ($\Delta_{630a}$, $\Delta_{630c}$, and $\Delta_{630e}$, respectively) may also be determined in step 710, as shown above. Accordingly, the critical depth of cut provided by control point $P_{640b}$ ($\Delta_{P640b}$) may be calculated at step 712 using the following equation:

$$\Delta_{P640b} = \max[\Delta_{630a}, \Delta_{630c}, \Delta_{630e}].$$

The engineering tool may repeat steps 710 and 712 for all of the control points $P_i$ identified in step 706 to determine the critical depth of cut provided by all control points $P_i$ located at radial coordinate $R_f$. For example, the engineering tool may perform steps 710 and 712 with respect to control points $P_{640c}$ and $P_{640e}$ (not expressly shown) to determine the critical depth of cut provided by control points $P_{640c}$ and $P_{640e}$ with respect to cutlet points 630a, 630c, and 630e (not expressly shown) at radial coordinate $R_f$ shown in FIGS. 6A and 6B.

At step 714, the engineering tool may calculate an overall critical depth of cut at the radial coordinate $R_f$ ($\Delta_{Rf}$) selected in step 706. The engineering tool may calculate the overall critical depth of cut at the selected radial coordinate $R_f$ ($\Delta_{Rf}$) by determining a minimum value of the critical depths of cut of control points $P_i$ ($\Delta_{Pi}$) determined in steps 710 and 712. This determination may be expressed by the following equation:

$$\Delta_{Rf} = \min\{\Delta_{Pi}\}.$$

For example, the engineering tool may determine the overall critical depth of cut at radial coordinate $R_F$ of FIGS. 6A and 6B by using the following equation:

$$\Delta_{RF} = \min[\Delta_{P640b}, \Delta_{P640c}, \Delta_{P640e}].$$

The engineering tool may repeat steps 706 through 714 to determine the overall critical depth of cut at all the radial coordinates $R_f$ generated at step 704.

At step 716, the engineering tool may plot the overall critical depth of cut ($\Delta_{Rf}$) for each radial coordinate $R_f$, as a function of each radial coordinate $R_f$. Accordingly, a CDCCC may be calculated and plotted for the radial swath associated with the radial coordinates $R_f$. For example, the engineering tool may plot the overall critical depth of cut for each radial coordinate $R_f$ located within radial swath 608, such that the CDCCC for swath 608 may be determined and plotted, as depicted in FIG. 5. Following step 716, method 700 may end. Accordingly, method 700 may be used to calculate and plot a CDCCC of a drill bit. The CDCCC may be used to determine whether the drill bit provides a substantially even control of the depth of cut of the drill bit. Therefore, the critical CDCCC may be used to modify the DOCCs, back-up cutting elements, and/or blades of the drill bit configured to control the depth of cut of the drill bit or configured to cut into the formation when primary cutting elements are sufficiently worn in order to maximize drilling efficiency and bit life.

Method 700 may be repeated at any specified drilling depth where cutting element wear may be estimated or measured. The minimum of the CDCCC at each specified drilling depth may represent the critical depth of cut of the drill bit. Additionally, modifications, additions, or omissions may be made to method 700 without departing from the scope of the present disclosure. For example, the order of the steps may be performed in a different manner than that described and some steps may be performed at the same time. Additionally, each individual step may include additional steps without departing from the scope of the present disclosure.

Figure 7B:
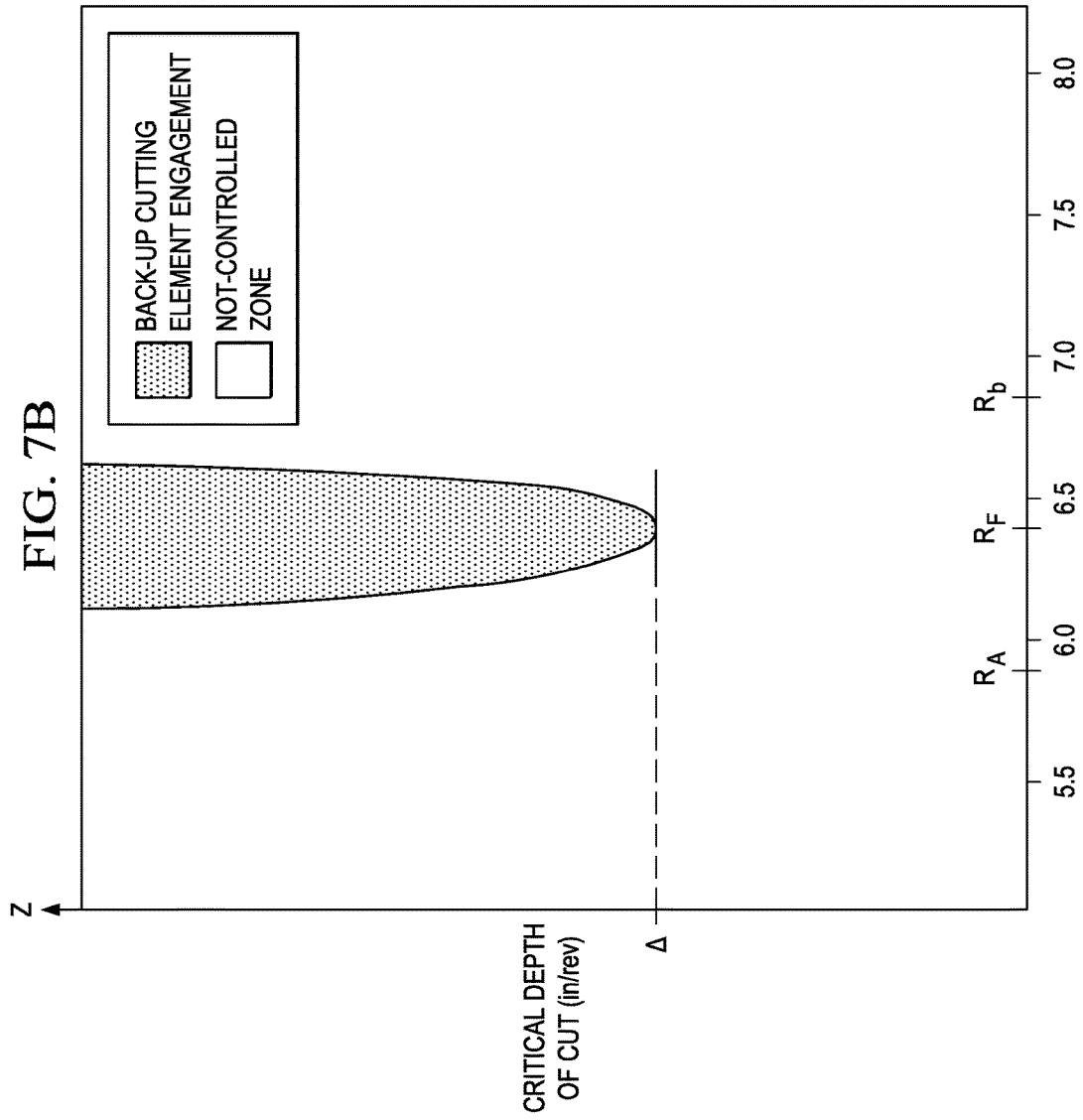
FIG. 7B illustrates a graph of a CDCCC where the critical depth of cut is plotted as a function of the bit radius of the drill bit of FIG. 6A, in accordance with some embodiments of the present disclosure.

Accordingly, FIG. 7B illustrates a graph of a CDCCC where the critical depth of cut is plotted as a function of the bit radius of drill bit 601 of FIG. 6A, in accordance with some embodiments of the present disclosure. As mentioned above, a CDCCC may be used to determine the minimum critical depth of cut control as provided by the back-up cutting elements and/or blades of a drill bit. For example, FIG. 7B illustrates a CDCCC for drill bit 601 between radial coordinates $R_A$ and $R_B$. The z-axis in FIG. 7B may represent the critical depth of cut along the rotational axis of drill bit 601, and the radial (R) axis may represent the radial distance from the rotational axis of drill bit 601. For example, at a given under-exposure $\delta_{640b}$ for back-up cutting element 638b and control points $P_{640b}$ of approximately 0.03 inches and a configuration shown in FIG. 6A (e.g., when back-up cutting elements 638b are one blade 626 in front of primary cutting elements 628a), the critical depth of cut $\Delta_{630a}$ is approximately 0.03246 in/rev.

The equation detailed above for critical depth of cut for primary cutting elements 628i with cutlet points 630i may be rewritten more generally as:

$$\Delta_{630i} = \delta_{640i} * 360/(360-(\theta_{P640i}-\theta_{630i})); \text{ and}$$

$$\delta_{640i} = Z_{630} - Z_{P640i}.$$

If the angular locations of cutlet points 630i ($\theta_{630i}$) are fixed, then critical depth of cut, $\Delta_{630i}$, becomes a function of two variables: under-exposure of back-up cutting elements at control points $P_{640i}$ ($\delta_{640i}$) and angular location of back-up cutting elements at control points $P_{640i}$ ($\theta_{P640i}$). Thus, the equation for critical depth of cut, $\Delta_{630i}$, may be rewritten as:

$$\Delta_{630i} = \delta_{640i} * f(\theta_{P640i}).$$

The first variable, under-exposure of back-up cutting elements at control point $P_{640i}$ ($\delta_{640i}$) may be determined by the wear depth of primary cutting elements 628. Thus, an estimate of the wear depth of primary cutting elements 628 may be determined as a function of drilling depth.

Additionally, the second variable, $f(\theta_{P640i})$ may be written as:

$$f(\theta_{P640i}) = 360/(360-(\theta_{P640i}-\theta_{630i})).$$

Further, ($\theta_{P640i}-\theta_{630i}$) may vary from approximately 10 to 350 degrees for most drill bits. Thus, $f(\theta_{P640i})$ may vary from approximately 1.0286 to approximately 36. The above analysis illustrates that $f(\theta_{P640i})$ may act as an amplifier to critical depth of cut $\Delta_{630i}$. Therefore, for a given under-exposure $\delta_{640i}$, it may be possible to choose an angular location to meet a required critical depth of cut $\Delta_{630i}$.

Accordingly, FIGS. 8A-8F illustrate schematic drawing of bit faces of a drill bit with exemplary placements for back-up cutting elements 838, in accordance with some embodiments of the present disclosure. For purposes of this disclosure, blades 826 may also be numbered 1-n based on the blade configuration. For example, FIGS. 8A-8F depict seven-bladed drill bits 801a-801f and blades 826 may be numbered 1-7. However, drill bit 801a-801f may include more or fewer blades than shown in FIGS. 8A-8F without departing from the scope of the present disclosure.

Figure 8A:
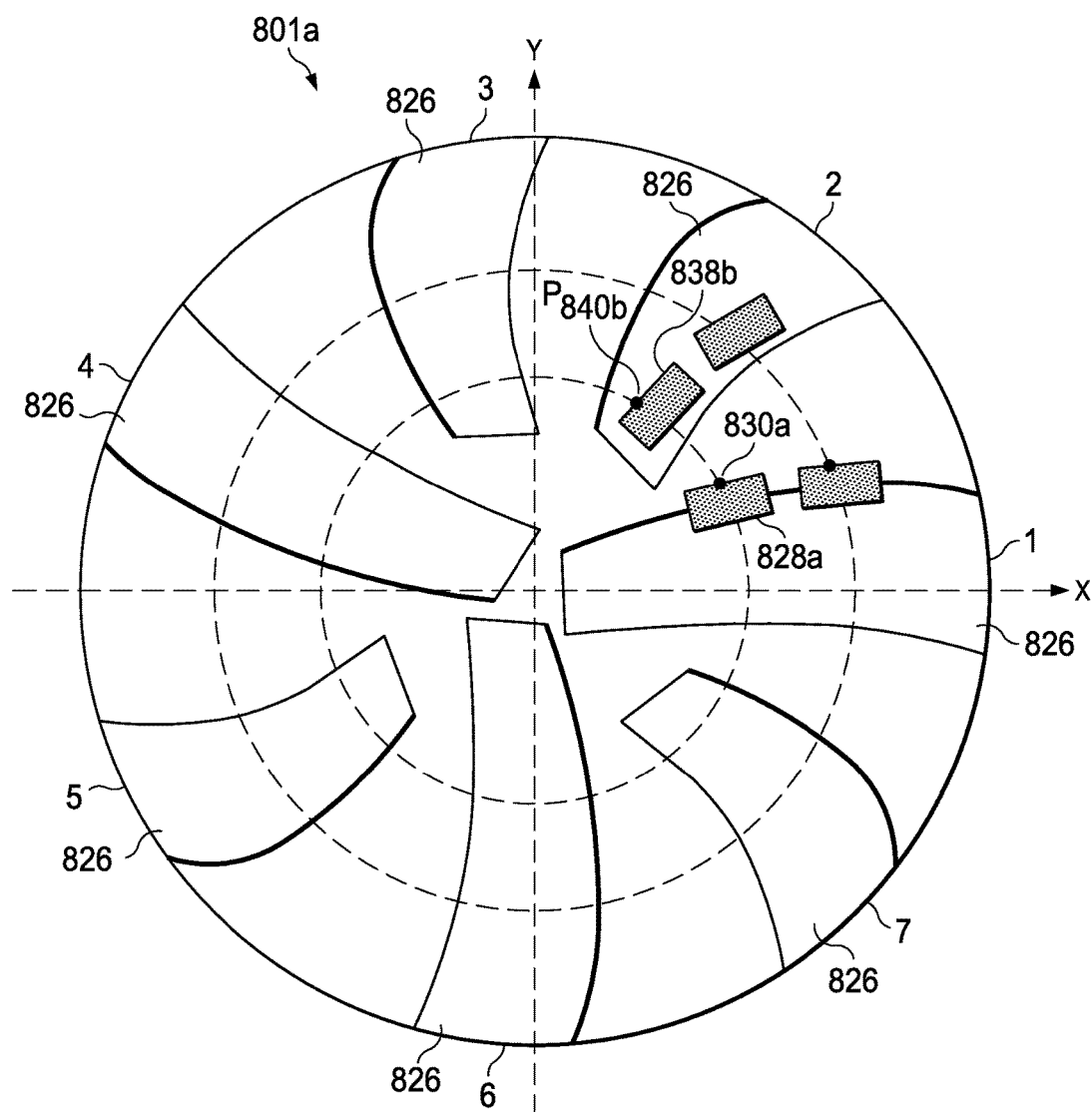
FIGS. 8A-8F illustrate schematic drawings of bit faces of a drill bit with exemplary placements for back-up cutting elements, in accordance with some embodiments of the present disclosure.
Figure 8B:
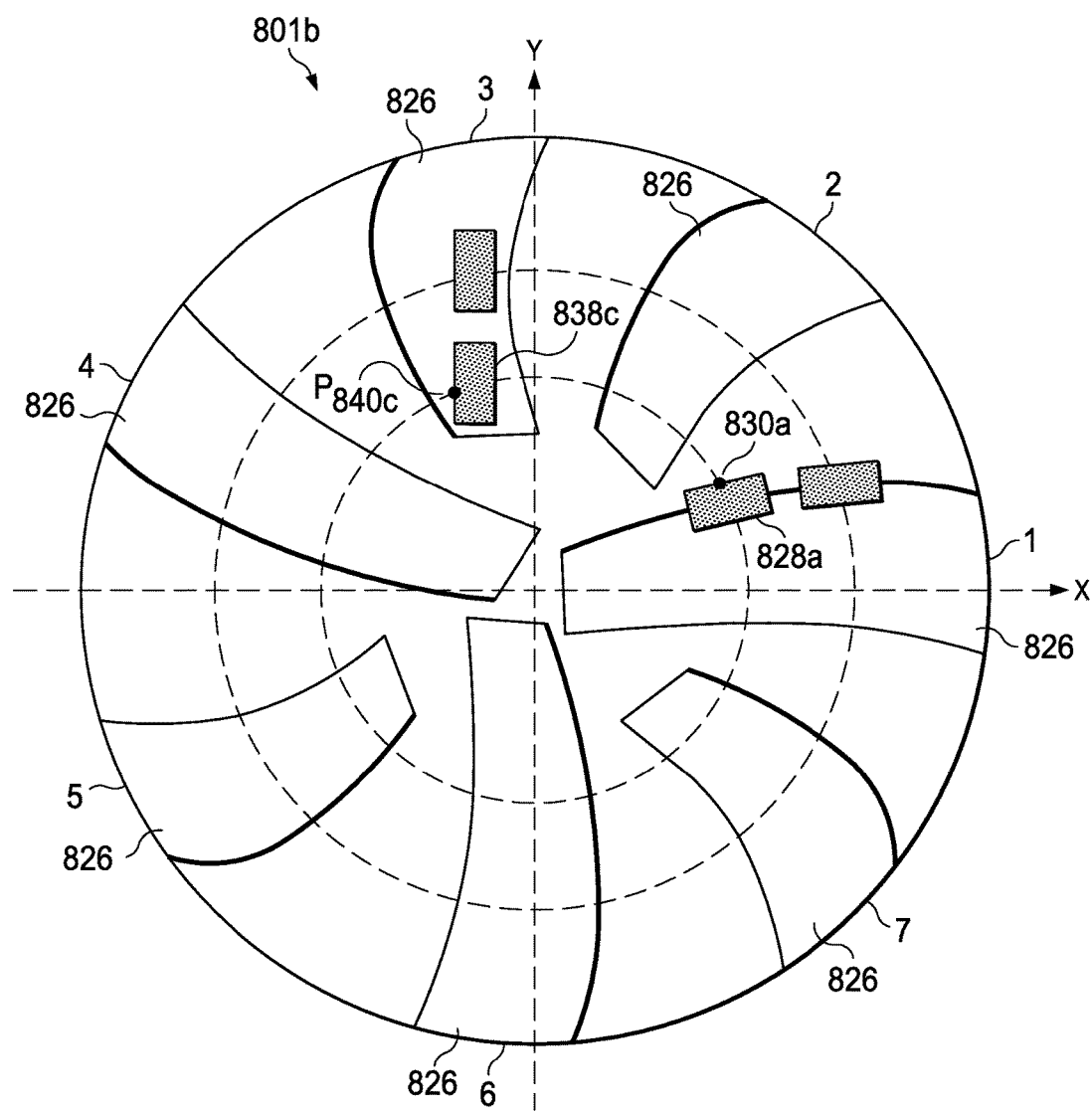
Figure 8C:
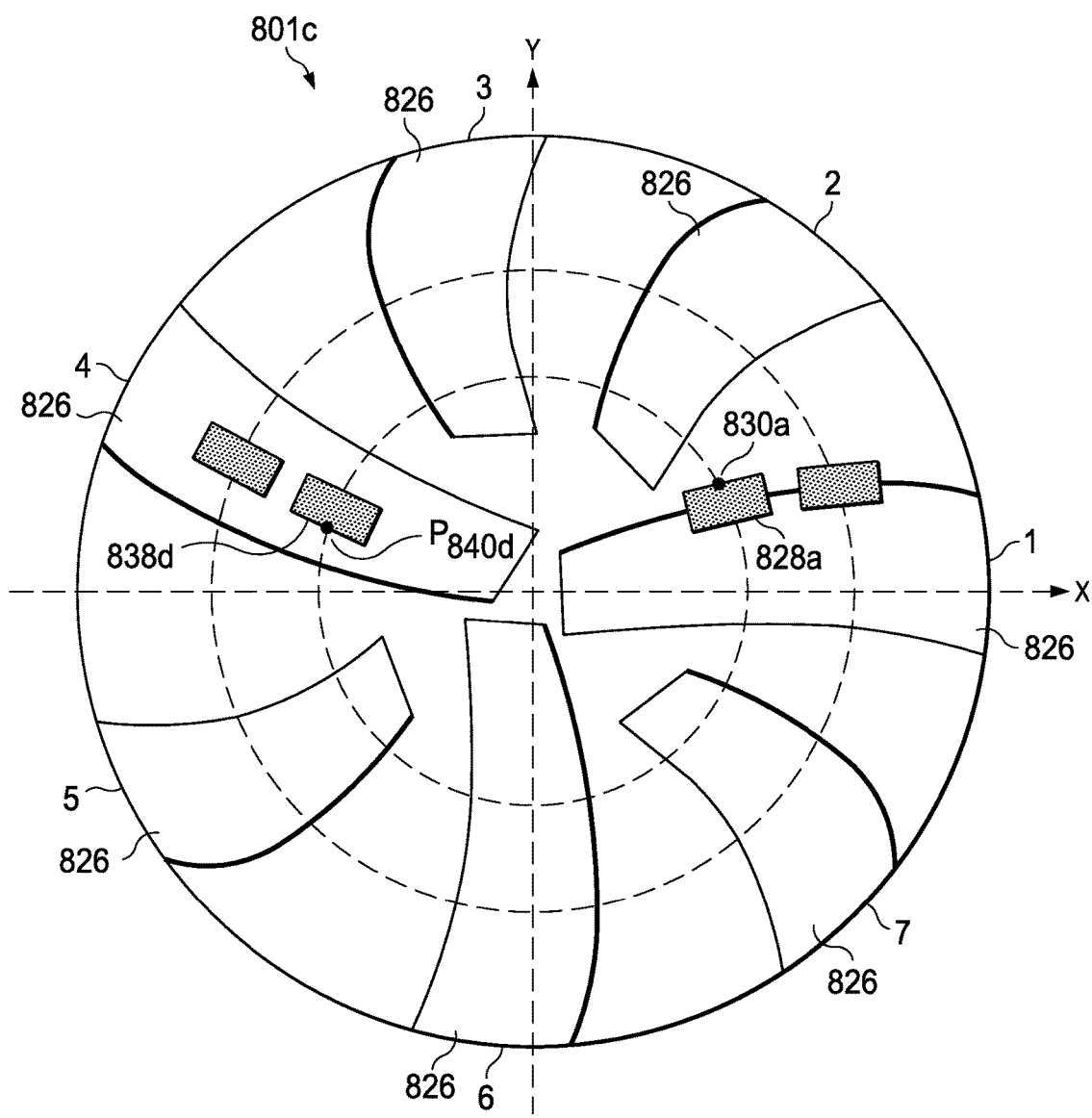
Figure 8D:
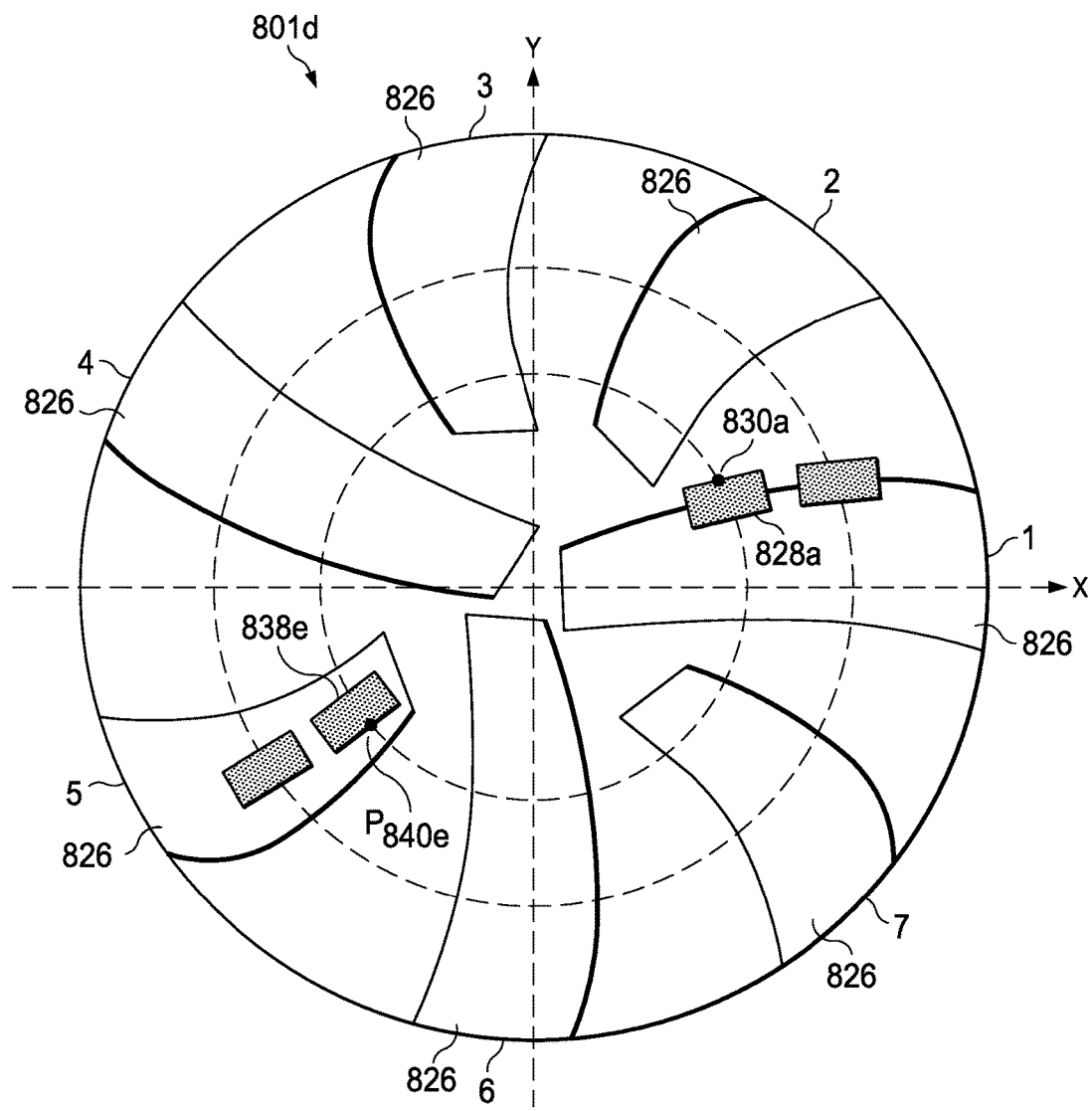
Figure 8E:
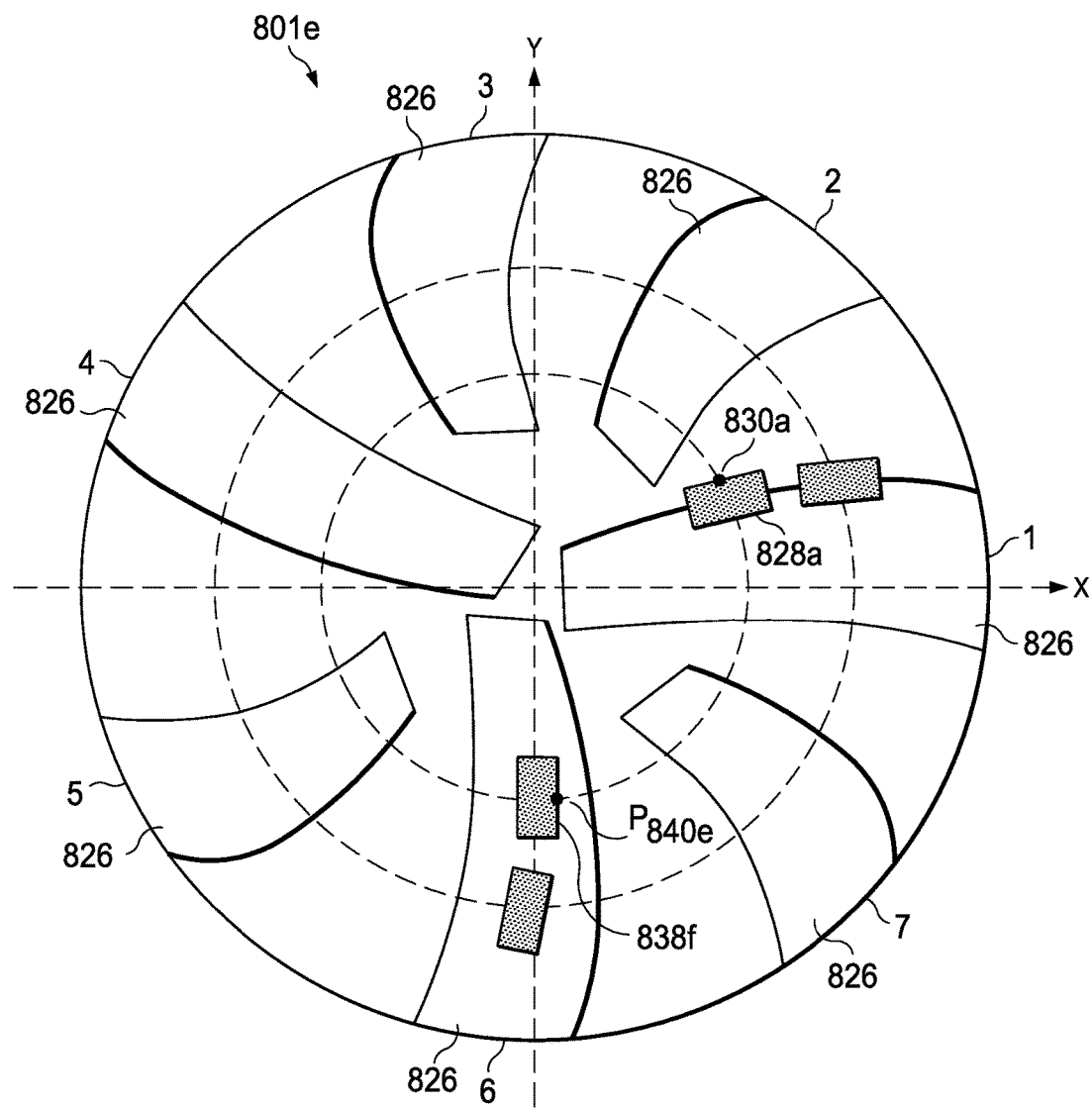
Figure 8F:
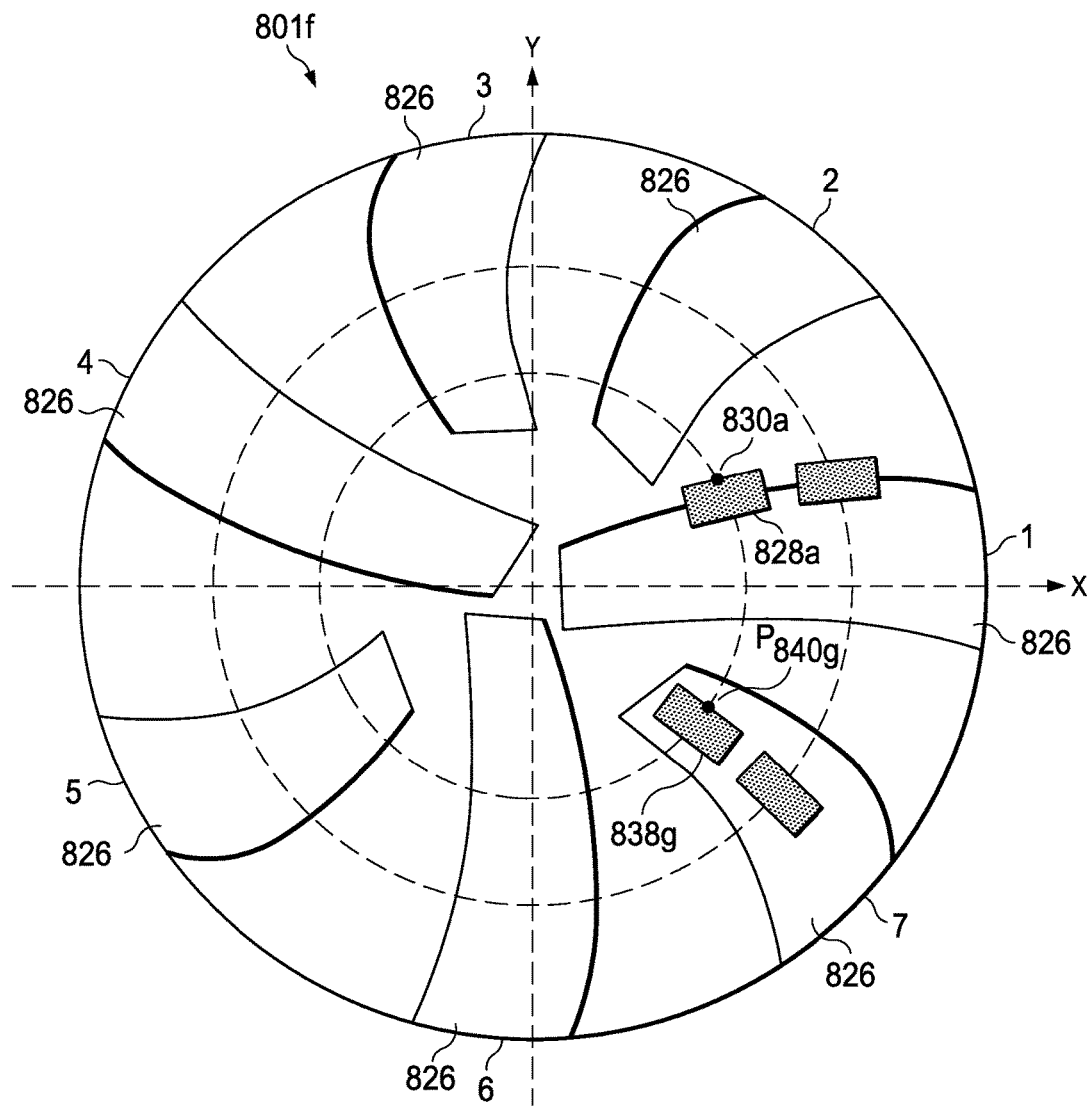

For a seven-bladed drill bit, there may be six possible blades 826 for placement of back-up cutting elements 838 in accordance with some embodiments of the present disclosure. In FIGS. 8A-8F, primary cutting elements 828a with cutlet points 830a may be located on blade 1. FIG. 8A illustrates back-up cutting elements 838b and control point $P_{840b}$ located on blade 2 of drill bit 801a. FIG. 8B illustrates back-up cutting elements 838c and control point $P_{840c}$ located on blade 3 of drill bit 801b. FIG. 8C illustrates back-up cutting elements 838d and control point $P_{840d}$ located on blade 4 of drill bit 801c. FIG. 8D illustrates back-up cutting elements 838e and control point $P_{840e}$ located on blade 5 of drill bit 801d. FIG. 8E illustrates back-up cutting elements 838f and control point $P_{840f}$ located on blade 6 of drill bit 801e. FIG. 8F illustrates back-up cutting elements 838g and control point $P_{840g}$ located on blade 7 of drill bit 801f.

For each of the angular locations of back-up cutting elements 838 shown in FIGS. 8A-8F and a given under-exposure $\delta_{840i}$, critical depth of cut $\Delta_{830i}$ may be calculated using method 700 shown in FIG. 7A or any other suitable method.

FIG. 9 illustrates bar graph 900 showing critical depth of cut $\Delta_{830i}$ as a function of blade 826 location for back-up cutting elements 838 disposed on a drill bit, in accordance with some embodiments of the present disclosure. For example, at a given under-exposure $\delta_{840b}$ of approximately 0.03 inches and drill bit 801a illustrated in FIG. 8A (e.g., back-up cutting elements 838b located on blade 2 directly in front of primary cutting elements 828a located on blade 1), the critical depth of cut $\Delta_{830b}$ may be approximately 0.03246 in/rev. As another example, at a given under-exposure $\delta_{840c}$ of approximately 0.03 inches and drill bit 801b of FIG. 8B (e.g., back-up cutting elements 838c located on blade 3 and primary cutting elements 828a located on blade 1), the critical depth of cut $\Delta_{830d}$ may be approximately 0.04 in/rev. Likewise, at a given under-exposure $\delta_{840d}$ of approximately 0.03 inches and drill bit 801c of FIG. 8C (e.g., back-up cutting elements 838d located on blade 4 and primary cutting elements 828a located on blade 1), the critical depth of cut $\Delta_{830d}$ may be approximately 0.05 in/rev. At a given under-exposure $\delta_{840e}$ of approximately 0.03 inches, drill bit 801d of FIG. 8D (e.g., back-up cutting elements 838e located on blade 5 and primary cutting elements 828a located on blade 1), the critical depth of cut $\Delta_{830e}$ may be approximately 0.065 in/rev. Additionally, at a given under-exposure $\delta_{840f}$ of approximately 0.03 inches, drill bit 801e of FIG. 8E (e.g., back-up cutting elements 838f located on blade 6 and primary cutting elements 828a located on blade 1), the critical depth of cut $\Delta_{830e}$ may be approximately 0.085 in/rev. At a given under-exposure $\delta_{840g}$ of approximately 0.03 inches, drill bit 801f of FIG. 8F (e.g., back-up cutting elements 838g located on blade 7 and primary cutting elements 828a located on blade 1), the critical depth of cut $\Delta_{830g}$ may be approximately 0.2 in/rev.

FIG. 9 illustrates that at a given under-exposure $\delta_{840i}$ (e.g., approximately 0.03 inches) as the angle between back-up cutting elements 838 and primary cutting elements 828 (e.g., $\theta_{P840i}$-$\theta_{830i}$) increases in the direction of rotation, the critical depth of cut may also increase. Thus, the angular location of back-up cutting elements 838 may determine when back-up cutting elements 838 may cut into the formation. For example, the configuration for drill bit 801f of FIG. 8F may not ever cut into the formation when the depth of cut is below approximately 0.2 in/rev. Whereas, in the configuration for drill bit 801a of FIG. 8A, back-up cutting elements 838b may cut into the formation when depth of cut is over approximately 0.03246 in/rev. Thus, for a given target critical depth of cut—based on formation strength and other factors as discussed below—drill bit 801 may be configured to approximate the target by varying the angular location of back-up cutting elements 838.

FIG. 10A illustrates graph 1000 of designed depth of cut and actual depth of cut as a function of drilling depth for drill bit 801d of FIG. 8D, in accordance with some embodiments of the present disclosure. Designed depth of cut as a function of drilling depth may be shown by plot 1010 and actual depth of cut as a function of drilling depth may be shown by plot 1020. A comparison of designed and actual depth of cut may identify when back-up cutting elements may engage the formation. For example, designed depth of cut, plot 1010, begins at approximately 0.24 in/rev. Designed depth of cut, plot 1010, may reflect the estimated cutting element wear of a primary cutting element as discussed with respect to FIG. 5. Likewise, actual depth of cut, plot 1020, may be generated based on field measurements in accordance with FIGS. 4A and 4B.

As mentioned previously, drill bit 801d as illustrated in FIG. 8D may have primary cutting elements 828a on blade 1 and back-up cutting elements 838e on blade 5 at approximately 180 degrees angular distance from primary cutting elements 828a. In the illustrated embodiment, the under-exposure of back-up cutting elements 838e relative to primary cutting elements 828a may be approximately 0.11 inches. In other embodiments, the back-up cutting elements may be under-exposed by any suitable amount such that primary cutting elements cut into the formation from the surface to a first drilling depth ($D_A$) and back-up cutting elements act as depth of cut controllers for the primary cutting elements; the back-up cutting elements begin to partially cut into the formation from $D_A$ to a second drilling depth ($D_B$) as the primary cutting elements become worn; and the back-up cutting elements act as primary cutting elements or major cutting elements at drilling distance greater than $D_B$ when the primary cutting elements are sufficiently worn. An analysis of FIG. 10A indicates that back-up cutting elements 838e may begin to partially cut into the formation at drilling depth $D_A$ of approximately 5,800 feet. Further, back-up cutting elements 838e may begin to fully cut into the formation at drilling depth $D_B$ of approximately 7,100 feet. Thus, at drilling depth $D_B$ back-up cutting elements may begin to act as primary cutting elements or major cutting elements such that the bit life of drill bit 801d may be extended beyond approximately 8,600 feet.

FIG. 10B illustrates a schematic drawing for a bit face profile of drill bit 801d of FIG. 8D, in accordance with some embodiments of the present disclosure. FIG. 10B illustrates primary cutting elements 828a disposed along blade 826 and the respective cutting zones 1004a and 1004b corresponding to primary cutting edge 1006a and 1006b. Back-up cutting elements 838e (not expressly shown) may have back-up cutting edge 1016 (not expressly shown) located within back-up cutting zone 1014 (not expressly shown). From FIG. 10B it can be seen that the cutting zones 1004a and 1004b of each primary cutting element 828a may be based on the axial and radial locations of the primary cutting element 828a on blade 826.

FIG. 10C illustrates an exploded graph of primary cutting element 828a disposed on drill bit 801d of FIG. 8D to better illustrate primary cutting zone 1004a and primary cutting edge 1006a, in accordance with some embodiments of the present disclosure. Primary cutting edge 1006a may be the edge of the cutting surface of primary cutting element 828a that is located within primary cutting zone 1004a. Primary cutting element 828a may have a worn primary cutting edge 1006a. The location and size of primary cutting zone 1004a and primary cutting edge 1006a may depend on factors including ROP and RPM of drill bit 801d, the size of primary cutting elements 828a, and the location and orientation of primary cutting elements 828a along the blade profile of blade 826, and accordingly the bit face profile of drill bit 801d.

Figure 10D:
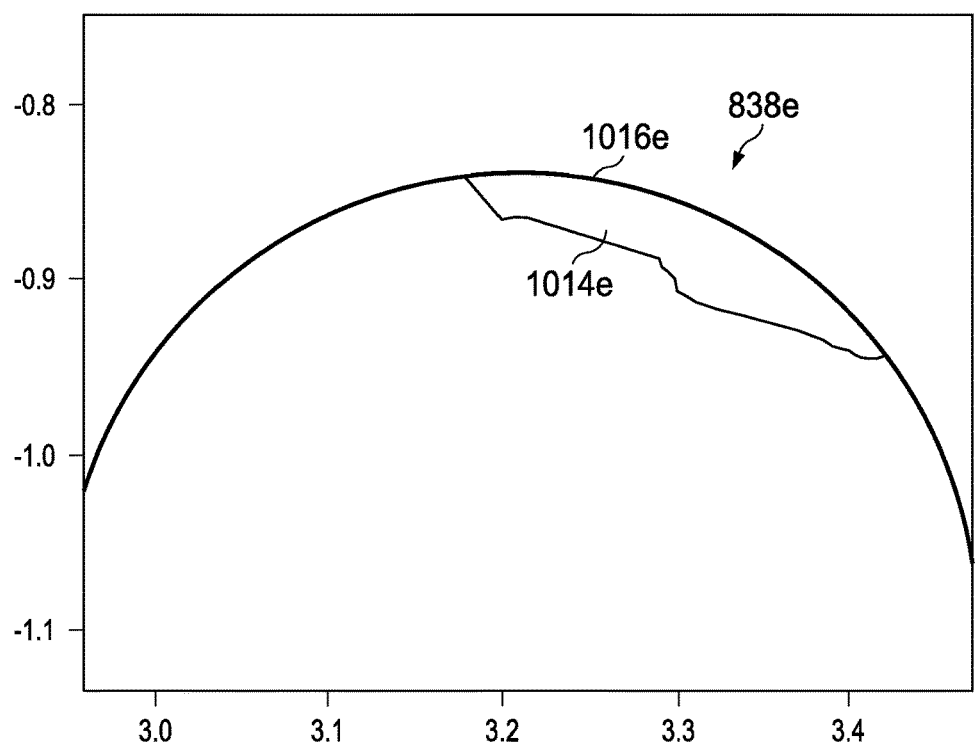
FIG. 10D illustrates an exploded graph of a back-up cutting element disposed on the drill bit of FIG. 8D to better illustrate a back-up cutting zone and a back-up cutting edge, in accordance with some embodiments of the present disclosure.

FIG. 10D illustrates an exploded graph of back-up cutting element 838e disposed on drill bit 801d of FIG. 8D to better illustrate back-up cutting zone 1014e and back-up cutting edge 1016e, in accordance with some embodiments of the present disclosure. Back-up cutting edge 1016e may be the edge of the cutting surface of back-up cutting element 838e that is located within back-up cutting zone 1014e. The location and size of back-up cutting zone 1014e and back-up cutting edge 1016e may depend on factors including ROP and RPM of drill bit 801d, the size of back-up cutting element 838e, and the location and orientation of back-up cutting elements 838e along the blade profile of blade 826, and accordingly the bit face profile of drill bit 801d.

An analysis of FIGS. 10C and 10D indicate that after primary cutting elements 828a wear approximately 0.1 inches at drilling depth of approximately 7,500 feet, back-up cutting elements 838e may cut into the formation approximately as well as primary cutting elements 828a. At this time, the area of cutting zone of back-up cutting element 838e may be similar to the area of cutting zone of primary cutting element 828a such that the back-up cutting element 838e with the back-up cutting edge 1016e may act as a primary cutting element. Back-up cutting elements 838e in this configuration may extend bit life.

Figure 11A:
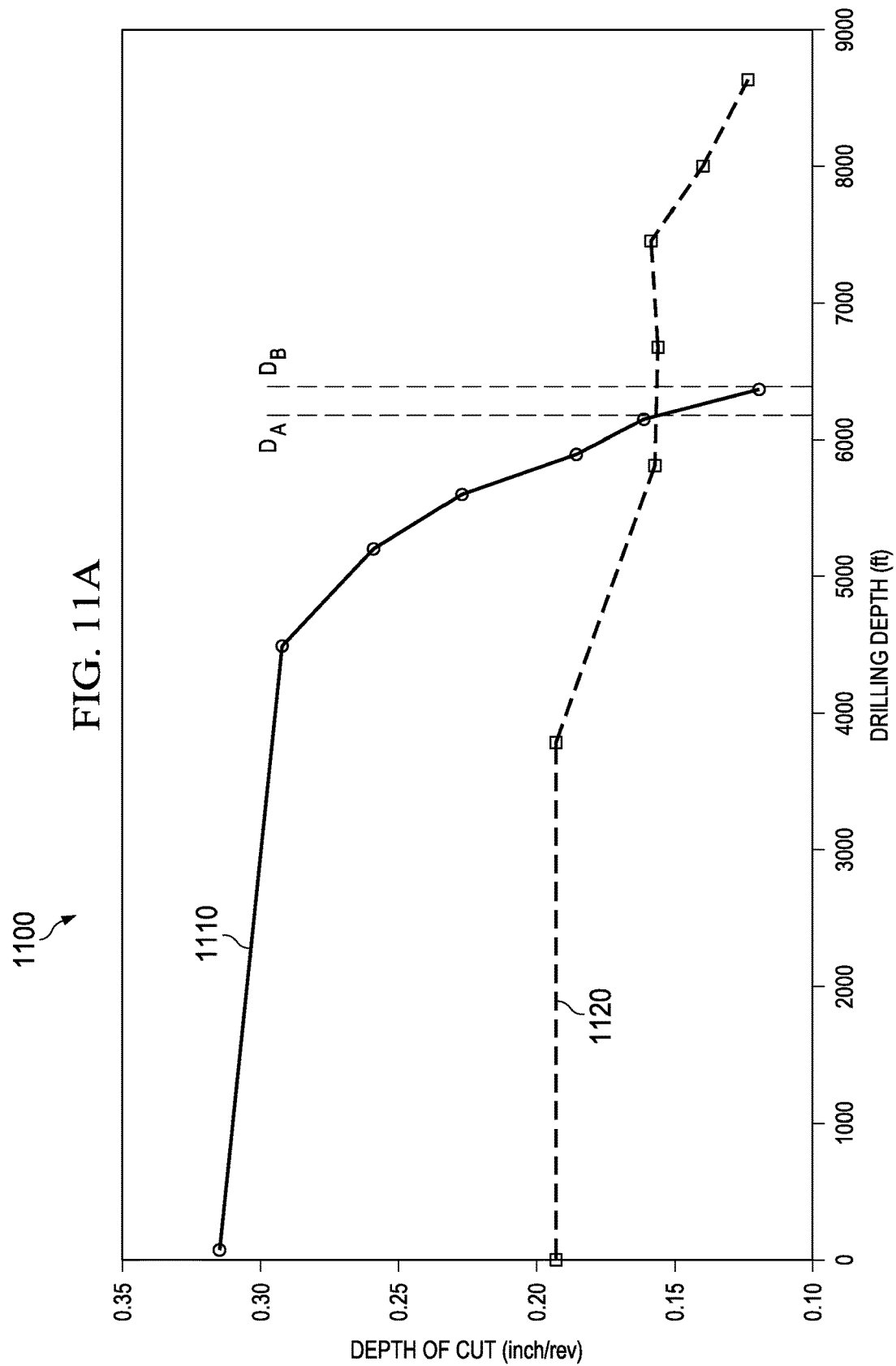
FIG. 11A illustrates a graph of designed depth of cut and actual depth of cut as a function of drilling depth of the drill bit of FIG. 8F, in accordance with some embodiments of the present disclosure.

FIG. 11A illustrates graph 1100 of designed depth of cut and actual depth of cut as a function of drilling depth of drill bit 801f of FIG. 8F, in accordance with some embodiments of the present disclosure. Designed depth of cut as a function of drilling depth may be shown by plot 1110 and actual depth of cut as a function of drilling depth may be shown by plot 1120. A comparison of designed and actual depth of cut may identify when back-up cutting elements may engage the formation. For example, in the illustrated embodiment, designed depth of cut begins at approximately 0.31 in/rev. Designed depth of cut, plot 1110, may reflect the estimated cutting element wear depth of a primary cutting element as discussed with respect to FIG. 5. Likewise, actual depth of cut, plot 1120, may be generated based on field measurements in accordance with FIGS. 4A and 4B.

As mentioned previously, drill bit 801f as illustrated in FIG. 8F may have primary cutting elements 828a on blade 1 and back-up cutting elements 838g on blade 7 at approximately 310 degrees angular distance from primary cutting elements 828a. In the illustrated embodiment, under-exposure of back-up cutting elements 838g relative to primary cutting elements 828a may be approximately 0.06 inches. In other embodiments, the back-up cutting elements may be under-exposed by any suitable amount such that primary cutting elements cut into the formation from the surface to a first drilling depth ($D_A$) and back-up cutting elements act as depth of cut controllers for the primary cutting elements; the back-up cutting elements begin to partially cut into the formation from $D_A$ to a second drilling depth ($D_B$) as the primary cutting elements become worn; and the back-up cutting elements act as primary cutting elements or major cutting elements at drilling distance greater than $D_B$ when the primary cutting elements are sufficiently worn. An analysis of FIG. 11A indicates that back-up cutting elements 838g may begin to partially cut into the formation at drilling depth $D_A$ of approximately 6,200 feet. Further, back-up cutting elements 838g may begin to fully cut into the formation at drilling depth $D_B$ of approximately 6,400 feet. Thus, at drilling depth $D_B$, back-up cutting elements may begin to act as primary cutting elements or major cutting elements. Initially, it may appear that bit life of drill bit 801f may be extended beyond approximately 8,600 feet.

Figure 11B:
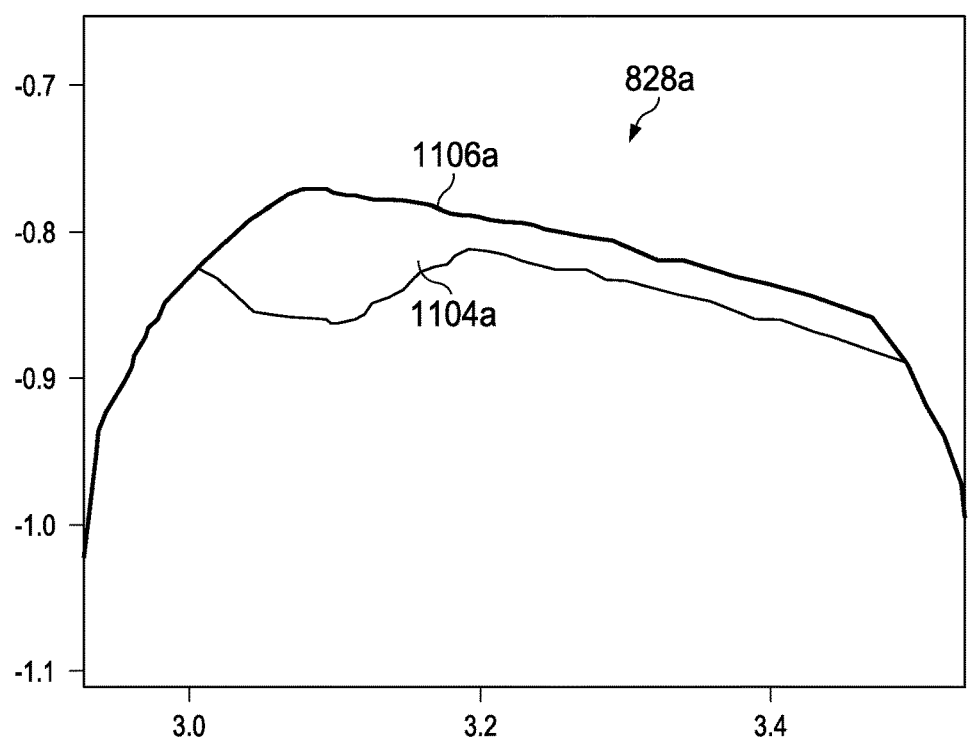
FIG. 11B illustrates an exploded graph of a worn primary cutting element disposed on the drill bit of FIG. 8F to better illustrate a primary cutting zone and a primary cutting edge, in accordance with some embodiments of the present disclosure.

FIG. 11B illustrates an exploded graph of primary cutting element 828a disposed on drill bit 801f of FIG. 8F to better illustrate primary cutting zone 1104a and primary cutting edge 1106a, in accordance with some embodiments of the present disclosure. Primary cutting edge 1106a may be the edge of the cutting surface of primary cutting element 828a that is located within primary cutting zone 1104a. Primary cutting element 828a may have a worn primary cutting edge 1006a. The location and size of primary cutting zone 1104a and primary cutting edge 1106a may depend on factors including ROP and RPM of drill bit 801f, the size of primary cutting elements 828a, and the location and orientation of primary cutting elements 828a along the blade profile of blade 826, and accordingly the bit face profile of drill bit 801f.

Figure 11C:
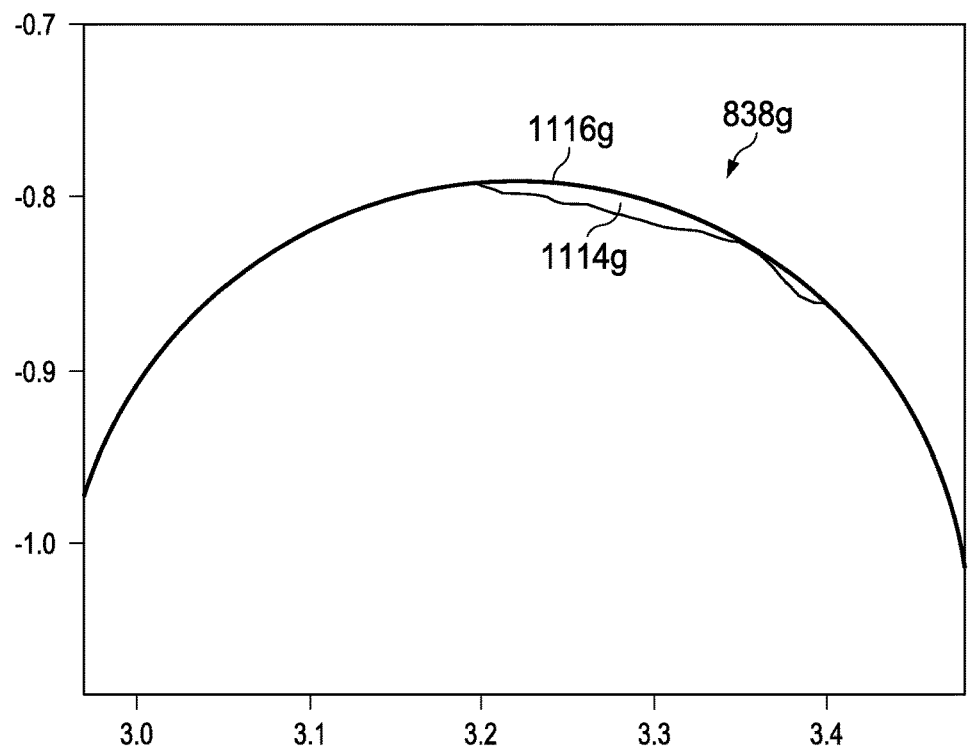
FIG. 11C illustrates an exploded graph of a back-up cutting element disposed on the drill bit of FIG. 8F to better illustrate a back-up cutting zone and a back-up cutting edge, in accordance with some embodiments of the present disclosure.

FIG. 11C illustrates an exploded graph of back-up cutting element 838g disposed on drill bit 801f of FIG. 8F to better illustrate back-up cutting zone 1114g and back-up cutting edge 1116g, in accordance with some embodiments of the present disclosure. Back-up cutting edge 1116g may be the edge of the cutting surface of back-up cutting element 838g that is located within back-up cutting zone 1014g. The location and size of back-up cutting zone 1014g and back-up cutting edge 1016g may depend on factors including the ROP and RPM of the bit, the size of back-up cutting element 838g, and the location and orientation of back-up cutting elements 838g along the blade profile of blade 826, and accordingly the bit face profile of the drill bit.

An analysis of FIGS. 11B and 11C indicate that after primary cutting elements 828a wear approximately 0.06 inches at drilling depth of approximately 6,200 feet, back-up cutting elements 838g may cut into the formation. However, back-up cutting elements 838g may cut into the formation much less than primary cutting elements 828a. Back-up cutting elements in this configuration may not extend bit life significantly.

FIG. 12A illustrates graph 1200 of designed depth of cut and actual depth of cut as a function of drilling depth of drill bit 801e of FIG. 8E, in accordance with some embodiments of the present disclosure. Designed depth of cut as a function of drilling depth may be shown by plot 1210 and actual depth of cut as a function of drilling depth may be shown by plot 1220. A comparison of designed and actual depth of cut may identify when back-up cutting elements may engage the formation. For example, designed depth of cut, plot 1210, begins at approximately 0.25 in/rev. Designed depth of cut, plot 1210, may reflect the estimated cutting element wear depth of a primary cutting element as discussed with respect to FIG. 5. Likewise, actual depth of cut, plot 1220, may be generated based on field measurements in accordance with FIGS. 4A and 4B.

As mentioned previously, drill bit 801e as illustrated in FIG. 8E may have primary cutting elements 828a on blade 1 and back-up cutting elements 838f on blade 6 at approximately 260 degrees angular distance from primary cutting elements 828a. In the illustrated embodiment, under-exposure of back-up cutting elements 838f relative to primary cutting elements 828a may be approximately 0.08 inches. In other embodiments, the back-up cutting elements may be under-exposed by any suitable amount such that primary cutting elements cut into the formation from the surface to a first drilling depth ($D_A$) and back-up cutting elements act as depth of cut controllers for the primary cutting elements; the back-up cutting elements begin to partially cut into the formation from $D_A$ to a second drilling depth ($D_B$) as the primary cutting elements become worn; and the back-up cutting elements act as primary cutting elements or major cutting elements at drilling distance greater than $D_B$ when the primary cutting elements are sufficiently worn. An analysis of FIG. 12A indicates that back-up cutting elements 838f may begin to cut into the formation at drilling depth $D_A$ of approximately 5,900 feet. Further, back-up cutting elements 838f may begin to fully cut into the formation at drilling depth $D_B$ of approximately 6,800 feet. Thus, at drilling depth $D_B$, back-up cutting elements may begin to act as primary cutting elements or major cutting elements. Bit life of drill bit 801e may be extended beyond approximately 8,600 feet.

Figure 12B:
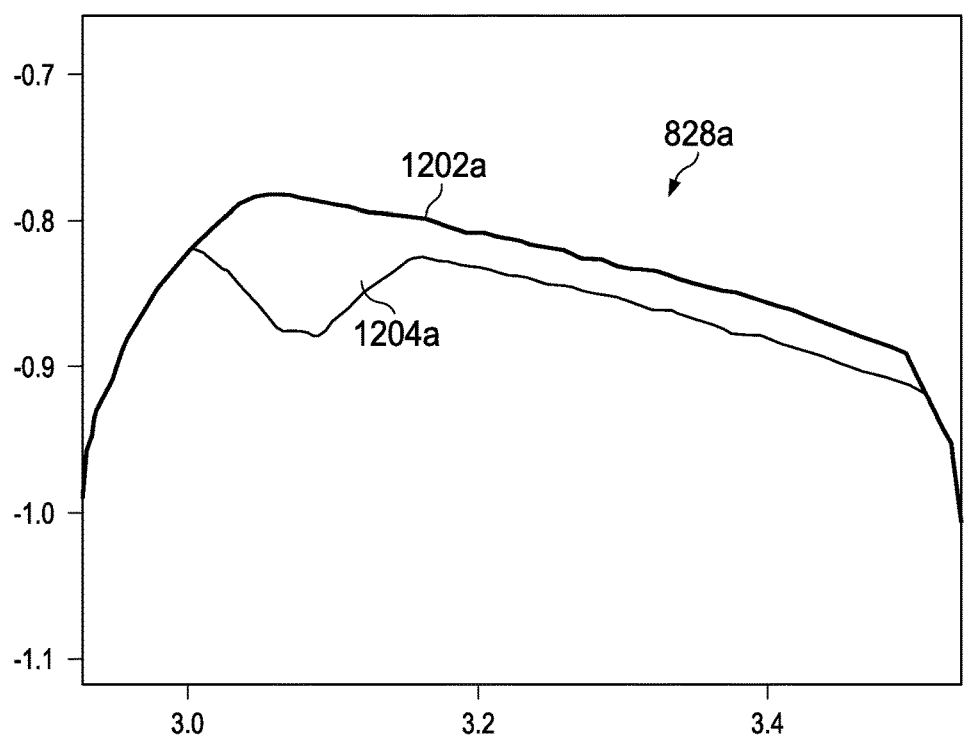
FIG. 12B illustrates an exploded graph of a worn primary cutting element disposed on the drill bit of FIG. 8E to better illustrate a primary cutting zone and a primary cutting edge, in accordance with some embodiments of the present disclosure.

FIG. 12B illustrates an exploded graph of primary cutting element 828a disposed on drill bit 801e of FIG. 8E to better illustrate primary cutting zone 1204a and primary cutting edge 1206a, in accordance with some embodiments of the present disclosure. Primary cutting edge 1206a may be the edge of the cutting surface of primary cutting element 828a that is located within primary cutting zone 1204a. Primary cutting element 828a may have a worn primary cutting edge 1006a. The location and size of primary cutting zone 1204a and primary cutting edge 1206a may depend on factors including ROP and RPM of drill bit 801e, the size of primary cutting elements 828a, and the location and orientation of primary cutting elements 828a along the blade profile of blade 826, and accordingly the bit face profile of drill bit 801e.

Figure 12C:
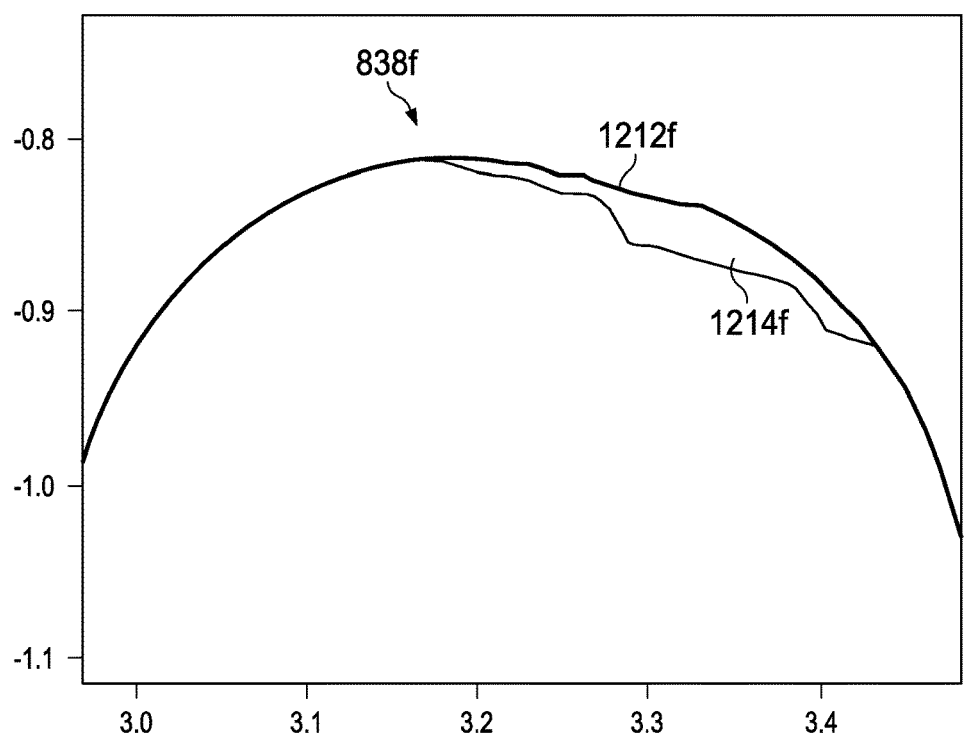
FIG. 12C illustrates an exploded graph of a back-up cutting element disposed on the drill bit of FIG. 8E to better illustrate a back-up cutting zone and a back-up cutting edge, in accordance with some embodiments of the present disclosure.

FIG. 12C illustrates an exploded graph of back-up cutting element 838f disposed on drill bit 801e of FIG. 8E to better illustrate back-up cutting zone 1214f and back-up cutting edge 1216f, in accordance with some embodiments of the present disclosure. Back-up cutting edge 1216f may be the edge of the cutting surface of back-up cutting element 838f that is located within back-up cutting zone 1214f. The location and size of back-up cutting zone 1214f and back-up cutting edge 1216f may depend on factors including ROP and RPM of drill bit 801e, the size of back-up cutting element 838f, and the location and orientation of back-up cutting elements 838f along the blade profile of blade 826, and accordingly the bit face profile of drill bit 801e.

An analysis of FIGS. 12B and 12C indicate that after primary cutting elements 828a wear approximately 0.08 inches at approximate drilling depth of 7,100 feet, back-up cutting elements 838f may cut into the formation similar to primary cutting elements 828a. Back-up cutting elements in this configuration may extend bit life significantly.

A comparison of FIGS. 10A, 11A and 12A may indicate that back-up cutting elements configured according to FIG. 8D may extend bit life and improve drilling efficiency after primary cutting elements are worn sufficiently. Back-up cutting elements in other configurations shown in FIGS. 8A, 8B and 8C may be have similar characteristics.

Figure 13A:
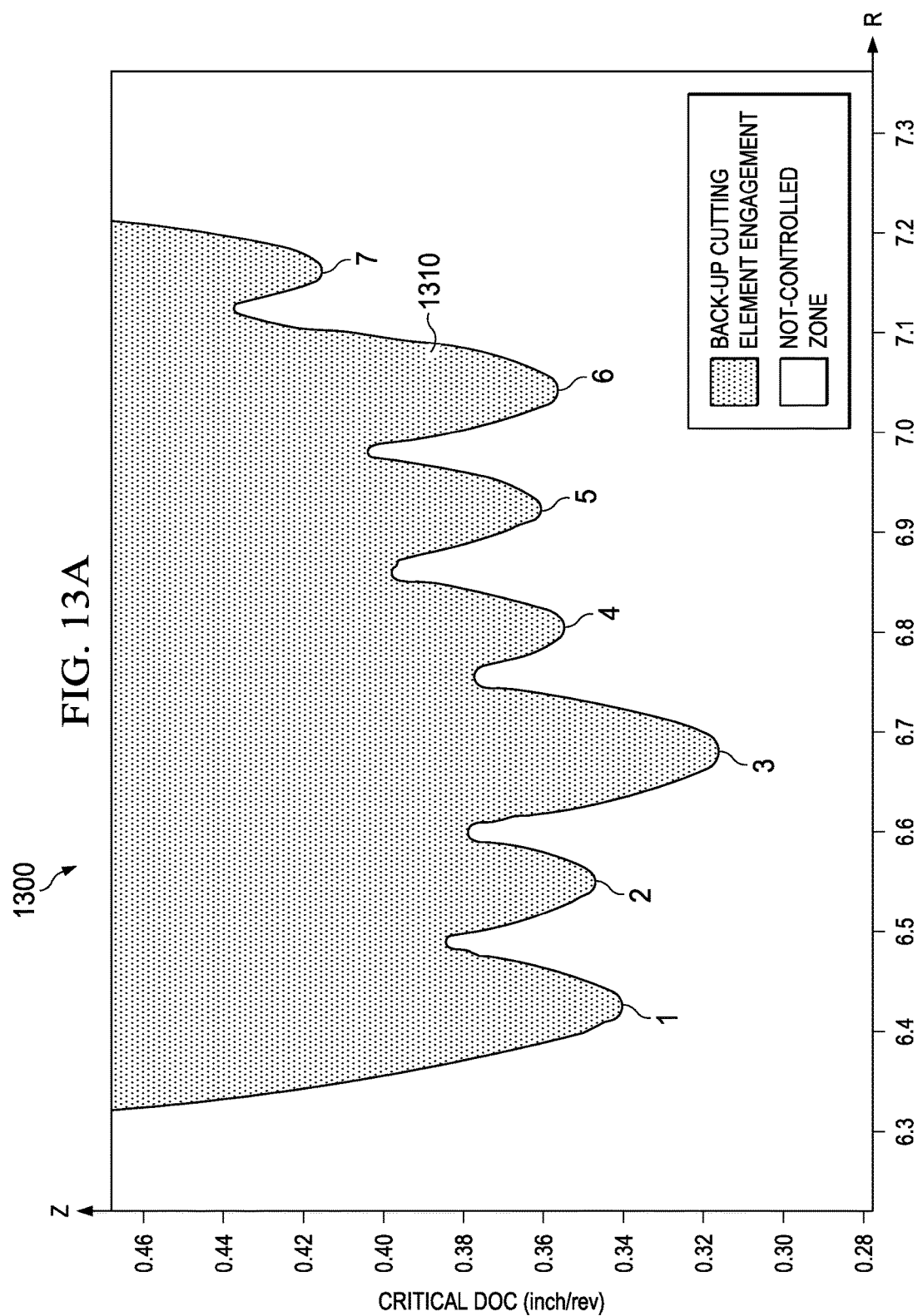
FIG. 13A illustrates a graph of a CDCCC where the critical depth of cut is plotted as a function of the bit radius for a bit where all back-up cutting element have approximately the same under-exposure, in accordance with some embodiments of the present disclosure.

FIG. 13A illustrates graph 1300 of CDCCC 1310 where the critical depth of cut is plotted as a function of the bit radius for a bit where all back-up cutting element have approximately the same under-exposure, in accordance with some embodiments of the present disclosure. CDCCC 1310 may be generated using method 700 shown in FIG. 7 or any other suitable method. As mentioned above, CDCCC 1310 may be used to determine the minimum critical depth of cut at which back-up cutting elements may begin to cut formation due to primary cutting element wear. For example, FIG. 13A illustrates CDCCC 1310 for a drill bit configured with seven back-up cutting elements track set with seven corresponding primary cutting elements. The seven back-up cutting elements may be numbered 1-7 extending from a bit rotational axis. The z-axis may represent the rotational axis of the drill bit, and the radial (R) axis may represent the radial distance from the rotational axis of the drill bit. For example, at a given under-exposure for the seven back-up cutting elements of approximately 0.01 inches, the critical depth of cut may vary from approximately 0.31307 in/rev to approximately 0.4124 in/rev. Thus, for a given depth of cut that may fall in this range, only some of the back-up cutting elements may cut into the formation. Back-up cutting elements that do not cut into the formation approximately simultaneously may result in additional imbalance forces and may damage the back-up cutting elements.

Figure 13B:
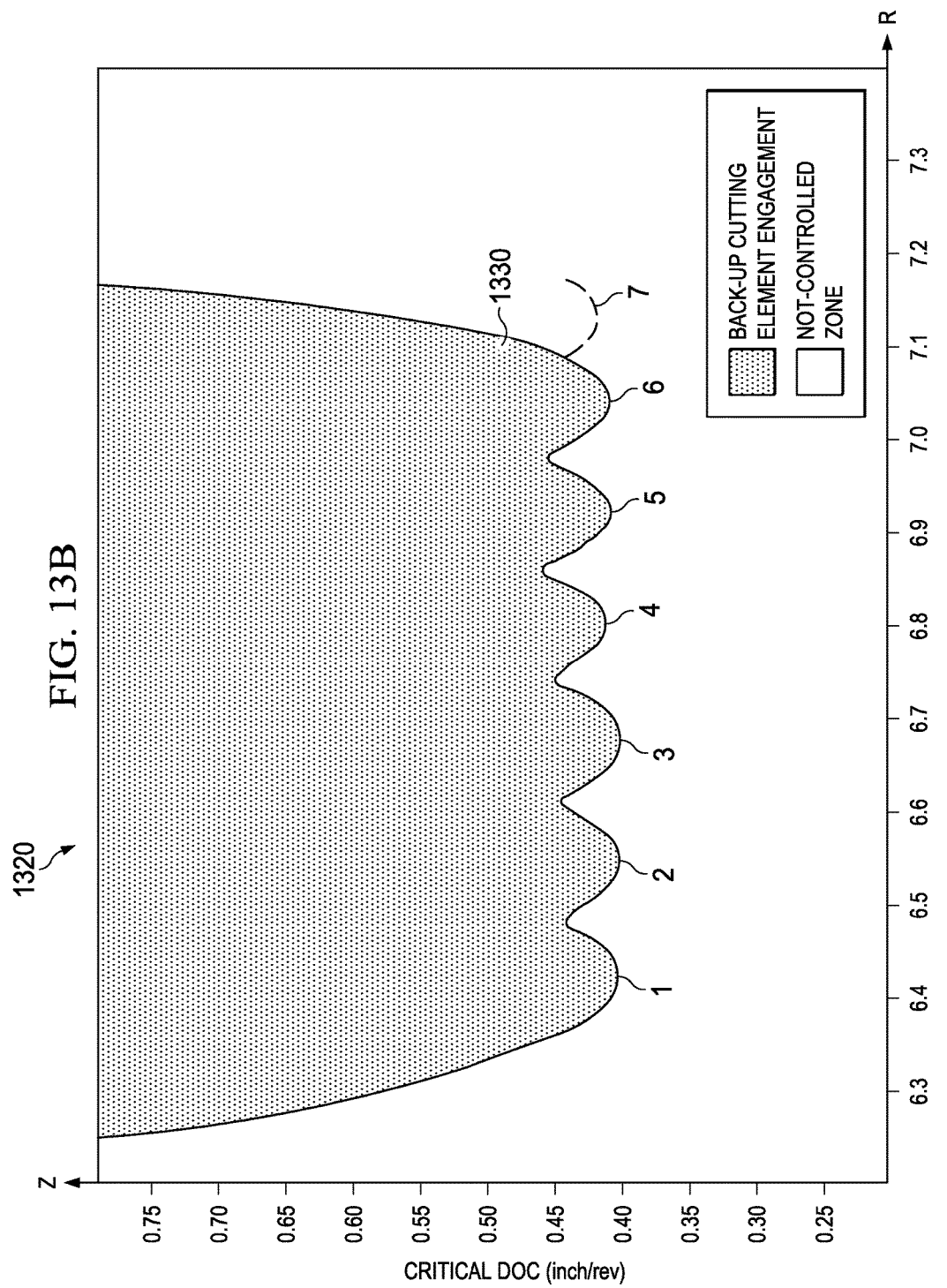
FIG. 13B illustrates a graph of a CDCCC where the critical depth of cut is plotted as a function of the bit radius for a bit where the back-up cutting elements have different under-exposures, in accordance with some embodiments of the present disclosure.

FIG. 13B illustrates graph 1320 of CDCCC 1330 where the critical depth of cut is plotted as a function of the bit radius for a bit where the back-up cutting elements have different under-exposures, in accordance with some embodiments of the present disclosure. In the illustrated embodiment, CDCCC 1330 is generated for a drill bit configured with seven back-up cutting elements track set with corresponding primary cutting elements. The under-exposure of each of the back-up cutting elements may be adjusted such that a target critical depth of cut may be achieved. For example, a target critical depth of cut may be specified as approximately 0.4 in/rev. In the illustrated embodiment, the under-exposure of each of back-up cutting elements 1-7 may be adjusted such that each back-up cutting element 1-7 begins to cut into the formation at approximately 0.4 in/rev. Accordingly, the under-exposure for each back-up cutting element 1-7 may be approximately 0.0151 in., 0.01132 in., 0.01229 in., 0.1136 in., 0.1118 in., 0.1133 in., and 0.0970 in., respectively. Utilizing these under-exposures, the critical depth of cut of each back-up cutting element may be between approximately 0.39772 in/rev and approximately 0.40831 in/rev. Therefore, when the critical depth of cut may be above approximately 0.4083 in/rev, every back-up cutting element 1-7 may cut into the formation. In other embodiments, the back-up cutting elements may be under-exposed by any suitable amount such that primary cutting elements cut into the formation from a start point to a first drilling depth ($D_A$) and back-up cutting elements act as depth of cut controllers for the primary cutting elements; the back-up cutting elements begin to partially cut into the formation from $D_A$ to a second drilling depth ($D_B$) as the primary cutting elements become worn; and the back-up cutting elements act as primary cutting elements or major cutting elements at drilling distance greater than $D_B$ when the primary cutting elements are sufficiently worn.

Figure 14:
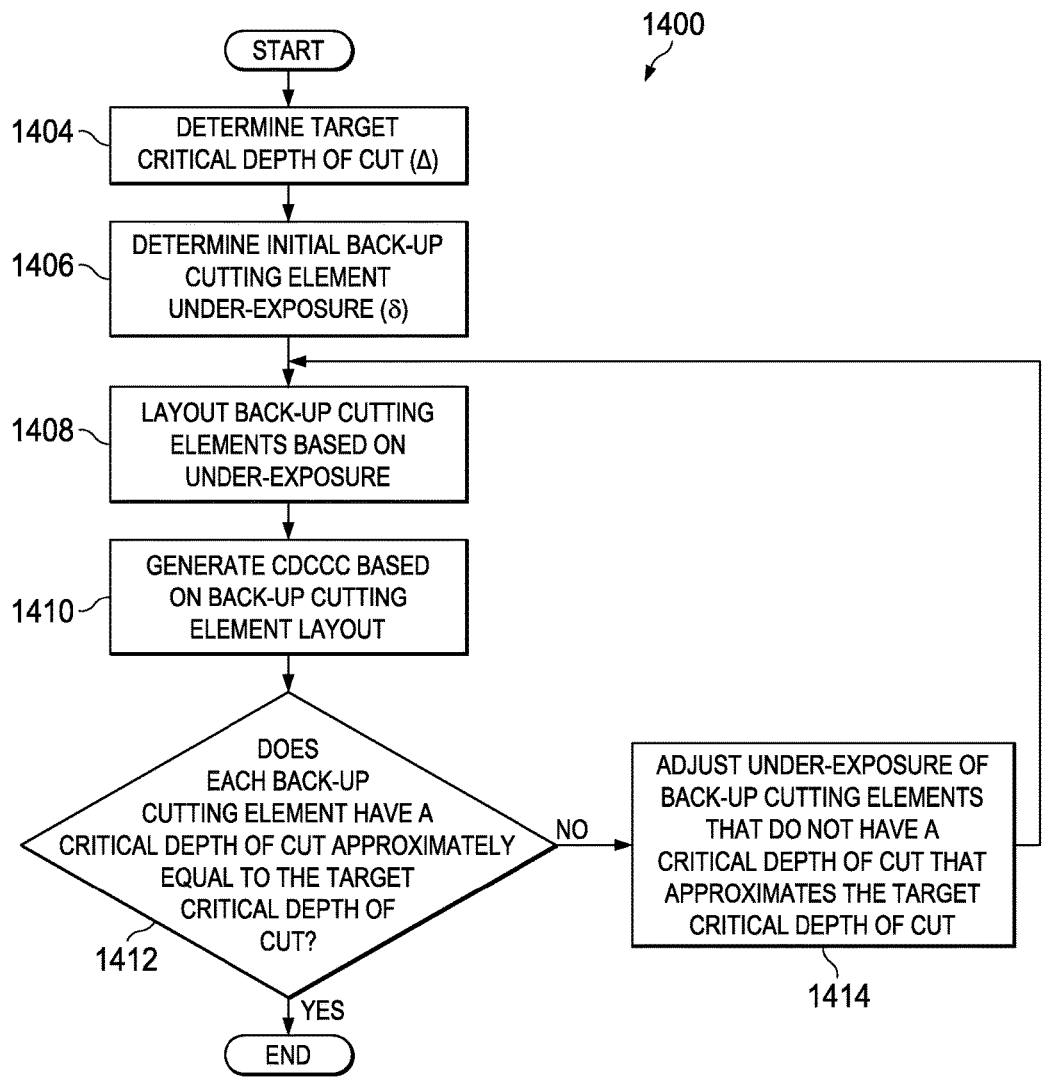
FIG. 14 illustrates a flowchart of an example method for adjusting under-exposure of back-up cutting elements on a drill bit to approximate a target critical depth of cut, in accordance with some embodiments of the present disclosure.

FIG. 14 illustrates a flow chart of example method 1400 for adjusting under-exposure of back-up cutting elements to approximate a target critical depth of cut, in accordance with some embodiments of the present disclosure. The steps of method 1400 may be performed by various computer programs, models or any combination thereof, configured to simulate and design drilling systems, apparatuses and devices. The programs and models may include instructions stored on a computer readable medium and operable to perform, when executed, one or more of the steps described below. The computer readable media may include any system, apparatus or device configured to store and retrieve programs or instructions such as a hard disk drive, a compact disc, flash memory or any other suitable device. The programs and models may be configured to direct a processor or other suitable unit to retrieve and execute the instructions from the computer readable media. Collectively, the computer programs and models used to simulate and design drilling systems may be referred to as a "drilling engineering tool" or "engineering tool."

In the illustrated embodiment, the cutting structures of the drill bit, including at least the locations and orientations of all cutting elements and DOCCs, may have been previously designed. However in other embodiments, method 1400 may include steps for designing the cutting structure of the drill bit. For illustrative purposes, method 1400 is described with respect to drill bit 801*a* illustrated in FIG. 8A; however, method 1400 may be used to determine appropriate under-exposures of back-up cutting elements of any suitable drill bit.

Method 1400 may start, and at step 1404, the engineering tool may determine a target critical depth of cut (Δ). The target may be based on formation characteristics, prior drill bit design and simulations, a CDCCC generated using method 700 shown in FIG. 7, or obtained from any other suitable method. For example, the engineering tool may determine a target critical depth of cut (Δ) of approximately 0.4 inches based on formation strength.

At step 1406, the engineering tool may determine an initial under-exposure (δ) for back-up cutting elements. Initial under-exposure may be generated based on an existing drill bit design, formation characteristics, or any other suitable parameter. For example, initial under-exposure δ, for drill bit 801*a* may be defined as approximately 0.1 inches.

At step 1408, the engineering tool may layout back-up cutting elements based on the initial under-exposure and a predetermined blade configuration. For example, drill bit 801*a* may have two back-up cutting elements 838*b* configured on blade 2 and two primary cutting elements 828*a* configured on blade 1 as illustrated in FIG. 8A and discussed with respect to FIG. 13A. Back-up cutting elements may be track set with corresponding primary cutting elements and under-exposed approximately 0.1 inches.

At step 1410, the engineering tool may generate a CDCCC based on the initial back-up cutting element layout generated at step 1408. The CDCCC may be generated based on method 700 shown in FIG. 7 or any other suitable method.

For example, FIG. 13A illustrates a CDCCC based on a drill bit configured with seven back-up cutting elements track set with corresponding primary cutting elements and under-exposed approximately 0.1 inches.

At step 1412, the engineering tool may analyze the CDCCC for each back-up cutting element and determine if the critical depth of cut for each back-up cutting element approximates the target critical depth of cut obtained in step 1404. For example, as discussed previously FIG. 13A, at an initial given under-exposure of approximately 0.01 inches for the first back-up cutting elements, the critical depth of cut may be approximately 0.338 in/rev. If a target critical depth of cut is approximately 0.4 in/rev, the under exposure of the first back-up cutting element may be adjusted to about 0.0151 in. Step 1412 may be repeated for all back-up cutting elements.

If all back-up cutting elements have a critical depth of cut that approximates the target critical depth of cut from step 1404, the method ends. If any back-up cutting elements do not have a critical depth of cut that approximates the target critical depth of cut from step 1404, then the method continues to step 1414.

At step 1414, the engineering tool may adjust the under-exposure of any back-up cutting elements that did not have a critical depth of cut that approximated the target critical depth of cut obtained in step 1404. The process then returns to step 1408 until each of the back-up cutting elements achieves a critical depth of cut that approximates the target critical depth of cut obtained in step 1414. For example, as discussed above with respect to FIG. 13B, the under-exposure for each back-up cutting element 1-7 may be adjusted to approximately 0.0151 in., 0.01132 in., 0.01229 in., 0.1136 in., 0.1118 in., 0.1133 in., and 0.0970 in., respectively in order to approximate a target critical depth of cut of 0.4 inches. Utilizing these under-exposures, the critical depth of cut of each back-up cutting element may be between approximately 0.39772 in/rev and approximately 0.40831 in/rev.

Modifications, additions, or omissions may be made to method 1400 without departing from the scope of the present disclosure. For example, the order of the steps may be performed in a different manner than that described and some steps may be performed at the same time. Additionally, each individual step may include additional steps without departing from the scope of the present disclosure.

Figure 15A:
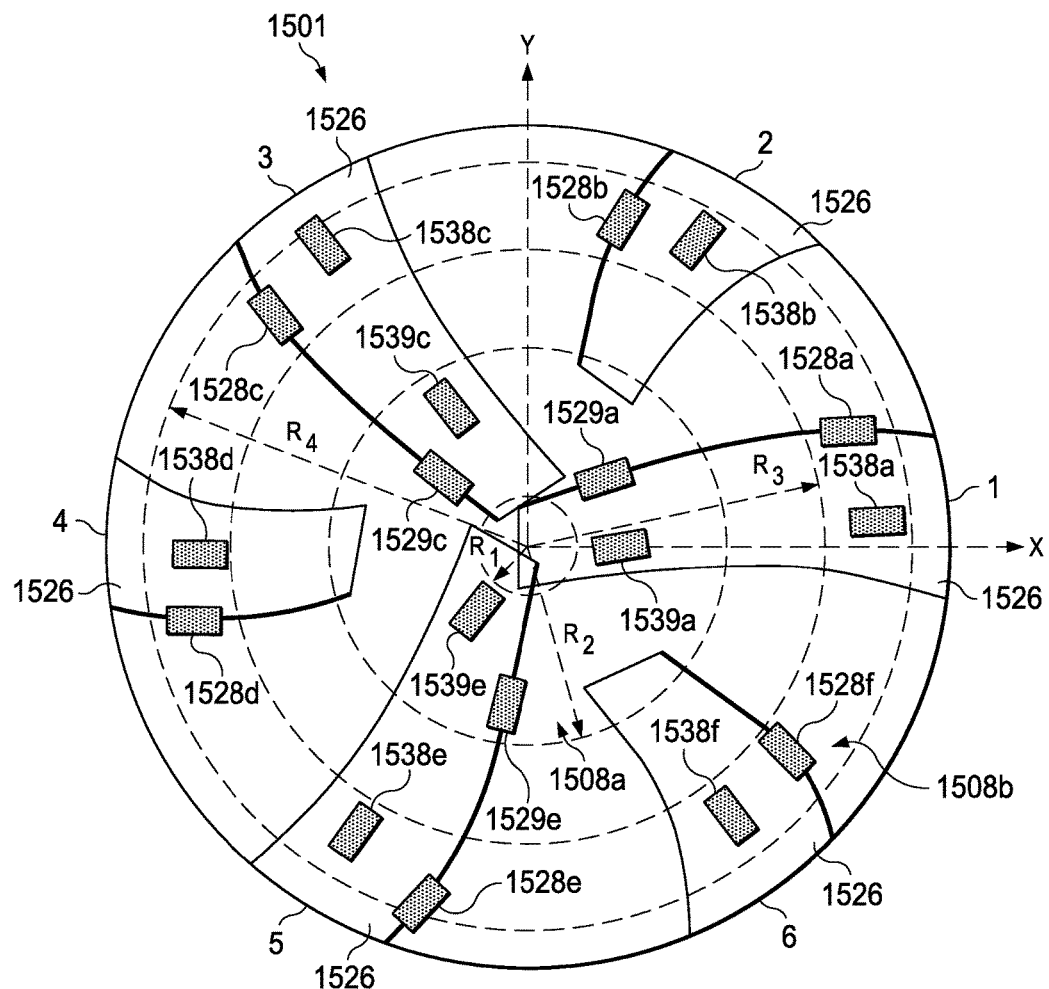
FIG. 15A illustrates a schematic drawing for a bit face of a drill bit including back-up cutting elements configured to cut into a formation at a specified depth of cut, in accordance with some embodiments of the present disclosure.

FIG. 15A illustrates a schematic drawing for a bit face of drill bit 1501 that includes a plurality of back-up cutting elements configured to cut into the formation at a specified depth of cut of drill bit 1501, in accordance with some embodiments of the present disclosure. In the illustrated embodiment, the bit face of a drill bit 1501 includes back-up cutting elements 1538*a*-1538*f*, 1539*a*, 1539*c*, and 1539*e* configured to cut into the formation when primary cutting elements 1528*a*-1528*f*, 1529*a*, 1529*c*, and 1529*e* disposed on blades 1526 of drill bit 1501 are sufficiently worn. For purposes of this disclosure, blades 1526 may also be numbered 1-n based on the blade configuration. For example, FIG. 15A depicts a six-bladed drill bit 1501 where blades 1526 may be numbered 1-6.

Back-up cutting elements 1538*a*-1538*f*, 1539*a*, 1539*c*, and 1539*e* may be track set with corresponding primary cutting elements 1528*a*-1528*f*, 1529*a*, 1529*c*, and 1529*e*. For example, back-up cutting elements 1538*e* and 1539*e* located on blade 5 may be track set with primary cutting elements 1528*a* and 1529*a* located on blade 1. Back-up cutting elements 1538*a* and 1539*a* located on blade 1 may be track set with primary cutting elements 1528*c* and 1529*c* located on blade 3. Likewise, back-up cutting elements 1538*c* and 1539*c* located on blade 3 may be track set with primary cutting elements 1528*e* and 1529*e* located on blade 5. Similarly, back-up cutting elements 1538*f* located on blade 6 may be track set with primary cutting elements 1528*b* located on blade 2, back-up cutting elements 1538*b* located on blade 2 may be track set with primary cutting elements 1528*d* located on blade 4, and back-up cutting elements 1538*d* located on blade 4 may be track set with primary cutting elements 1528*f* located on blade 6.

Figure 15B:
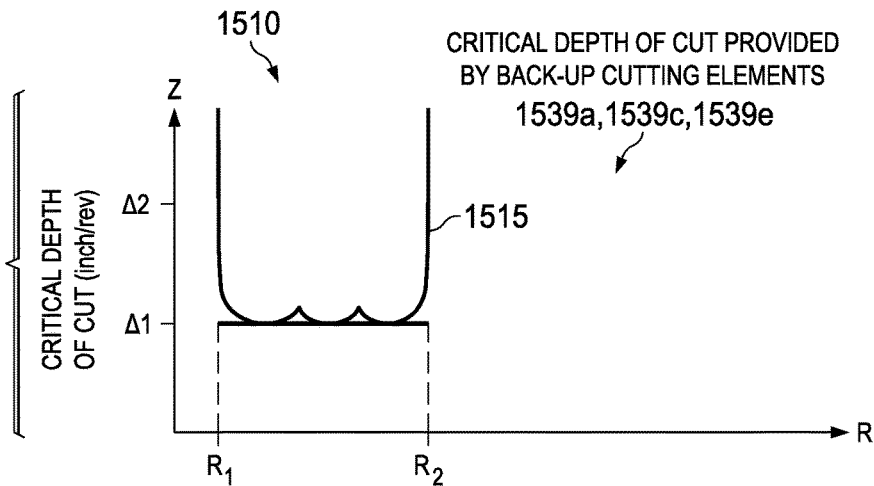
FIGS. 15B-15D illustrate graphs of desired CDCCCs for the drill bit of FIG. 15A, in accordance with some embodiments of the present disclosure.

FIG. 15B illustrates graph 1510 of desired CDCCC 1515 of drill bit 1501 of FIG. 15A, in accordance with some embodiments of the present disclosure. CDCCC 1515 may be generated based on method 700 shown in FIG. 7 or any other suitable method. Back-up cutting elements 1539a, 1539c, and 1539e may be configured to cut into the formation at a specified critical depth of cut. For example, back-up cutting elements 1539a, 1539c, and 1539e may be configured such that drill bit 1501 has critical depth of cut of $\Delta_1$ within radial swath 1508a defined as being located between first radial coordinate $R_1$ and second radial coordinate $R_2$. Thus, CDCCC 1515 may represent the critical depth of cut of back-up cutting elements 1539a, 1539c, and 1539e.

Figure 15C:
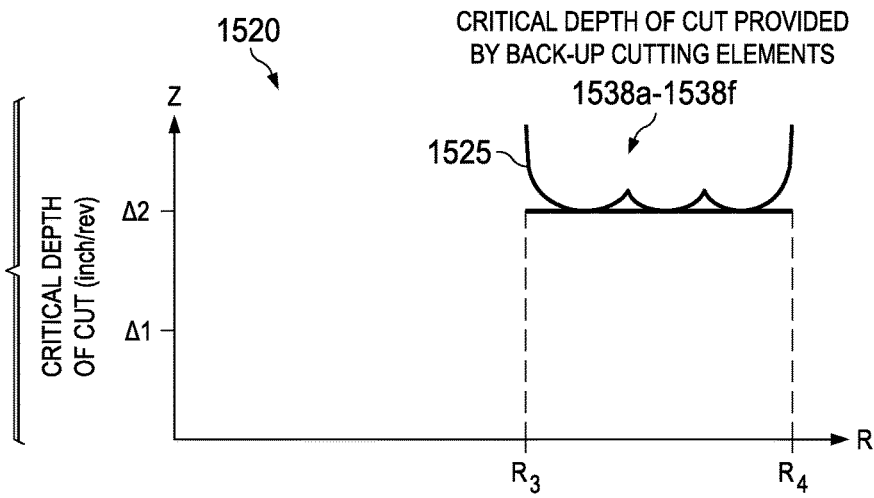

FIG. 15C illustrates graph 1520 of desired CDCCC 1525 for drill bit 1501 of FIG. 15A, in accordance with some embodiments of the present disclosure. CDCCC 1525 may be generated based on method 700 shown in FIG. 7 or any other suitable method. Back-up cutting elements 1538a-1538f may be configured according to method 1400 of FIG. 14, or any other suitable method, to cut into the formation at a specified critical depth of cut. For example, back-up cutting elements 1538a-1538f may be configured such that drill bit 1501 has critical depth of cut of $\Delta_2$ within radial swath 1508b defined as being located between third radial coordinate $R_3$ and fourth radial coordinate $R_4$. Thus, CDCCC 1525 may represent the critical depth of cut of back-up cutting elements 1538a-1538f.

Figure 15D:
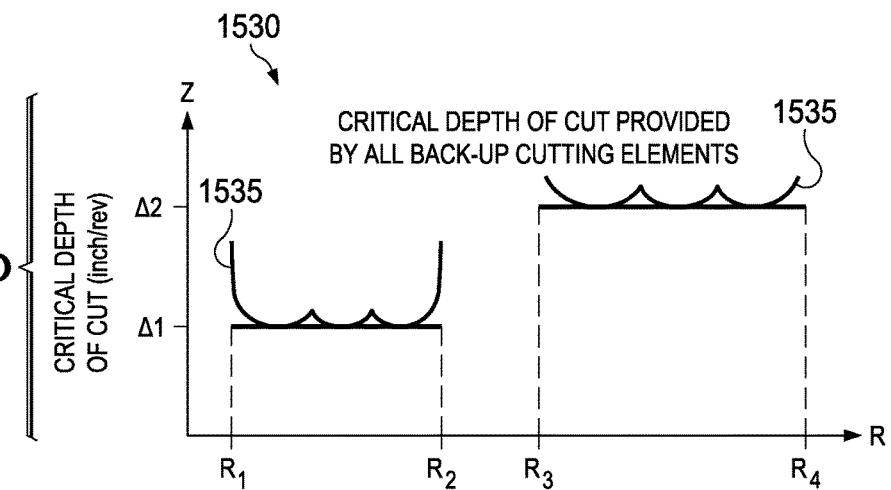

FIG. 15D illustrates graph 1530 of desired CDCCC 1535 for drill bit 1501 of FIG. 15A, in accordance with some embodiments of the present disclosure. CDCCC 1535 may be generated based on method 700 shown in FIG. 7 or any other suitable method. Back-up cutting elements 1538 and 1539 may be configured to cut into the formation at a specified critical depth of cut. As discussed previously, back-up cutting elements 1538 and 1539 may be configured such that drill bit 1501 has first critical depth of cut $\Delta_1$ for radial swath 1508a and second critical depth of cut $\Delta_2$ for radial swath 1508b. For example, CDCCC 1535 may represent the critical depth of cut of back-up cutting elements 1538a-1538f, 1539a, 1539c, and 1539e. Therefore, in FIGS. 15B-15D, back-up cutting elements 1539a, 1539c, and 1539e may be configured to provide substantially the same minimum critical depth of cut for drill bit 1501 at radial swath 1508a based on a first desired critical depth of cut $\Delta_1$ for radial swath 1508a. Further back-up cutting elements 1538a-1538f may be configured to provide substantially the same minimum critical depth of cut for drill bit 1501 at radial swath 1508b based on a second desired critical depth of cut $\Delta_2$ for radial swath 1508b.

Modifications, additions or omissions may be made to FIGS. 15A-15D without departing from the scope of the present disclosure. For example, although drill bit 1501 includes a specific number of back-up cutting elements 1538 and 1539, drill bit 1501 may include more or fewer back-up cutting elements 1538 and 1539. Additionally, in some embodiments of the present disclosure, the number of desired critical depth of cut $\Delta_i$ and associated radial swaths 1508 may be more or fewer that described above.

Figure 16:
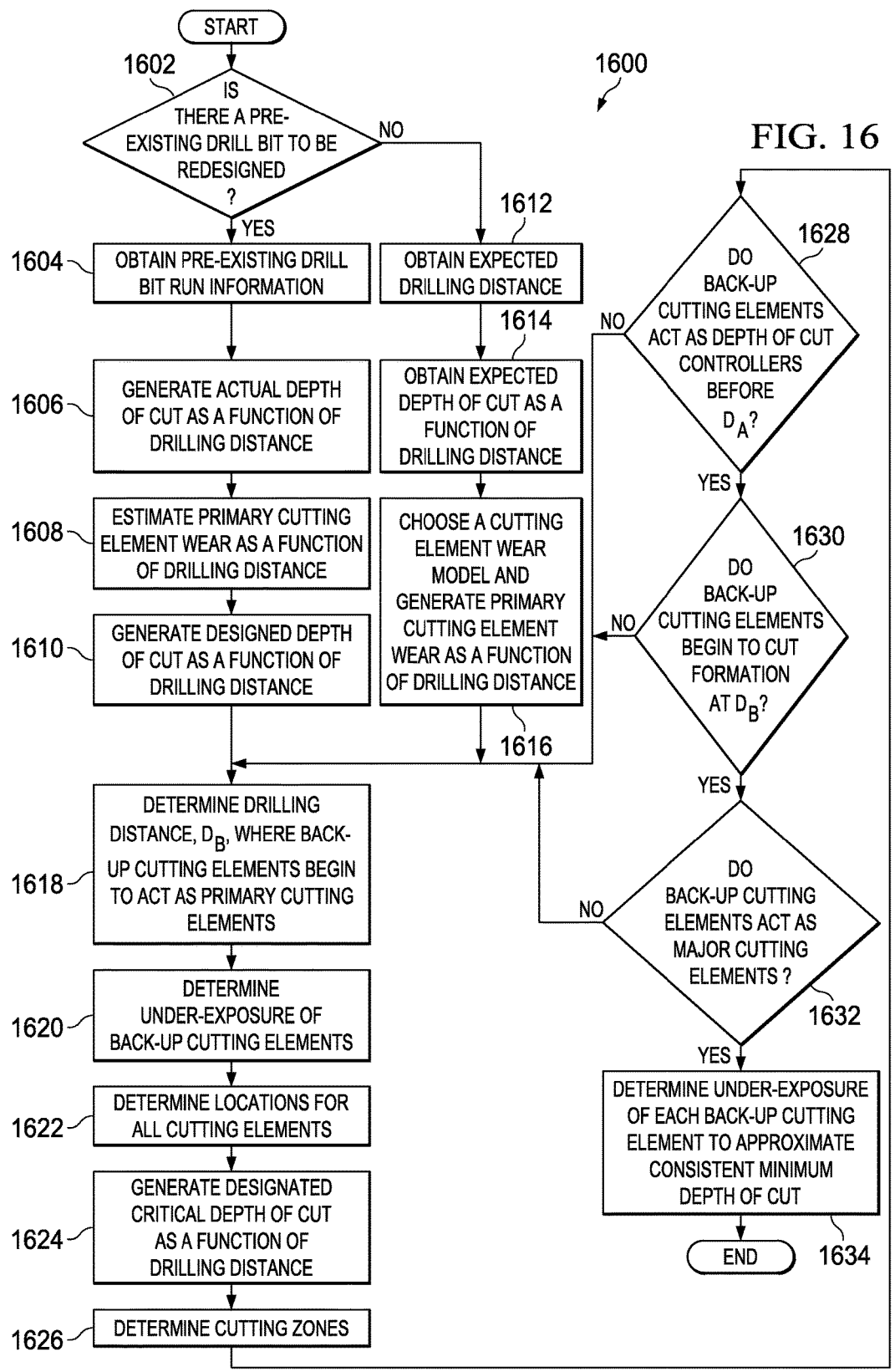
FIG. 16 illustrates a flowchart of an example method for performing a design update of a pre-existing drill bit with back-up cutting elements or configuring a new drill bit with back-up cutting elements, in accordance with some embodiments of the present disclosure.

FIG. 16 illustrates a flowchart of example method 1600 for performing a design update of a pre-existing drill bit with back-up cutting elements or configuring a new drill bit with back-up cutting elements, in accordance with some embodiments of the present disclosure. The steps of method 1600 may be performed by various computer programs, models or any combination thereof, configured to simulate and design drilling systems, apparatuses and devices. The programs and models may include instructions stored on a computer readable medium and operable to perform, when executed, one or more of the steps described below. The computer readable media may include any system, apparatus or device configured to store and retrieve programs or instructions such as a hard disk drive, a compact disc, flash memory or any other suitable device. The programs and models may be configured to direct a processor or other suitable unit to retrieve and execute the instructions from the computer readable media. Collectively, the computer programs and models used to simulate and design drilling systems may be referred to as a "drilling engineering tool" or "engineering tool."

In the illustrated embodiments, the cutting structures of the drill bit, including at least the locations and orientations of all primary cutting elements, may have been previously designed and bit run data may be available. However in other embodiments, method 1600 may include steps for designing the cutting structure of the drill bit. For illustrative purposes, method 1600 is described with respect to a pre-existing drill bit; however, method 1600 may be used to determine layout of back-up cutting elements of any suitable drill bit. Additionally, method 1600 may be described with respect to a designed drill bit similar in configuration to drill bit 801 as shown in FIG. 8A-8F.

Method 1600 may start, and at step 1602, the engineering tool may determine if a pre-existing drill bit exists that may be redesigned. If there is a pre-existing drill bit, method 1600 continues to step 1604. If no pre-existing drill bit exists, method 1600 continues to step 1612.

At step 1604, the engineering tool may obtain run information for the pre-existing drill bit. For example, FIG. 3 illustrates run information 300 for a pre-existing drill bit. As shown in FIG. 3, run information 300 may include RPM, ROP, MSE, and dull condition.

At step 1606, the engineering tool may generate a plot of the actual depth of cut as a function of drilling depth for the pre-existing drill bit. For example, FIG. 4B illustrates an actual depth of cut plot as a function of drilling depth for a drill bit.

At step 1608, the engineering tool may estimate the average primary cutting element wear as a function of drilling depth of the pre-existing drill bit. For example, FIG. 5 illustrates an estimate of primary cutting element wear as a function of drilling depth for a drill bit.

At step 1610, the engineering tool may generate a plot of the designed depth of cut as a function of drilling depth for back-up cutting elements of the pre-existing drill bit. The designed depth of cut may be based on the estimated primary cutting element wear estimated at step 1606. For example, FIG. 10A illustrates designed depth of cut, plot 1010, that begins at approximately 0.24 in/rev and as the primary cutting elements wear, as shown in FIG. 5, the designed critical depth of cut may correspondingly decrease.

As noted above, if no pre-existing drill bit exists that may be redesigned at step 1602, method 1600 may continue to step 1612. At step 1612, the engineering tool may obtain the expected drilling depth, $D_{max}$, for the wellbore based upon exploration activities and/or a drilling plan. At step 1614, the engineering tool may obtain the expected depth of cut as a function of drilling depth. For example, FIG. 4A may be generated based on expected RPM and expected ROP based on exploration activities and/or a drilling plan.

At step 1616, the engineering tool may receive a cutting element wear model and may plot cutting element wear depth as a function of the drilling depth. For example, FIG. 5 may represent the expected wear of primary cutting elements based on a model generated by the equation:

$$\text{Wear}(\%) = (\text{Cumwork}/\text{BitMaxWork})^a * 100\%$$

where

Cumwork=f(drilling depth); and a=wear exponent and is between approximately 5.0 and 0.5.

At this point in method 1600, both step 1616 and step 1610 continue to step 1618. At step 1618, the engineering tool may determine the drilling depth at which primary cutting elements on the drill bit may be worn such that back-up cutting elements may act as primary cutting elements or major cutting elements for the drill bit based on bit wear and actual or expected ROP. This drilling depth may correspond to drilling depth $D_B$.

At step 1620, the engineering tool may determine the average under-exposure of back-up cutting elements for the drill bit. The under-exposure may be approximately the amount of wear primary cutting elements may have experienced while drilling to drilling depth $D_B$. For example, FIG. 5 illustrates an estimate of primary cutting element wear as a function of drilling depth. Using $D_B$ from step 1618 the engineering tool may determine the average under-exposure of back-up cutting elements as the amount of primary cutting element wear at drilling depth $D_B$.

At step 1622, the engineering tool may determine the optimal locations for back-up cutting elements and primary cutting elements disposed on the drill bit. For example, the engineering tool may run multiple simulations to generate run information. Based on results of these simulations, the engineering tool may determine blade locations for both primary cutting elements and back-up cutting elements.

At step 1624, the engineering tool may generate a designed critical depth of cut as a function of drilling depth for back-up cutting elements of the drill bit. The engineering tool may run a simulation of the cutting element layout determined in step 1622 to generate designed critical depth of cut as a function of drilling depth curve. For example, FIG. 10A illustrates designed critical depth of cut.

At step 1626, the engineering tool may determine the cutting zones of both primary cutting elements and back-up cutting elements of the drill bit. For example, in FIG. 10A, the engineering tool may determine that back-up cutting elements 838e disposed on drill bit 801d of FIG. 8D may begin to cut into the formation at drilling depth $D_A$ of approximately 5,800 feet. Further, back-up cutting elements 838e may begin to fully cut into the formation at drilling depth $D_B$ of approximately 7,100 feet. Thus, at drilling depth $D_B$ back-up cutting elements may begin to act as primary cutting elements or major cutting elements.

At step 1628, the engineering tool may determine if back-up cutting elements act as depth of cut controllers for primary cutting elements during drilling to drilling depth $D_A$. For example, in FIG. 10A, the engineering tool may determine that back-up cutting elements 838e may act as depth of cut controllers for primary cutting elements 828a prior to a drilling depth $D_A$ of approximately 5,800 feet. If the designed critical depth of cut is too high and the back-up cutting elements do not act as depth of cut controllers in this section, the process 1600 may return to step 1618 to adjust under exposures and/or reconfigure drill bit 801d. If the back-up cutting elements act as depth of cut controllers as expected, then the process may continue to step 1630.

At step 1630, the engineering tool may determine if the back-up cutting elements begin to cut formation at drilling depth $D_B$. For example, in FIG. 10A, the engineering tool may determine that back-up cutting elements 838e may begin to cut into the formation at drilling depth $D_A$ of approximately 5,800 feet and then back-up cutting elements 838e may begin to fully cut into the formation at drilling depth $D_B$ of approximately 7,100 feet. If back-up cutting elements do not begin to cut formation at drilling depth $D_B$, the process 1600 may return to step 1618 to reconfigure drill bit 801d. If the back-up cutting elements begin to cut formation at drilling depth $D_B$, then the process may continue to step 1632.

At step 1632, the engineering tool may determine if the back-up cutting elements are acting as major cutting elements. In other words, the engineering tool may determine if the depth of cut of the back-up cutting elements is approximately equal to the depth of cut of the primary cutting elements. For example, FIGS. 10C and 10D illustrate that after simulation by the engineering tool, the depth of cut of back-up cutting elements 838e and primary cutting elements 828a on drill bit 801d may be approximately equal. FIGS. 11B and 11C may illustrate that the depth of cut of back-up cutting elements 838g and primary cutting elements 828a may not the same. If the depth of cut of back-up cutting elements and primary cutting elements are not the same, the process 1600 may return to step 1618. If the depth of cut of back-up cutting elements and the primary cutting elements are approximately equal, then the process continues on to step 1634.

Based on these results, at step 1634, the engineering tool may adjust under-exposure of each back-up cutting element in order for each back-up cutting element to have the same minimal depth of cut of the new drill bit. Following step 1634, method 1600 may end.

Although the present disclosure and its advantages have been described in detail, it should be understood that various changes, substitutions and alternations can be made herein without departing from the spirit and scope of the disclosure as defined by the following claims. For example, although the present disclosure describes the configurations of blades and cutting elements with respect to drill bits, the same principles may be used to control the depth of cut of any suitable drilling tool according to the present disclosure. It is intended that the present disclosure encompasses such changes and modifications as fall within the scope of the appended claims.

What is claimed is:

1. A multi-layer downhole drilling tool designed for drilling a wellbore including a plurality of formations, comprising:
   a bit body with a rotational axis extending therethrough;
   a plurality of blades disposed on exterior portions of the bit body;
   a plurality of primary cutting elements disposed on exterior portions of some of the plurality of blades; and
   a plurality of back-up cutting elements disposed on exterior portions of different blades of the plurality of blades than the primary cutting elements, each back-up cutting element located at the same radial position with respect to the rotational axis as a corresponding primary cutting element, the back-up cutting elements under-exposed with respect to the primary cutting elements based on a critical depth of cut as a function of a radius of the bit body.

2. The drilling tool of claim 1, wherein
an amount of under-exposure between the back-up cutting elements and primary cutting elements varies based on the location of the back-up cutting elements on the blades.

3. The drilling tool of claim 1, wherein
an amount of under-exposure between the back-up cutting elements and primary cutting elements is based on a target critical depth of cut and varies such that the back-up cutting elements are configured to engage the wellbore at the target critical depth of cut.

4. The drilling tool of claim 1, wherein an amount of under-exposure between the back-up cutting elements and primary cutting elements varies based on a first target critical depth of cut for a first radius of the bit body and a second target critical depth of cut for a second radius of the bit body.

5. The drilling tool of claim 1, wherein the back-up cutting elements are configured to control a depth of cut of the primary cutting elements at a first drilling depth.

6. The drilling tool of claim 5, wherein the back-up cutting elements are configured to engage the wellbore and act as major cutting elements at a second-drilling depth.

7. The drilling tool of claim 1, wherein the back-up cutting elements are disposed on blades at an angular distance between approximately 10 degrees and approximately 350 degrees from the corresponding primary cutting elements.

8. A method of designing a multi-profile layer drill bit for drilling a wellbore including a plurality of formations, the method comprising:
obtaining drill bit run information for a pre-existing drill bit;
generating an actual depth of cut as a function of a drilling depth based on the drill bit run information;
estimating a wear of each of a plurality of primary cutting elements on some of a plurality of blades as a function of the drilling depth;
generating a designed depth of cut as a function of the drilling depth based on the estimated wear of each of the primary cutting elements;
estimating a first drilling depth where the primary cutting elements are worn such that at least one of a plurality of back-up cutting elements engage the wellbore based on the actual depth of cut and the designed depth of cut; and
configuring the back-up cutting elements on different blades of the plurality of blades than the primary cutting elements based on the first drilling depth, each back-up cutting element located at the same radial position with respect to a rotational axis of the drill bit as a corresponding primary cutting element, the back-up cutting elements under-exposed with respect to the primary cutting elements based on a critical depth of cut as a function of a radius of a bit body.

9. The method of claim 8, wherein configuring the back-up cutting elements further comprises determining an amount of under-exposure between the back-up cutting elements and the primary cutting elements based on the first drilling depth.

10. The method of claim 8, wherein configuring the back-up cutting elements further comprises determining an amount of under-exposure between the back-up cutting elements and the primary cutting elements based on the first drilling depth, the amount of under-exposure varying based on the location of the back-up cutting elements on the blades.

11. The method of claim 8, wherein configuring the back-up cutting elements further comprises determining an amount of under-exposure between the back-up cutting elements and the primary cutting elements based on the first drilling depth and a target critical depth of cut, the amount of under-exposure varying such that the back-up cutting elements are configured to engage the wellbore at the target critical depth of cut.

12. The method of claim 8, wherein configuring the back-up cutting elements further comprises determining an amount of under-exposure between the back-up cutting elements and the primary cutting elements based on the first drilling depth, a first target critical depth of cut for a first radius of the bit body and a second target critical depth of cut for a second radius of the bit body.

13. The method of claim 8, wherein the back-up cutting elements are configured to control a depth of cut of the primary cutting elements at the first drilling depth.

14. The method of claim 13, further comprising estimating a second drilling depth where the primary cutting elements are worn such that the back-up cutting elements engage the wellbore and act as major cutting elements based on the actual depth of cut and the designed depth of cut.

15. The method of claim 8, further comprising
generating primary cutting zones for the primary cutting elements, the primary cutting zones corresponding to one or more primary drilling depths where the primary cutting elements act as major cutting elements;
generating back-up cutting zones for the back-up cutting elements, the back-up cutting zones corresponding to one or more back-up drilling depths where the back-up cutting elements engage the wellbore; and
reconfiguring the back-up cutting elements if the one or more back-up drilling depths corresponding to the back-up cutting zones are greater than the one or more primary drilling depths corresponding to the primary cutting zones.

16. The method of claim 15, wherein reconfiguring the back-up cutting elements includes adjusting the under-exposure between the back-up cutting elements and the primary cutting elements.

17. A method of designing a multi-profile layer drill bit for drilling a wellbore including a plurality of formations, the method comprising:
obtaining an expected drilling depth;
generating an expected depth of cut as a function of a drilling depth based on the expected drilling depth;
estimating a wear of each of a plurality of primary cutting elements on some of a plurality of blades wear as a function of the drilling depth;
generating a designed depth of cut as a function of the drilling depth based on the estimated wear of each of the primary cutting elements;
estimating a first drilling depth where the primary cutting elements are worn such that at least one of a plurality of back-up cutting elements engage the wellbore based on the expected depth of cut and the designed depth of cut; and
configuring the back-up cutting elements on different blades of the plurality of blades than the primary cutting elements based on the first drilling depth, each back-up cutting element located at the same radial position with respect to a rotational axis of the drill bit as a corresponding primary cutting element, the back-up cutting elements under-exposed with respect to the primary cutting elements based on a critical depth of cut as a function of a radius of a bit body.

18. The method of claim 17, wherein configuring the back-up cutting elements further comprises determining an amount of under-exposure between the back-up cutting elements and the primary cutting elements based on the first drilling depth.

19. The method of claim 17, wherein configuring the back-up cutting elements further comprises determining an amount of under-exposure between the back-up cutting elements and the primary cutting elements based on the first drilling depth, the amount of under-exposure varying based on the location of the back-up cutting elements on the blades.

20. The method of claim 17, wherein configuring the back-up cutting elements further comprises determining an amount of under-exposure between the back-up cutting elements and the primary cutting elements based on the first drilling depth and a target critical depth of cut, the amount of under-exposure varying such that the back-up cutting elements are configured to engage the wellbore at the target critical depth of cut.

21. The method of claim 17, wherein configuring the back-up cutting elements further comprises determining an amount of under-exposure between the back-up cutting elements and the primary cutting elements based on the first drilling depth, a first target critical depth of cut for a first radius of the bit body and a second target critical depth of cut for a second radius of the bit body.

22. The method of claim 17, wherein the back-up cutting elements are configured to control a depth of cut of the primary cutting elements at the first drilling depth.

23. The method of claim 22, further comprising estimating a second drilling depth where the primary cutting elements are worn such that the back-up cutting elements engage the well bore and act as major cutting elements based on the actual depth of cut and the designed depth of cut.

24. The method of claim 17, further comprising
generating primary cutting zones for the primary cutting elements, the primary cutting zones corresponding to one or more primary drilling depths where the primary cutting elements act as major cutting elements;
generating back-up cutting zones for the back-up cutting elements, the back-up cutting zones corresponding to one or more back-up drilling depths where the back-up cutting elements engage the wellbore; and
reconfiguring the back-up cutting elements if the one or more back-up drilling depths corresponding to the back-up cutting zones are greater than the one or more primary drilling depths corresponding to the primary cutting zones.

25. The method of claim 24, wherein reconfiguring the back-up cutting elements includes adjusting the under-exposure between the back-up cutting elements and the primary cutting elements.

* * * * *